United States Patent
Lai et al.

(10) Patent No.: US 10,230,033 B2
(45) Date of Patent: Mar. 12, 2019

(54) LIGHT-EMITTING DEVICE

(71) Applicant: EPISTAR CORPORATION, Hsinchu (TW)

(72) Inventors: Lung-Kuan Lai, Hsinchu (TW);
Ching-Tai Cheng, Hsinchu (TW);
Yih-Hua Renn, Hsinchu (TW);
Min-Hsun Hsieh, Hsinchu (TW);
Chun-Hung Liu, Hsinchu (TW);
Shih-An Liao, Hsinchu (TW);
Ming-Chi Hsu, Hsinchu (TW); Yu Chen Liao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/827,549

(22) Filed: Nov. 30, 2017

(65) Prior Publication Data
US 2018/0159004 A1 Jun. 7, 2018

(30) Foreign Application Priority Data
Dec. 1, 2016 (TW) .............................. 105139601 A

(51) Int. Cl.
| | |
|---|---|
| *H01L 33/00* | (2010.01) |
| *H01L 33/60* | (2010.01) |
| *F21V 8/00* | (2006.01) |
| *H01L 25/075* | (2006.01) |
| *H01L 33/38* | (2010.01) |
| *H01L 33/46* | (2010.01) |
| *H01L 33/50* | (2010.01) |

(Continued)

(52) U.S. Cl.
CPC ............ *H01L 33/60* (2013.01); *G02B 6/0073* (2013.01); *H01L 25/0753* (2013.01); *H01L 33/385* (2013.01); *H01L 33/46* (2013.01); *H01L 33/505* (2013.01); *H01L 33/507* (2013.01); *H01L 33/54* (2013.01); *H01L 33/62* (2013.01); *G02B 6/0051* (2013.01); *H01L 2224/18* (2013.01); *H01L 2933/0016* (2013.01); *H01L 2933/0025* (2013.01); *H01L 2933/0041* (2013.01); *H01L 2933/0058* (2013.01); *H01L 2933/0066* (2013.01)

(58) Field of Classification Search
CPC ... H01L 33/60; H01L 25/0753; H01L 33/385; H01L 33/46; H01L 33/505; H01L 33/507; H01L 33/54; H01L 33/62; H01L 2933/0016; H01L 2933/0025; H01L 2933/0041; H01L 2933/0058; H01L 2933/0066; G02B 6/0073; G02B 6/0051
USPC .......................................................... 257/98
See application file for complete search history.

(56) References Cited

U.S. PATENT DOCUMENTS

| | | | | |
|---|---|---|---|---|
| 2008/0210966 A1* | 9/2008 | Sakamoto | ............... | H01L 33/46 257/98 |
| 2011/0062473 A1* | 3/2011 | Tanuma | ............... | H01L 33/486 257/98 |

(Continued)

*Primary Examiner* — Tu-Tu V Ho
(74) *Attorney, Agent, or Firm* — Anova Law Group, PLLC

(57) ABSTRACT

A light-emitting device includes a light body having an internal electrode layer, and a conductive layer. The conductive layer has a first portion formed on the internal electrode layer and overlapping the light body in a first direction, and a second portion overlapping the light body in a second direction. The first direction is perpendicular to the second direction.

19 Claims, 63 Drawing Sheets

(51) Int. Cl.
*H01L 33/54* (2010.01)
*H01L 33/62* (2010.01)

(56) References Cited

U.S. PATENT DOCUMENTS

2011/0199787 A1    8/2011  Kim et al.
2012/0286301 A1*  11/2012  Kobayakawa ........ H01L 29/866
                                                                        257/88

* cited by examiner

LIGHT-EMITTING DEVICE

CROSS-REFERENCE TO RELATED APPLICATIONS

The present application is a non-provisional patent application, claiming the benefit of priority of TW Patent Application No. 105139601 filed on Dec. 1, 2016.

TECHNICAL FIELD

The present disclosure relates to a light-emitting device and in particular to a light-emitting device for an edge-lit backlight and a method making the same.

DESCRIPTION OF THE RELATED ART

The light-emitting diodes (LEDs) have the characteristics of low power consumption, long operational life, small volume, quick response and stable opto-electrical property of emitted light. Recently, the light-emitting diodes are gradually used in a backlight module of a liquid crystal display.

LED backlight module in a liquid crystal display includes two types: one is a direct-lit backlight module and the other is an edge-lit backlight module. The direct-lit backlight module includes a plurality of light-emitting devices disposed on a carrier in an array and emitting light directly toward a liquid crystal panel. The direct-lit backlight module is usually incorporated in the liquid crystal display of a larger size, such as 55-inch LCD TV. The edge-lit backlight module includes a plurality of light-emitting devices arranged around the rim of a liquid crystal panel and a light-guide plate is used to direct or reflect the light from the light-emitting devices toward the liquid crystal panel. Comparing the two types, the edge-lit backlight module has a smaller volume for applying in a small apparatus like mobile phone.

In order for light entering into a side surface of the light-guide plate disposed behind the liquid crystal panel, a side-view LED package can be used to mount on a printed circuit board in a fashion to emit light toward the light-guide plate. In other words, a light-emitting direction of the side-view LED package is parallel to the printed circuit board.

SUMMARY OF THE DISCLOSURE

A light-emitting device includes a light body having an internal electrode layer, and a conductive layer. The conductive layer has a first portion formed on the internal electrode layer and overlapping the light body in a first direction, and a second portion overlapping the light body in a second direction. The first direction is perpendicular to the second direction.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

In all drawings, every layer is drawn in solid line regardless of its material being non-transparent, transparent, or semi-transparent.

The embodiments in the present disclosure include a plurality of light-emitting devices in a form of chip scale package (CSP). When the light-emitting device is mounted on a printed circuit board (PCB) by soldering, the light-emitting device has a main light-emitting direction parallel to a surface of the printed circuit board. In other words, the light-emitting device has a light-emitting surface perpendicular to the surface of the printed circuit board. Accordingly, the light-emitting device in accordance with embodiments of the present disclosure can be used in the edge-lit backlight module. In the embodiments, the light-emitting surface is defined as a surface that 50% light emitted from the light-emitting device emits outward therethrough.

The light-emitting device in accordance with embodiments of the present disclosure is made by chip scale packaging technique and is directly mounted a printed circuit board by soldering without the need of submount or leadframe.

Figure 1:
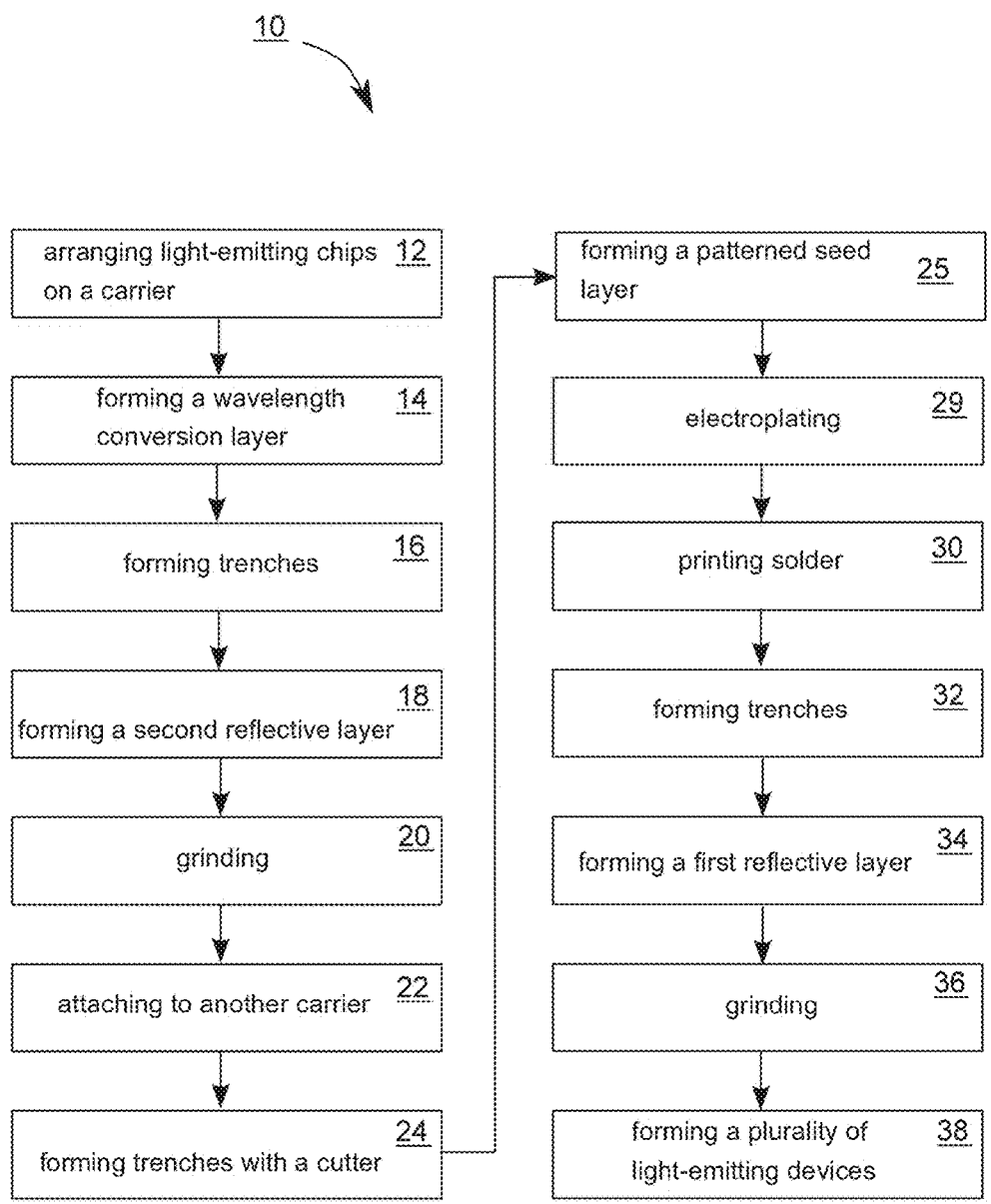
FIG. 1 shows a flowchart of making a light-emitting device in accordance with an embodiment of the present disclosure.
Figure 2A:
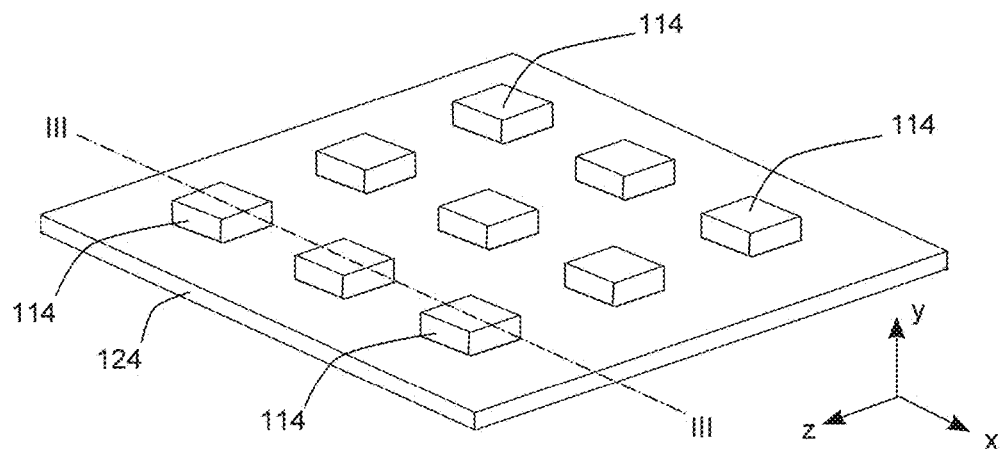
FIGS. 2A-2L show perspective views of steps embodied in FIG. 1.
Figure 3A:
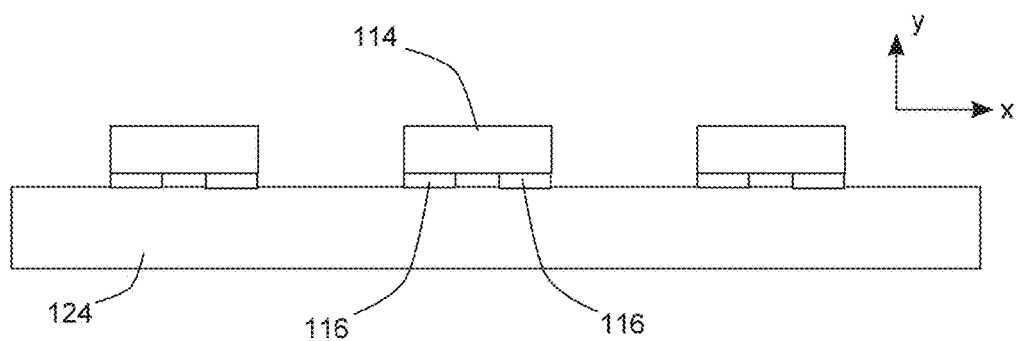
FIGS. 3A-3L show cross-sectional views taken along line III-III of FIGS. 2A-2L, respectively.
Figure 2B:
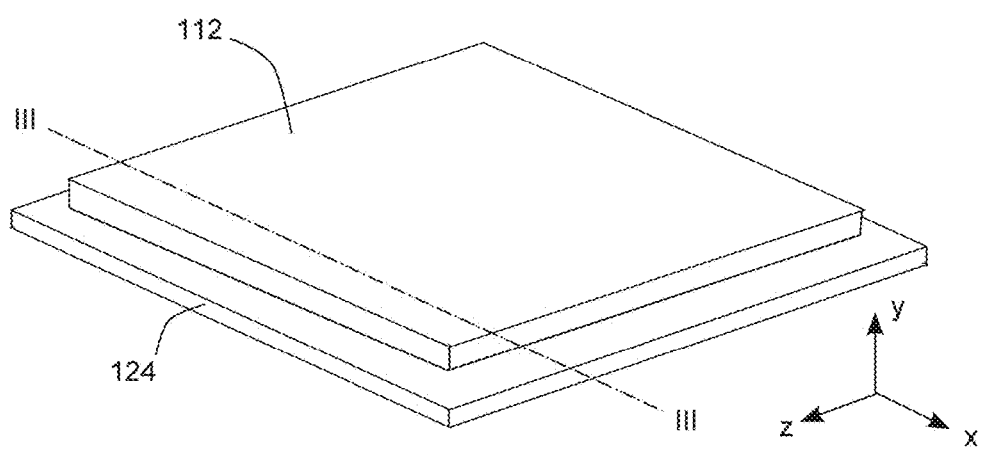
Figure 3B:
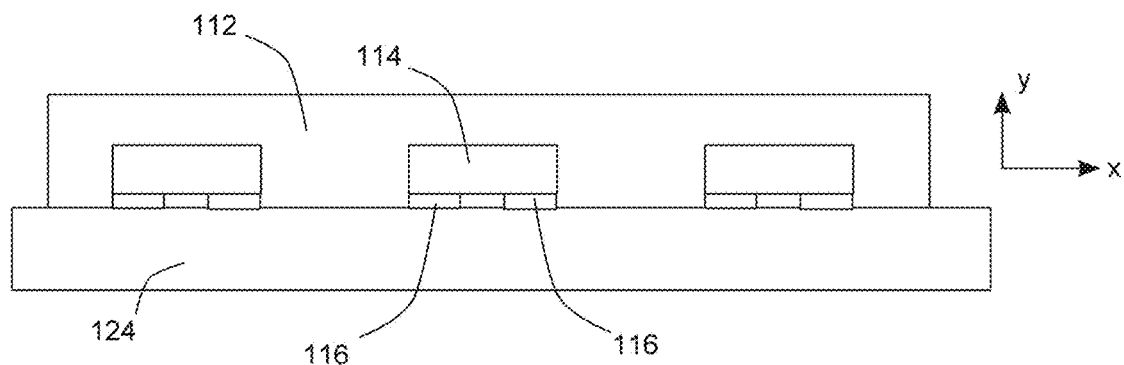
Figure 2C:
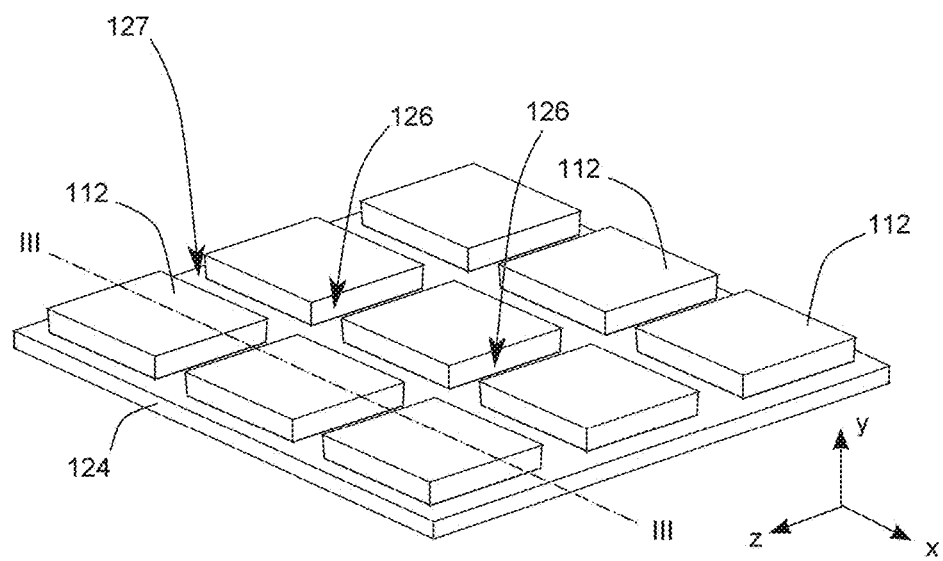
Figure 3C:
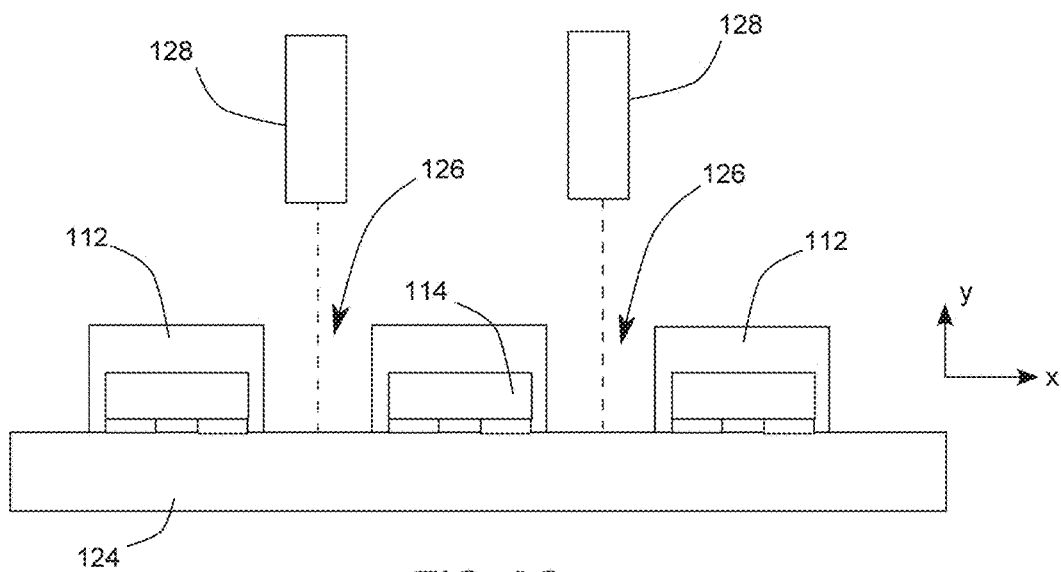
Figure 2D:
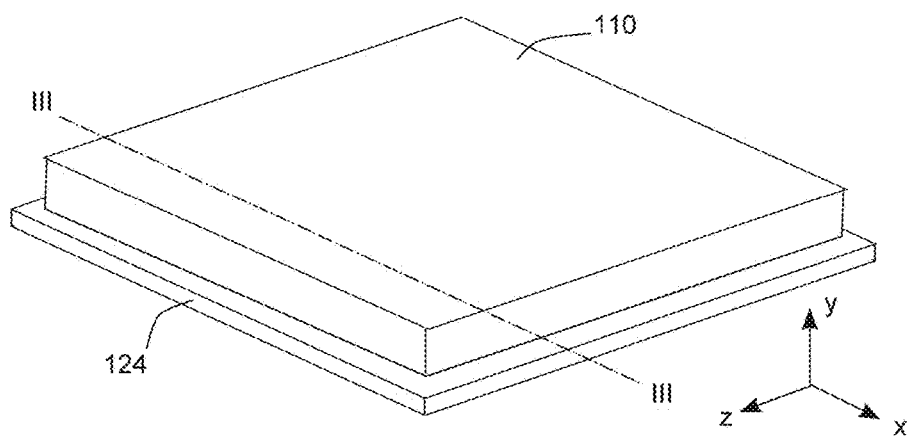
Figure 3D:
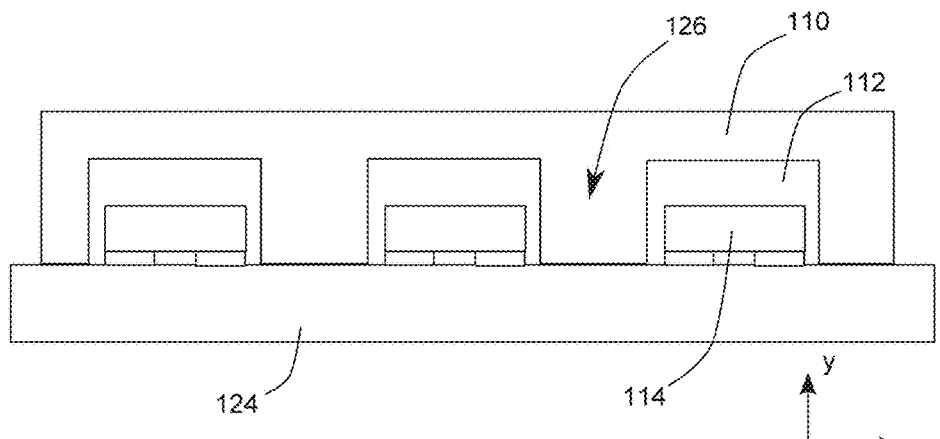
Figure 2E:
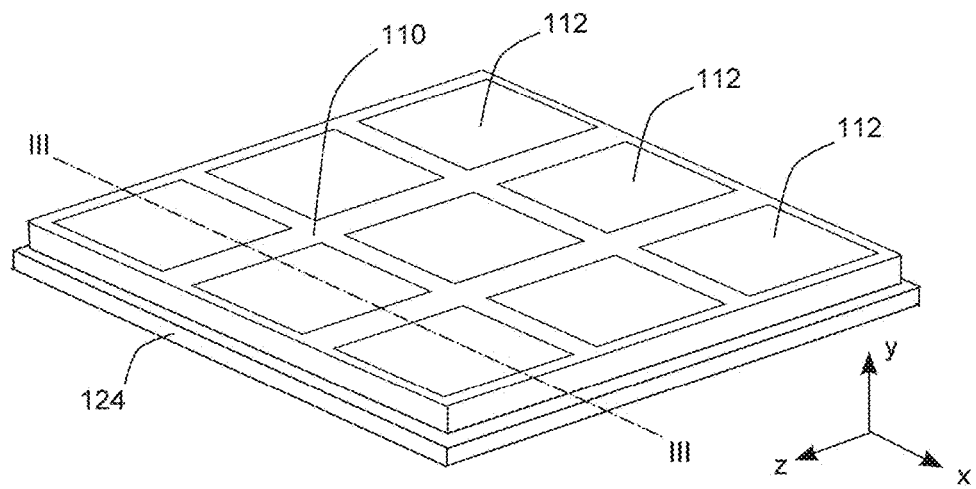
Figure 3E:
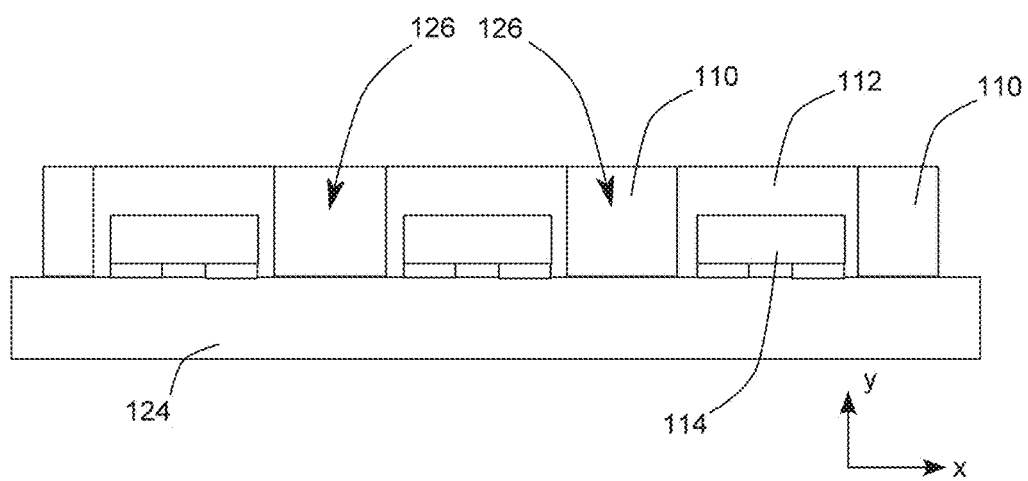
Figure 2F:
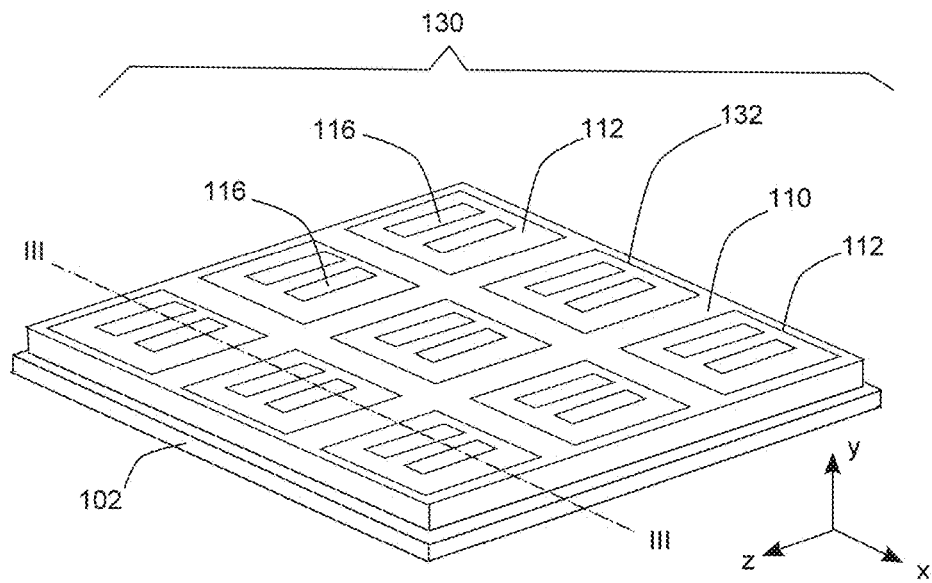
Figure 3F:
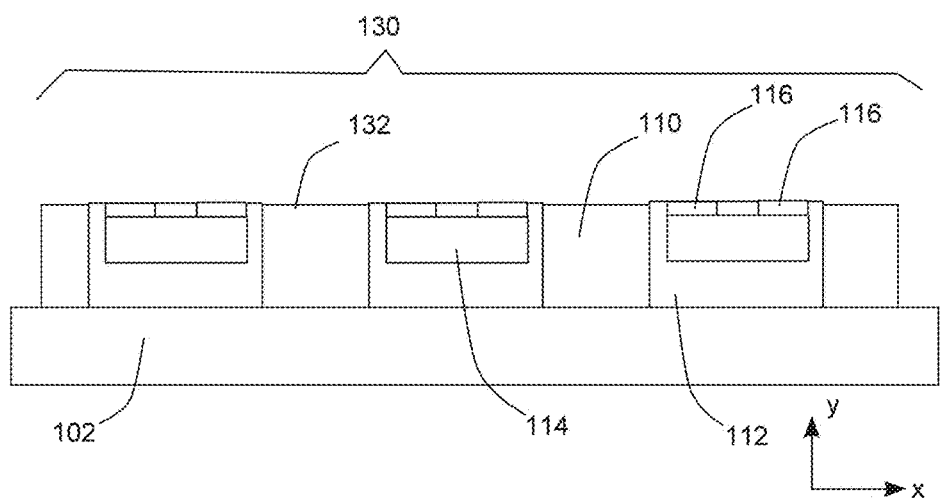
Figure 2G:
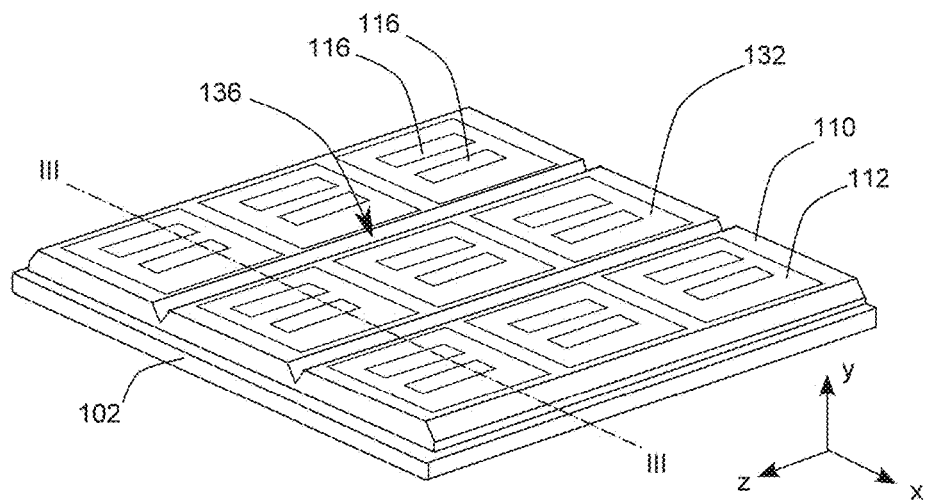
Figure 3G:
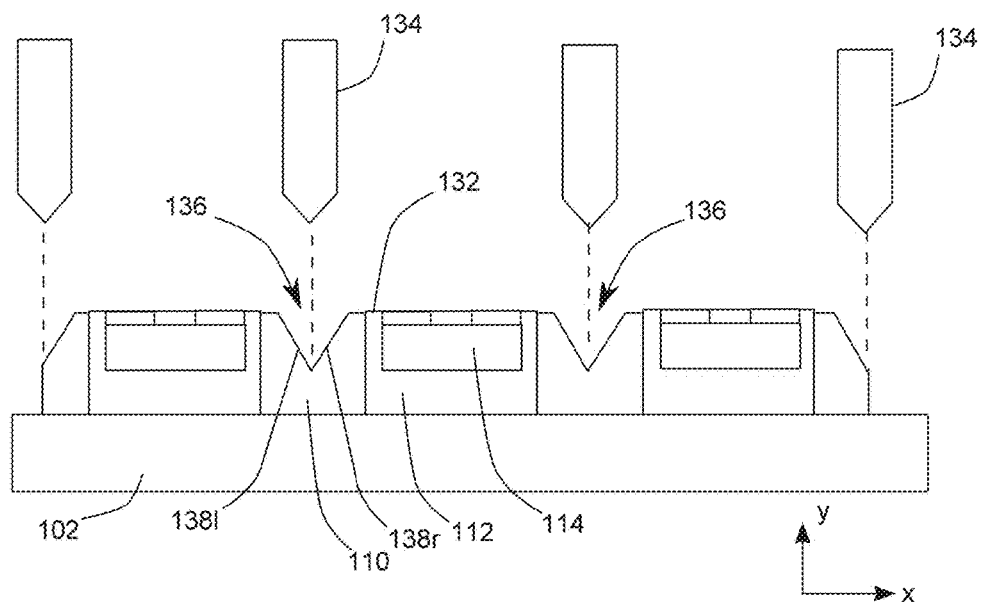
Figure 2H:
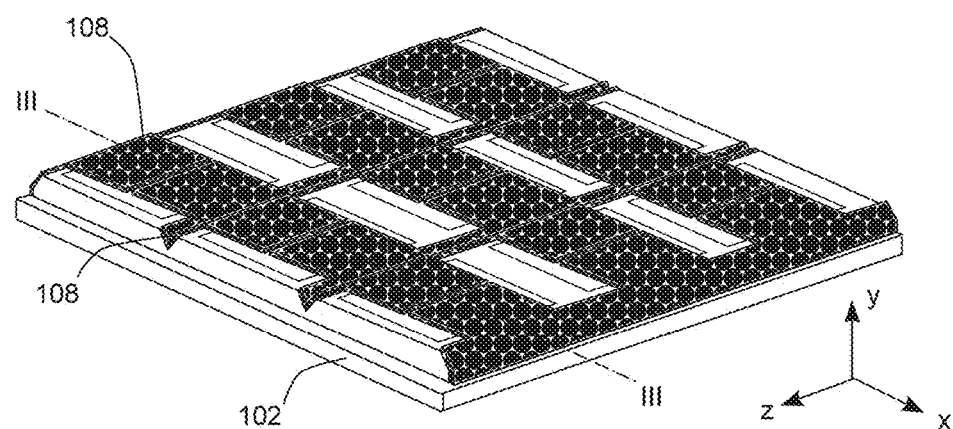
Figure 3H:
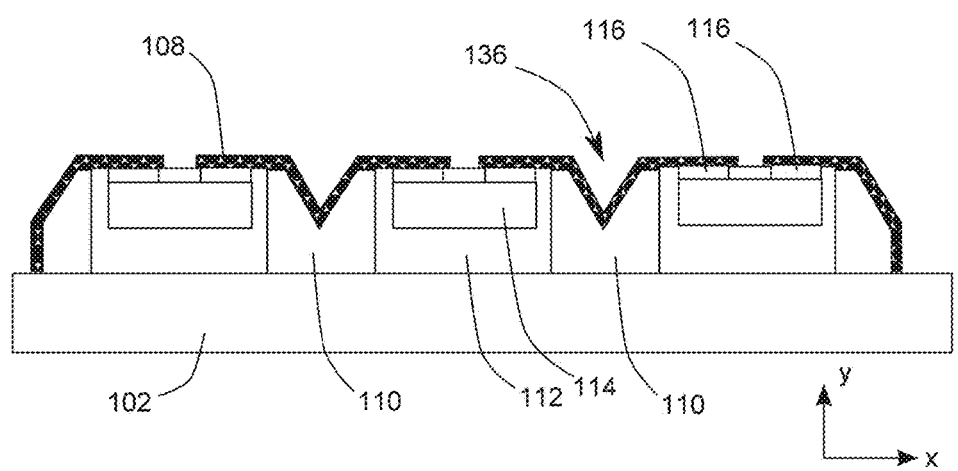
Figure 2I:
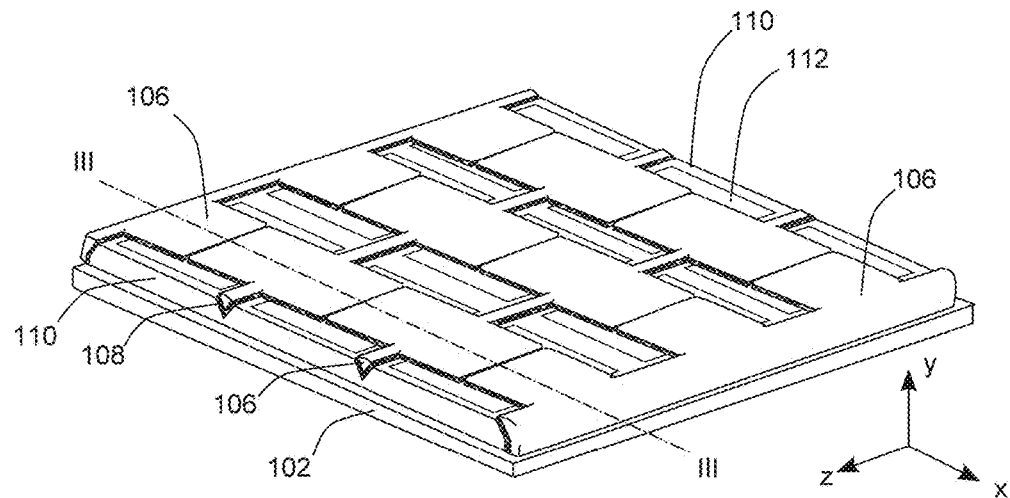
Figure 3I:
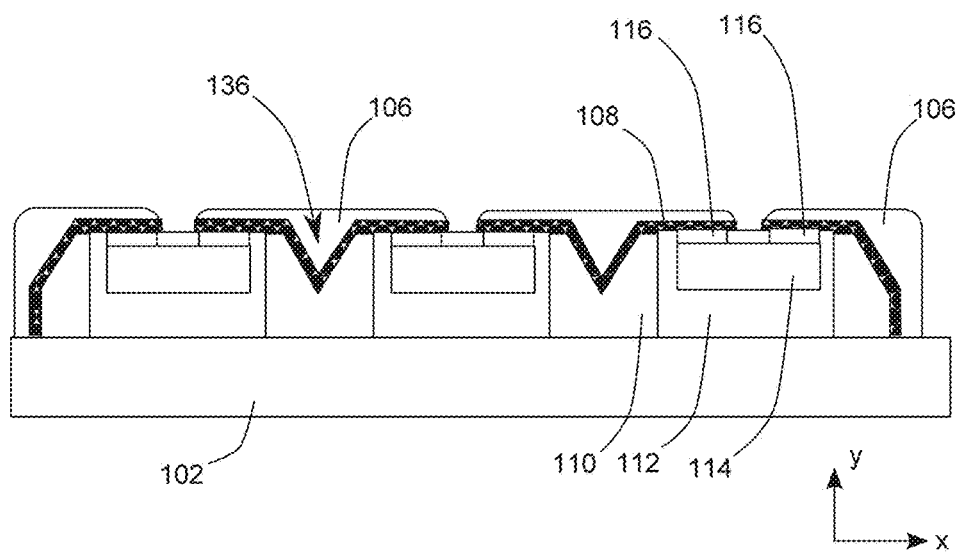
Figure 2J:
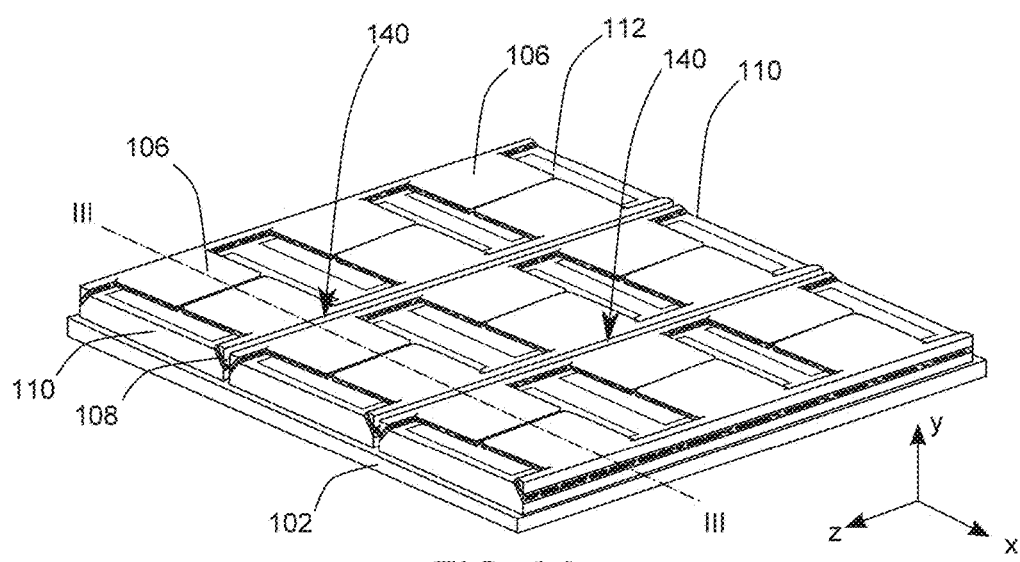
Figure 3J:
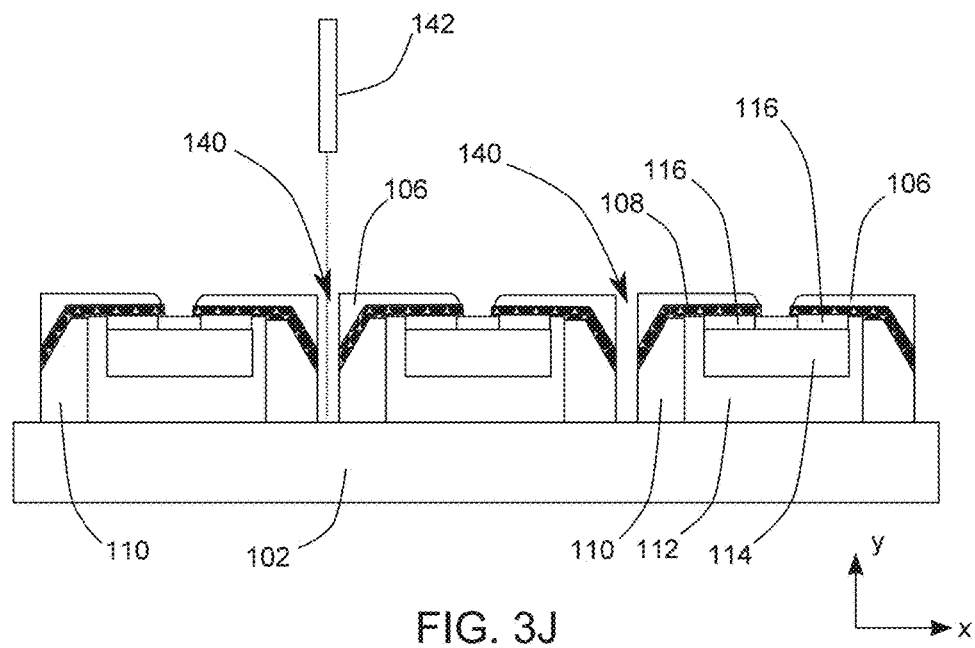
Figure 2K:
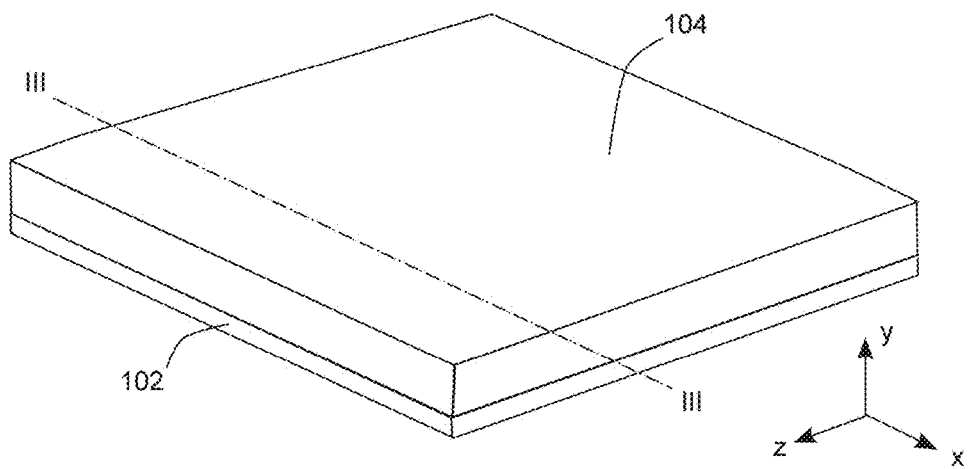
Figure 3K:
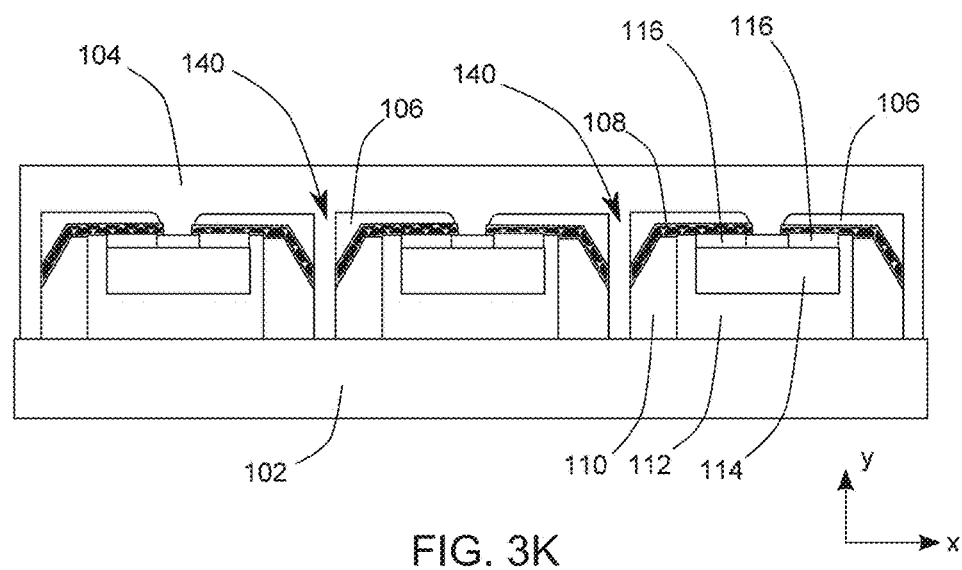

FIG. 1 shows a flowchart 10 of making a light-emitting device 100 in accordance with an embodiment of the present disclosure. FIGS. 2A-2L show perspective views of steps embodied in FIG. 1. FIGS. 3A-3L show cross-sectional views taken along line III-III of FIGS. 2A-2L, respectively. FIG. 4 shows a cross-sectional view taken along line IV-IV of FIG. 2L. FIG. 5A shows a perspective view of a single light-emitting device 100 of FIG. 2L having a main light-emitting direction facing upwardly. FIG. 5B shows the light-emitting device 100 of FIG. 5A mounted on a printed circuit board 199. FIG. 5C shows a cross-sectional view of a light-emitting device 100 as a light source for an edge-lit backlight module in accordance with an embodiment of the present disclosure.

Figure 2L:
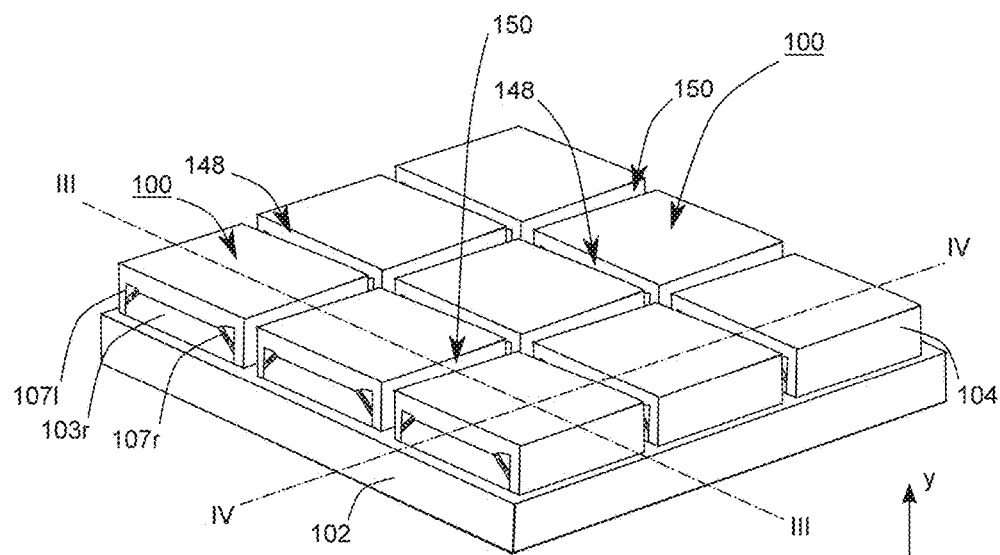

As shown in FIG. 2L, there are nine light-emitting devices 100 formed on a second carrier 102 in a 3×3 array. As shown in FIGS. 2L, 3L, 4 and 5, each light-emitting device 100 has two opposite side surfaces 103$l$, 103$r$, two opposite side surfaces 103$q$, 103$w$ and a bottom surface 105. Each light-emitting device 100 includes a first reflective layer 104, two conductive layers 106, a patterned seed layer 108, a metal multilayer (not shown), a second reflective layer 110, a wavelength conversion layer 112 and a light-emitting chip 114. The light-emitting chip 114 is used as a light body and includes two internal electrode layers 116 connected to the patterned seed layer 108. Each of the patterned seed layer 108, the metal multilayer (not shown), the conductive layer 106, the second reflective layer 110, and the first reflective layer 104 has a surface and these surfaces are coplanar with each other and constitute the side surfaces 103$l$, 103$r$. The first reflective layer 104 has another side surface to constitute the side surface 103$q$ (103$w$).

As shown in FIG. 5B, the external electrode layers 107$r$, 107$l$ are mounded on the printed circuit board 199 by soldering. The solder 120 is used for providing an electrical connection between the light-emitting device 100 and the printed circuit board 199 and for mounting the light-emitting device 100 on the printed circuit board 199. The light-emitting device 100 has a main light-emitting direction parallel to a surface of the printed circuit board 199. In other words, the light-emitting device 100 has a light-emitting surface 122 perpendicular to the surface of the printed circuit board 199. As shown FIG. 5C, in the edge-lit backlight module, light (arrow) emitted from the light-emitting device 100 is substantially parallel to the printed circuit board 199 and laterally enters a light guide plate 190. The light guide plate 190 is provided to change the direction of the light so the light enters into a diffusing plate 192 for irradiating a liquid crystal panel (not shown). Accordingly, the light-emitting device 100 acts as a side-view LED package. The light-emitting device 100 has a height (w) not greater than 0.3 mm (≤0.3 mm) for facilitating the applicability of the light-emitting device 100 (for example, mobile phone, liquid crystal display, wearable apparatus (watch, wristband, ring, etc.)).

Figure 3L:
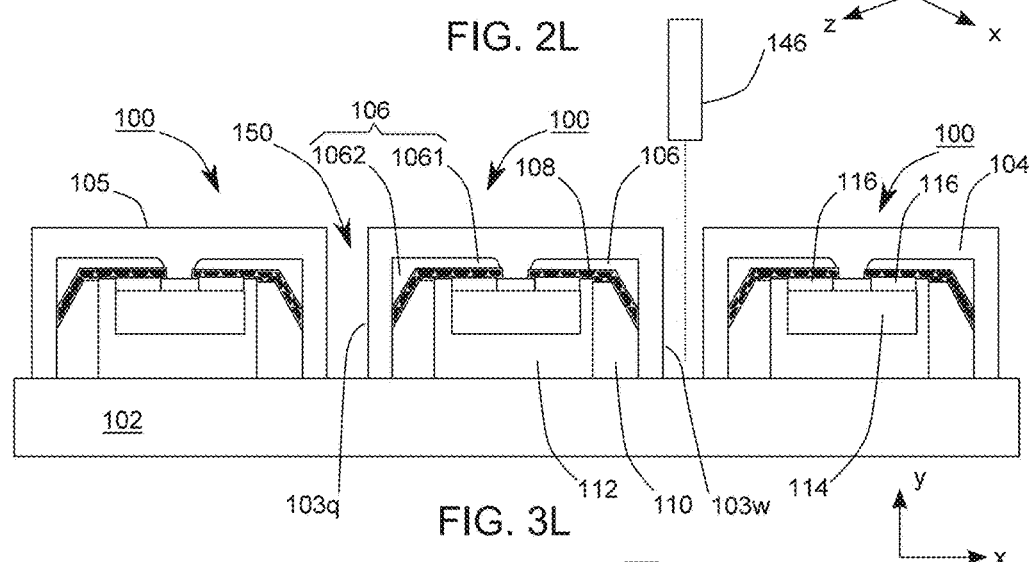
Figure 4:
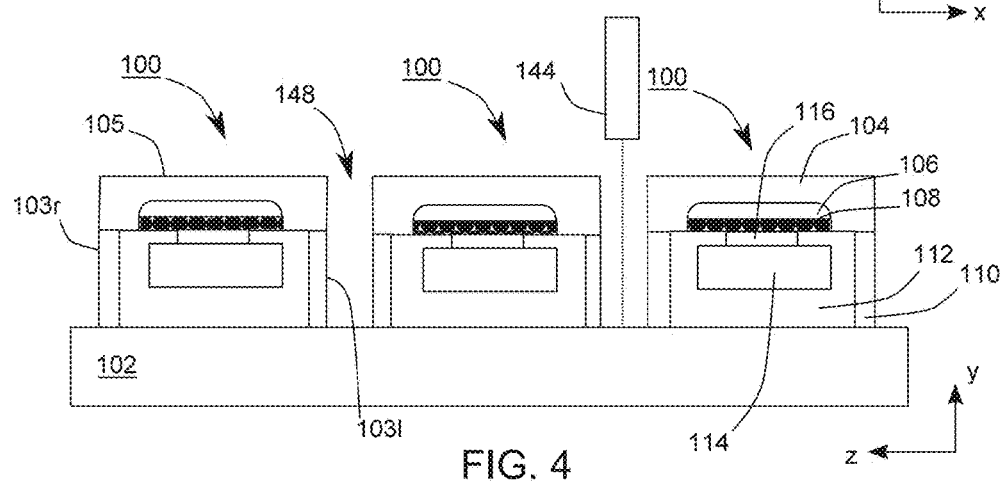
FIG. 4 shows a cross-sectional view taken along line IV-IV of FIG. 2L.
Figure 5A:
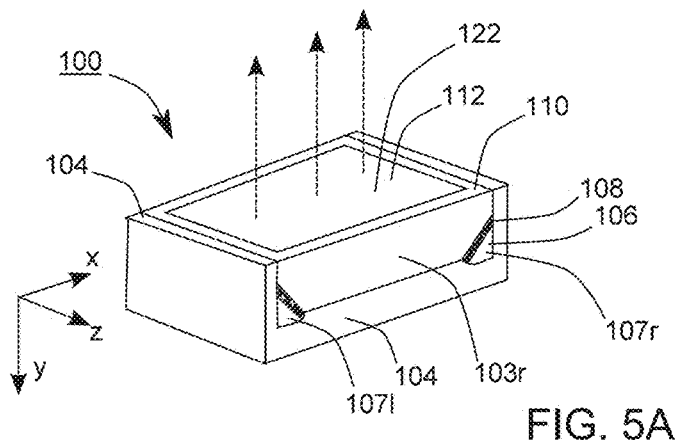
FIG. 5A shows a perspective view of a single light-emitting device of FIG. 2L having a main light-emitting direction facing upwardly.
Figure 5B:
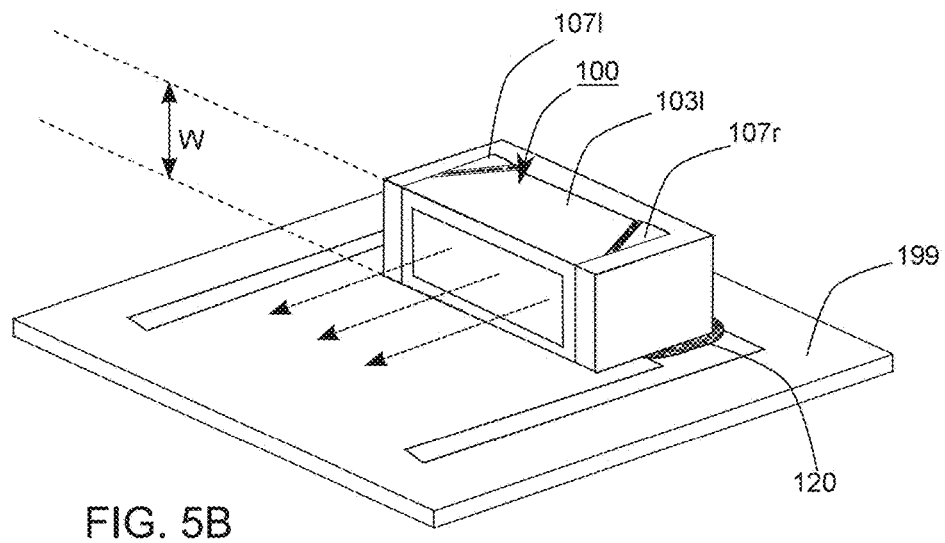
FIG. 5B shows a perspective view of the light-emitting device of FIG. 5A mounted on a printed circuit board.
Figure 5C:
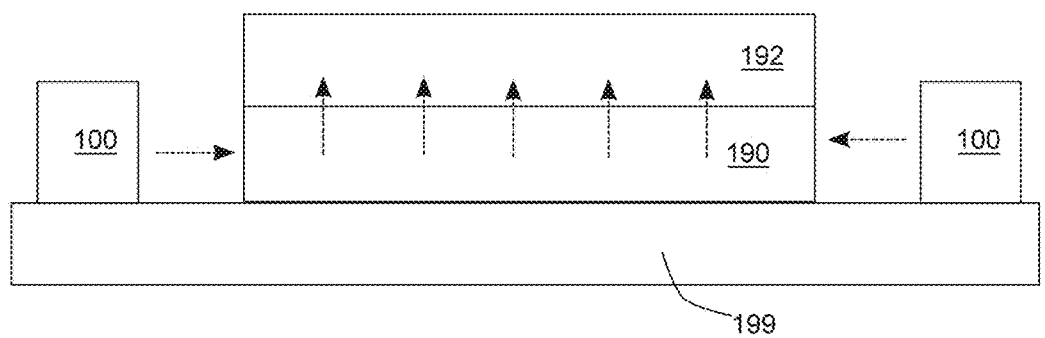
FIG. 5C shows a cross-sectional view of a light-emitting device as a light source for an edge-lit backlight module in accordance with an embodiment of the present disclosure.

As shown in FIGS. 2L, 3L and 4, the light-emitting chip 114 and the wavelength conversion layer 112 are considered as a light-emitting structure. The light-emitting chip 114 is enclosed by the wavelength conversion layer 112. The first reflective layer 104 and the second reflective layer 110 are collectively formed as a reflective frame to surround the light-emitting chip 114 for allowing light to emit toward a certain direction. Each of the conductive layers 106 has a first portion 1061 formed on the internal electrode layer 116 (or the light-emitting chip 114) and electrically connected to the internal electrode layer 116. Each of the conductive layers 106 has a second portion 1062 formed on a side of the light-emitting chip 114. The first portion 1061 is substantially perpendicular to the second portion 1062. The second portion 1062 is used as the external electrode layer 107$r$ (107$l$) for electrically connecting to the solder 120. In other words, the first portion 1061 overlaps the light-emitting chip 114 in a first direction (y direction) and the second portion 1062 overlaps the light-emitting chip 114 in a second direction (x direction). The first direction is substantially perpendicular to the second direction. Each of the conductive layers 106 does not overlap the light-emitting chip 114 in a third direction (z direction). The third direction is perpendicular to the first direction or the second direction. The first reflective layer 104 encloses the conductive layers 106 and exposes the conductive layers 106 in the third direction. Moreover, the conductive layers 106 are covered by the first reflective layer 104 in the first direction and the second direction so the first portion 1061 and the second portion 1062 are not exposed to ambient environment. Accordingly, each of the conductive layers 106 is embedded within in the light-emitting device 100 and runs through the light-emitting device 100, and exposes only two surfaces (to ambient environment) for the external electrode layers 107r (107l).

In the embodiment, each light-emitting chip 114 is used as a light body and is made by semiconductor processes. For example, an n-type semiconductor layer, an active layer and a p-type semiconductor layer are deposited on a sapphire substrate and are patterned. Some insulation layers and patterned metal layers are formed. Thereafter, the sapphire substrate is cut to form a plurality of light-emitting chips. The patterned metal layers provide an electrical connection to the n-type semiconductor layer and the p-type semiconductor layer, and are served as the internal metal layers 116. When a voltage is applied to the internal electrode layers 116, electrons provided by the n-type semiconductor layer and holes provided by the p-type semiconductor layer are combined in the active layer to emit light. Depending on the material of the active laser, the light-emitting chip 114 can emit a red light with a peak wavelength or dominant wavelength of 610~650 nm, a green light with a peak wavelength or dominant wavelength of 530~570 nm, a blue light with a peak wavelength or dominant wavelength of 450~490 nm, a purple light with a peak wavelength or dominant wavelength of 400~440 nm, or a UV light with a peak wavelength of 200~400 nm.

The wavelength conversion layer 112 is used for converting light emitted from the light-emitting chip 114 to another light. For example, the wavelength conversion layer 112 includes, but not limited to, a transparent matrix containing wavelength conversion particles for converting a blue light or UV light to a yellow-greenish light so the light-emitting device 100 can emit white light. Or, based on the material of the wavelength conversion layer 112, the light-emitting device 100 can emit purple light, amber light, green light, yellow light or other non-white light. The transparent matrix includes a transparent resin or transparent silicone. The weight percentage (w/w) of the wavelength conversion particles within the transparent matrix is between 50%~70%.

The wavelength conversion particles include one or two (a plurality of) kinds of inorganic phosphor, organic fluorescent colorants, semiconductors, or combinations thereof. The inorganic phosphor includes, but not limited to, yellow-greenish phosphor or red phosphor. The yellow-greenish phosphor comprises aluminum oxide (such as YAG or TAG), silicate, vanadate, alkaline-earth metal selenide, or metal nitride. The red phosphor includes fluoride ($K_2TiF_6$: $Mn^{4+}$, $K_2SiF_6$:$Mn^{4+}$), silicate, vanadate, alkaline-earth metal sulfide (CaS), metal nitride oxide, a mixture of tungstate and molybdate. The semiconductors include crystal with nano-sizes, for example, quantum dot. The quantum dot can be ZnS, ZnSe, ZnTe, ZnO, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSeS, CuInS, $CsPbCl_3$, $CsPbBr_3$, or $CsPbI_3$.

The light emitted from the light-emitting chip 114 and the wavelength conversion layer 112 is reflected by the first reflective layer 104 and the second reflective layer 110 toward the light-emitting surface 122 and emits outwardly. Furthermore, the first reflective layer 104 and the second reflective layer 110 can be a mixture including a matrix and a plurality of reflective particles dispersed therein so reflection of the light emitted from the light-emitting chip 114 and the wavelength conversion layer 112 occurs within the first reflective layer 103 and the second reflective layer 110 and the reflection is called diffuse reflection. The matrix includes epoxy, silicone, PI, BCB, PFCB, SU8, acrylic resin, PMMA, PET, PC or polyetherimide. The reflective particles include titanium dioxide, silicon dioxide, barium sulfate, zinc oxide, zirconium dioxide or aluminum oxide. In appearance, the first reflective layer 104 and the second reflective layer 110 can be white. When the matrix of the first reflective layer 104 is the same or similar to that of the second reflective layer 110, an interface between the first reflective layer 104 and the second reflective layer 110 is unclear or does not exists. In addition, the interface cannot be distinguished from the appearance so the first reflective layer 104 and the second reflective layer 110 are considered as an integrated structure.

The conductive layers 106, the patterned seed layer 108 and the metal multilayer can be made of metal, for example, Au, Ag, Cu, Cr, Al, Pt, Ni, Ti, Sn, or the alloy thereof. In addition, the conductive layers 106 and the patterned seed layer 108 can be a single layer or a multilayer.

As shown in FIGS. 1, 2A and 3A, in step 12, the light-emitting chips 114 made by the semiconductor processes are arranged on a first carrier 124. The internal electrode layers 116 of the light-emitting chips 114 face toward the first carrier 124. The first carrier 124 is used as a temporary substrate and its material includes, but not limited to foam.

As FIGS. 1, 2B, and 3B show, in step 14, a wavelength conversion layer 112 is formed on the light-emitting chips 114. The wavelength conversion layer 112 can be formed by adhering a transparent silicone sheet including wavelength conversion particles to the light-emitting chips 114. The adhesion is established by tightly sealing an upper mold (not shown) and a lower mold (not shown) with heat and pressure for softening the transparent silicone sheet. Then, the transparent silicone sheet tightly adheres to the light-emitting chips 114. In addition, the air is extracted out when the upper mold is very close to the lower mold and the transparent silicone sheet does not contact the light-emitting chips 114. The bubble between the transparent silicone sheet and the light-emitting chips 114 can be eliminated and the strength of joint can be enhanced. The adhesion between other materials can be referred to the aforesaid description. In other embodiment, a transparent matrix including wavelength conversion particles can be formed on the light-emitting chips 114 and the first carrier 124 by spraying, coating, dispensing, printing (stencil printing or screen printing) or molding and then a heat treatment is performed to cure the transparent matrix for forming the wavelength conversion layer 112.

As FIGS. 1, 2C, and 3C show, in step 16, the wavelength conversion layer 112 is cut to form trenches 126, 127. The trenches 126, 127 can be formed, but not limited to, by a blade 128. To be more specific, the blade 128 is provided to cut downward until reaching to the first carrier 124. A height of the trenches 126, 127 is substantially the same as the height of the wavelength conversion layer 112 (y direction).

As FIGS. 1, 2D, and 3D show, in step 18, a second reflective layer 110 is formed on the wavelength conversion layer 112 and the first carrier 124. The second reflective layer 110 fills the trenches 126, 127 completely and covers the wavelength conversion layer 112 completely. For example, the second reflective layer 110 can be a pre-formed sheet made of silicone and reflective particles and adheres to the first carrier 124. The description of the adhesion can be referred to the aforesaid paragraphs. In one embodiment, the second reflective layer 110 can be formed by spraying, coating, dispensing, printing (stencil printing or screen printing) or molding.

As FIGS. 1, 2E and 3E shows, in step 20, a portion of the second reflective layer 110 is grinded until the wavelength conversion layer 112 is exposed therefrom. A surface of the second reflective layer 110 is substantially flush with a surface of the wavelength conversion layer 112. Grinding is a physical removal process which is conducted by machinery cutters. The cutter can be composed of high-carbon steel, diamond, ceramic or BN. During the grinding, only water (no slurry or chemical solution) is provided to lower the temperature which is raised due to friction between the cutter and the material to be cut.

As FIGS. 1, 2F and 3F show, in step 22, the structure of FIGS. 2E and 3E is reversed and then attached to a second carrier 102. The first carrier 124 is removed by heating. The second carrier 102 can be a UV release tape and has a higher adhesion before irradiating by UV radiation light. The adhesion is decreased significantly after irradiating by UV radiation light. The structure on the second carrier 102 can be considered as a light-emitting module 130 having a bottom surface 132 and a plurality of light-emitting chips 114. Each of the internal electrode layers 116, the wavelength conversion layer 112 and the second reflective layer 110 has a surface, and these surfaces are flush with each other and constitute the bottom surface 132.

As FIGS. 1, 2G and 3G show, in step 24, portions of the second reflective layer 110 are removed to form V-shaped trenches 136. Specifically, a blade 134 with a predetermined angle is provided to cut downward but not reaching the second carrier 102 and moves along a z direction to remove portions of the second reflective layer 110 for forming the V-shaped trenches 136. The depth of the V-shaped trenches 136 is smaller than the height of the second reflective layer 110. One V-shaped trench 136 is located between two adjacent light-emitting chips 114. Each of the V-shaped trenches 136 has two inclined surfaces 138*l*, 138*r* not parallel to each other. The structure of FIGS. 2G and 3G is illustrative, and in other embodiments the shape and the number of the trench can be varied and will be described later.

As FIGS. 1, 2H and 3H shows, in step 25, the patterned seed layer 108 is formed. The patterned seed layer 108 is formed along the profile of the V-shaped trenches 136 (conformably formed) and covers the internal electrode layer 116, the wavelength conversion layer 112 and the second reflective layer 110. The patterned seed layer 108 does not fill the V-shaped trenches 136 completely. In addition, the patterned seed layer 108 covers the two internal electrode layers 116 completely and has an area greater than that of the corresponding internal electrode layer 116. The patterned seed layer 108 is not formed between the two internal electrode layers 116 of one light-emitting chip 114. Actually, the patterned seed layer 108 has a thickness of 100~500 Å and is drawn oversized for clarity.

As FIG. 1 shows, in step 29, an electroplating is performed on the patterned seed layer 108 to form a metal multilayer (not shown). The metal multilayer has a shape substantially the same as the patterned seed layer 108. In other embodiment, step 29 can be omitted. As shown in FIGS. 2H and 3H, the patterned seed layer 108 includes a plurality of regions which are not connected to each other, but not limited to this disclosure. In other embodiment, for being convenient to conduct the electroplating, the patterned seed layer 108 includes a plurality of conductive portions, having a width less than that formed on the internal electrode layer 116, formed on regions of the second reflective layer 110 to be cut in the subsequent process so the conductive portions are electrically connected to the patterned seed layer 108 formed on the internal electrode layer 116 and the V-shaped trenches 136.

As FIGS. 1, 2I and 3I shows, in step 30, a solder paste printing is performed to form the conductive layers 106 on the metal multilayer. For example, a squeegee and a stencil or mesh screen with a plurality of predetermined apertures are provided to cause solder paste on the metal multilayer. Then, a reflow process is conducted. By the cohesive force of the solder paste, the solder paste is automatically formed merely on the metal multilayer and have a pattern substantially the same as that of the corresponding metal multilayer. The solder paste is namely the conductive layers 106 of FIGS. 2I and 3I and fills the V-shaped trenches 136 completely.

As FIGS. 1, 2J and 3J shows, in step 32, a plurality of trenches 140 is formed, but not limited to, by a blade 142. Specifically, the blade 142 is provided to cut downward until reaching the second carrier 102 and moves along the z direction to physically remove a portion of the conductive layers 106, the metal multilayer, the patterned seed layer 108, and the second reflective layer 110 for forming the trenches 140. In FIG. 2J, the blade 142 is also used to cut at the outmost edge in the x direction, so the second reflective layer 110 is exposed.

As FIGS. 1, 2K and 3K shows, in step 34, a first reflective layer 104 is formed. Formation of the first reflective layer 104 can be the same as that of the second reflective layer 110, and the descriptions can be referred to corresponding paragraphs. The first reflective layer 104 fills the trenches 140 completely and covers the conductive layers 106. Thereafter, in step 36, the first reflective layer 104 is grinded to reduce the thickness of the first reflective layer 104 on the conductive layers 106, and the first reflective layer 104 has a substantially flat surface. The structure of FIGS. 2K and 3K is shown after finishing step 36.

As FIGS. 1, 2L, 3L and 4 shows, in step 38, the structure of FIG. 2K is cut to form a plurality of light-emitting devices 100. Specifically, the blade 144 is provided to cut downward until reaching the second carrier 102 and moves along the x direction for forming the trenches 148. The blade 146 is provided to cut downward until reaching the second carrier 102 and moves along the z direction for forming the trenches 150. Each of the conductive layers 106 has two surfaces exposed from the trenches 148, and the exposed conductive layers 106 are served as the external electrode layers 107*r*, 107*l* in one light-emitting device 100. As shown in FIGS. 3L and 4, each light-emitting chip 114 is surrounded by the wavelength conversion layer 112 and is also surrounded by the reflective frame formed collectively by the first reflective layer 104 and the second reflective layer 110.

Subsequently, after attaching a blue tape to the first reflective layer 104, the second carrier 102 is irradiated by UV radiation light to lower the adhesion therebetween for separating the light-emitting devices 100 from the second carrier 102. The conductive layers 106 provide a conductive path and a heat-dissipating path for the light-emitting chips 114 through the patterned seed layer 108.

Figure 6:
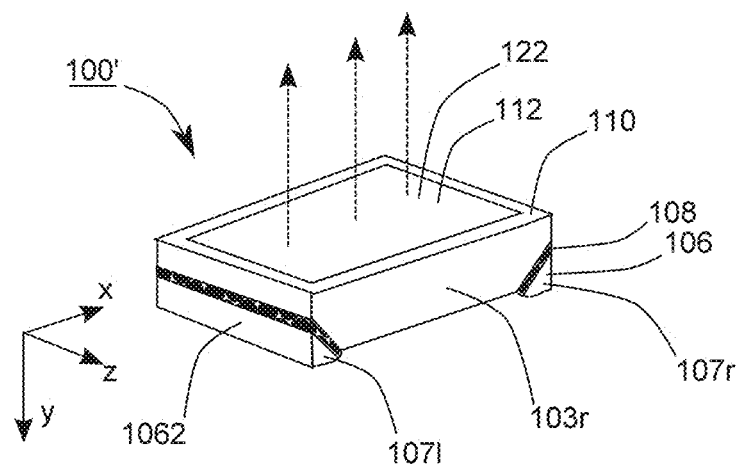
FIG. 6 shows a perspective view of a light-emitting device having a main light-emitting direction facing upwardly in accordance with an embodiment of the present disclosure.

Optionally, as shown in FIGS. 2I and 3I, steps 32, 34, 36 are not performed after finishing step 30, and step 38 is performed to form the light-emitting device 100' of FIG. 6. Specifically, the structure of FIG. 2I is cut to form a plurality of light-emitting devices 100'. Referring to FIGS. 2I and 6, each of the conductive layers 106 has four surfaces exposed to ambient environment. In other words, in appearance, the conductive layers 106 can be seen from the different perspective views of the light-emitting devices 100' except the light-emitting surface 122. In FIG. 6, the second portion 106₂ of the conductive layers 106 can be seen.

Figure 22A:
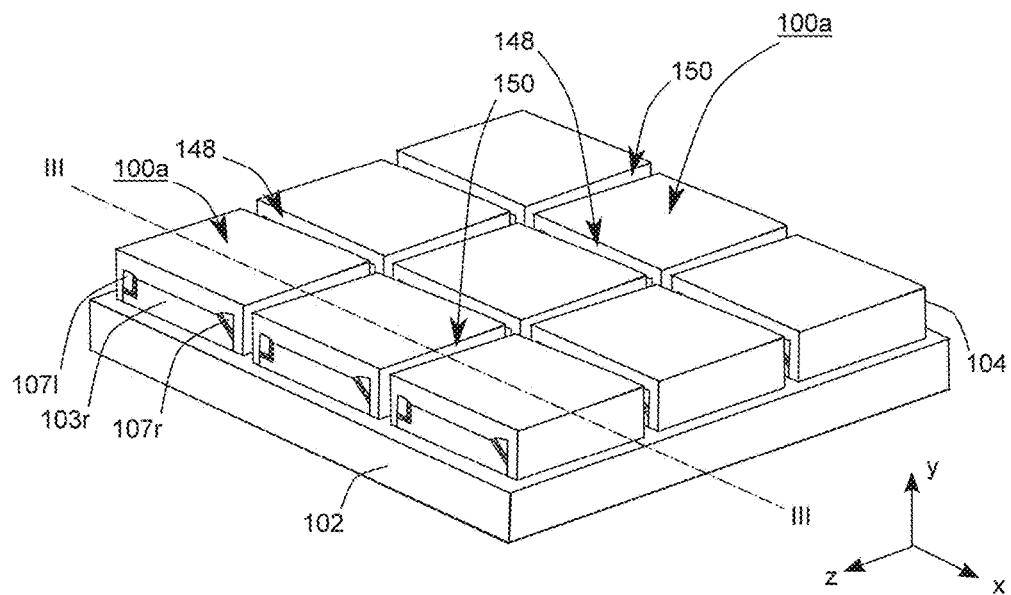
FIG. 22A shows a perspective view of a step of making a light-emitting device in accordance with an embodiment of the present disclosure.
Figure 23A:
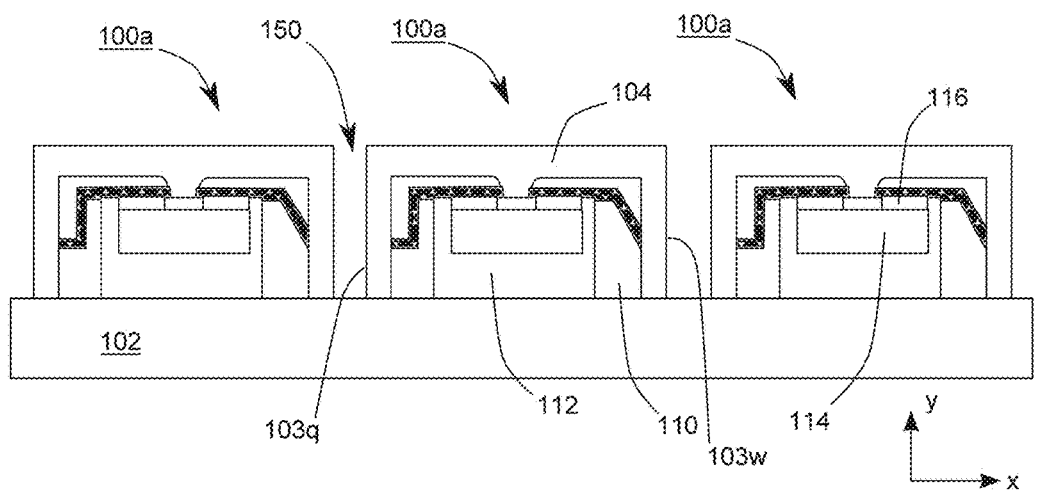
FIG. 23A shows a cross-sectional view taken along line III-III of FIG. 22A.

FIG. 22A shows a perspective view of a step of making a light-emitting device in accordance with an embodiment of the present disclosure. FIG. 23A shows a cross-sectional view taken along line III-III of FIG. 22A. FIG. 22A shows light-emitting devices 100a in a 3×3 array. The same or similar element between the light-emitting device 100a and the light-emitting device 100 can be referred to the aforesaid descriptions. Different from the light-emitting device 100, in appearance, the light-emitting device 100a has the external electrode layer 107r with a substantial triangle and the external electrode layer 107l with a substantial rectangle for identifying the polarity (p-electrode or n-electrode) thereof. Specifically, in step 24, when a blade with a straight-line shape in cross section, the trenches 136 has a rectangle cross-section. Next, steps 25-38 are performed for forming the light-emitting device 100a. The cross-sectional shape of the trench 136 can be determined by the shape of the blade so the external electrode layers 107r, 107l (the conductive layer 106) have different profiles (for example, round or polygon).

Figure 22B:
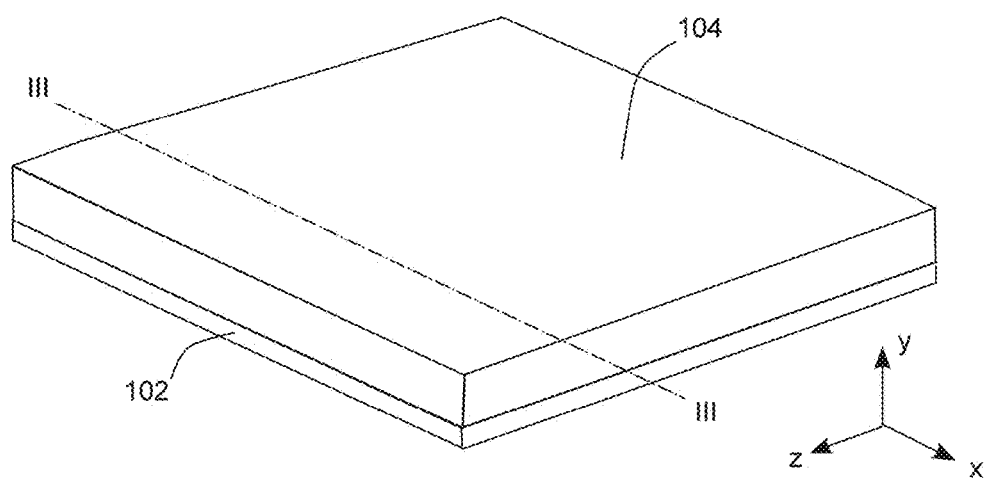
FIGS. 22B and 22C show perspective views of two steps of making a light-emitting device in accordance with an embodiment of the present disclosure.
Figure 23B:
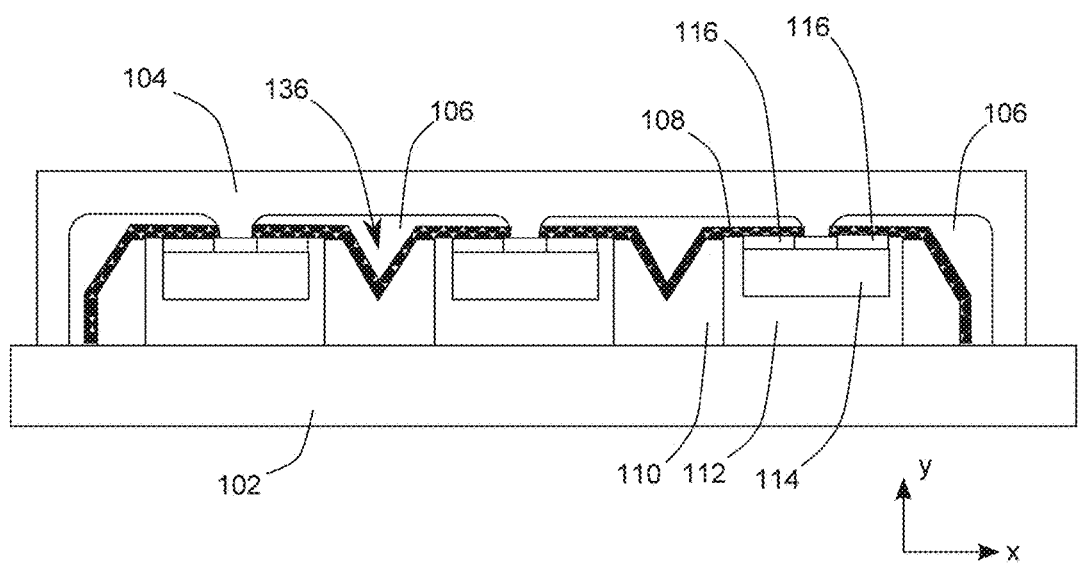
FIG. 23B shows a cross-sectional view taken along line III-III of FIG. 22B.
Figure 22C:
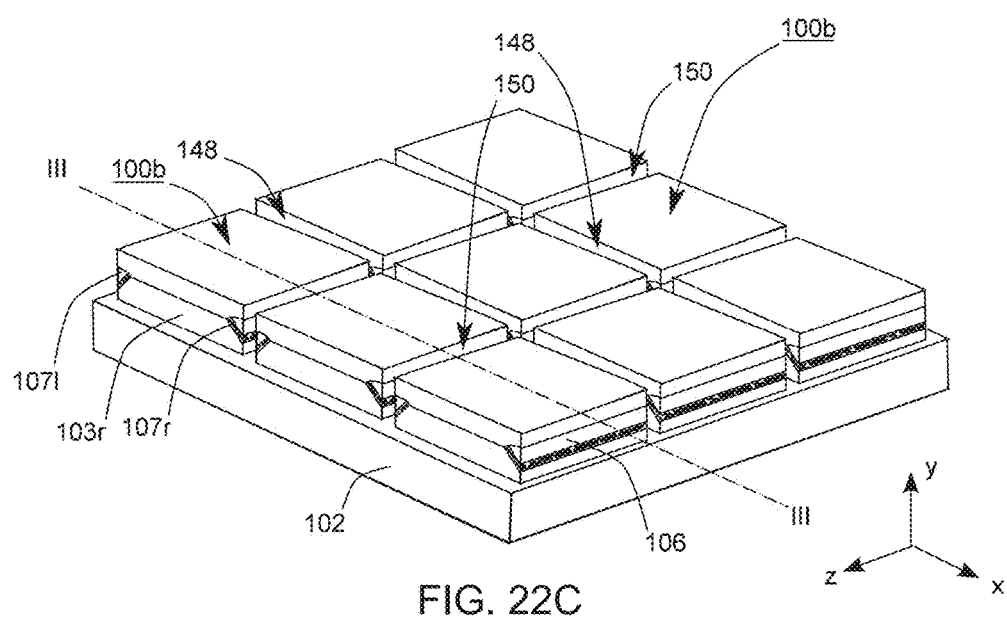
Figure 23C:
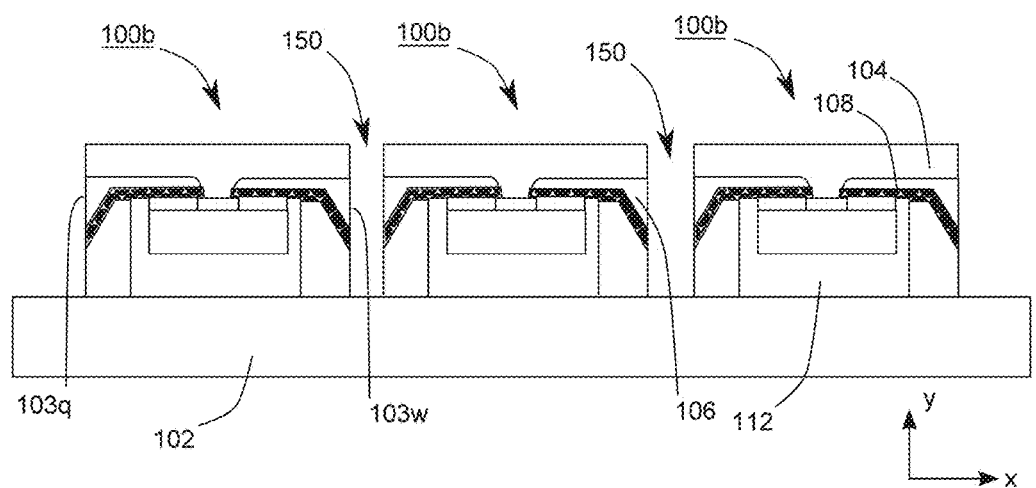
FIG. 23C shows a cross-sectional view taken along line III-III of FIG. 22C, respectively.

FIGS. 22B and 22C show perspective views of two steps of making a light-emitting device in accordance with an embodiment of the present disclosure. FIG. 23B shows a cross-sectional view taken along line III-III of FIG. 22B. FIG. 23C shows a cross-sectional view taken along line III-III of FIG. 22C. FIG. 22B shows a perspective view which is the result from performing steps 12-34 without performing step 32 in the flowchart 10. Other related descriptions can be referred to the aforesaid descriptions and will be not described herein. In FIG. 22B, the trenches 140 shown in FIGS. 2J and 3J are not formed and the first reflective layer 104 is formed on the conductive layers 106. As shown in FIG. 22C, step 38 is performed to form a plurality of light-emitting devices 100b. The same or similar element between the light-emitting device 100b and the light-emitting device 100, 100a can be referred to the aforesaid descriptions.

In FIGS. 3L and 23A, the side surface 103q, 103w is merely composed of a surface of the first reflective layer 104 and each conductive layer 106 has two surfaces exposed to ambient environment (for example, air). However, in the light-emitting device 100b, each of the first reflective layer 104, the conductive layer 106, the metal multilayer, the patterned seed layer 108 and the wavelength conversion layer 112 has a surface and these surfaces constitute the side surface 103q, 103w (of the light-emitting device 100b). In addition, each conductive layer 106 has three surfaces exposed to ambient environment (for example, air). Accordingly, in appearance, the conductive layer 106 can be seen from the side surface 103l, 103r, 130q (130w).

Figure 22D:
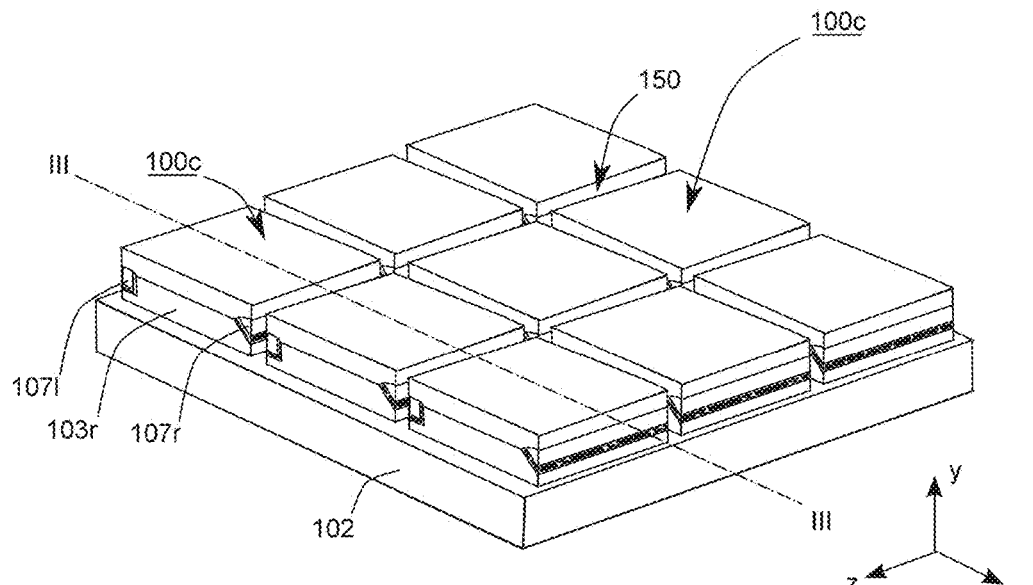
FIG. 22D shows a perspective view of a step of making a light-emitting device in accordance with an embodiment of the present disclosure.
Figure 23D:
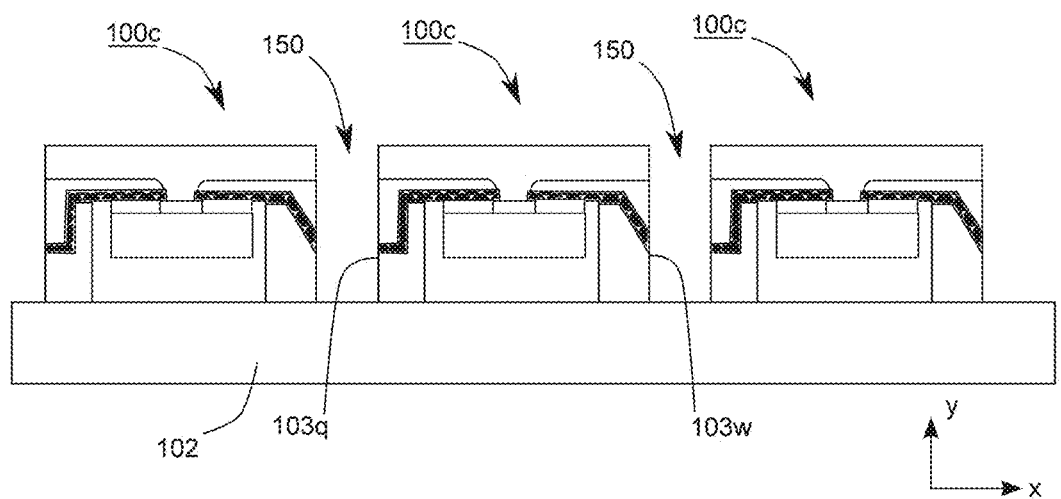
FIG. 23D shows a cross-sectional view taken along line III-III of FIG. 22D.

FIG. 22D shows a perspective view of a step of making a light-emitting device in accordance with an embodiment of the present disclosure. FIG. 23D shows a cross-sectional view taken along line III-III of FIG. 22D. FIG. 22D shows light-emitting devices 100c in a 3×3 array. Each of the light-emitting devices 100c has the external electrode layers 107r, 107l with different shapes in appearance. Furthermore, each conductive layer 106 has three surfaces exposed to ambient environment. Referring to the descriptions of making the light-emitting devices 100, 100a, 100b, the light-emitting device 100c can be also made based on the flowchart 10. However, in step 24, a blade 134 with corresponding profiles is used to form the trenches 136 (having a rectangle cross-section and a round cross-section). Next, steps 25-30, and 34-38 are performed and step 32 is not performed so a plurality of light-emitting devices 100c is obtained. The detailed descriptions can be referred to the related paragraphs.

Figure 23E:
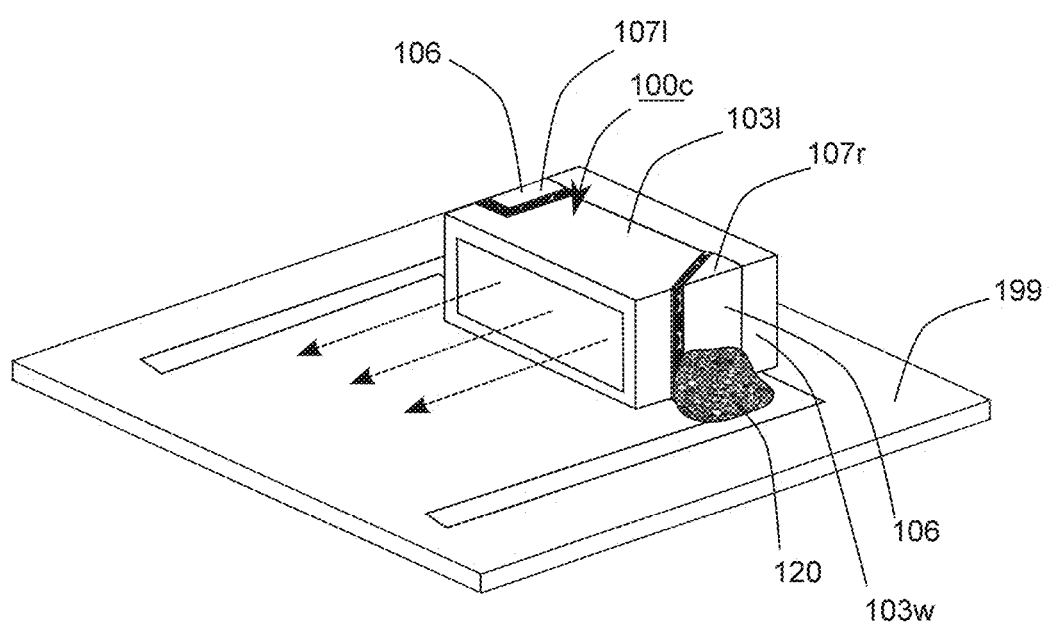
FIG. 23E shows a perspective view of the light-emitting device of FIG. 22D mounted on a printed circuit board.

FIG. 23E shows a perspective view of the light-emitting device of FIG. 22D mounted on a printed circuit board. As each conductive layer 106 (external electrode layers 107r, 107l) has three surfaces exposed to ambient environment, a solder 120 is used to electrically connect the light-emitting device 100c with the printed circuit board 199 and to mount the light-emitting device 100c on the printed circuit board 199 through the side surfaces 103q, 103w of the light-emitting device 100c. Compared to FIG. 5B where the light-emitting device 100 is mounted on the printed circuit board 199 through the side surfaces 103r, 103l, the side surfaces 103q, 103w has a larger area for improving a bond strength between the light-emitting device 100c and the printed circuit board 199 so a reliability of a backlight display module can be enhanced.

FIGS. 24A-24E show perspective views of partial steps of making a light-emitting device in accordance with an embodiment of the present disclosure. FIGS. 25A-25E show cross-sectional views taken along line III-III of FIGS. 24A-24E, respectively.

Figure 24A:
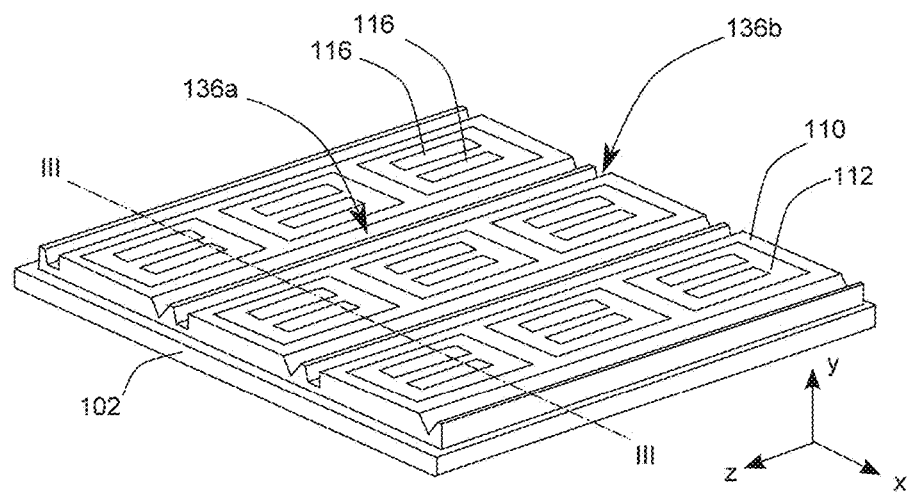
FIGS. 24A-24E show perspective views of partial steps of making a light-emitting device in accordance with an embodiment of the present disclosure.
Figure 25A:
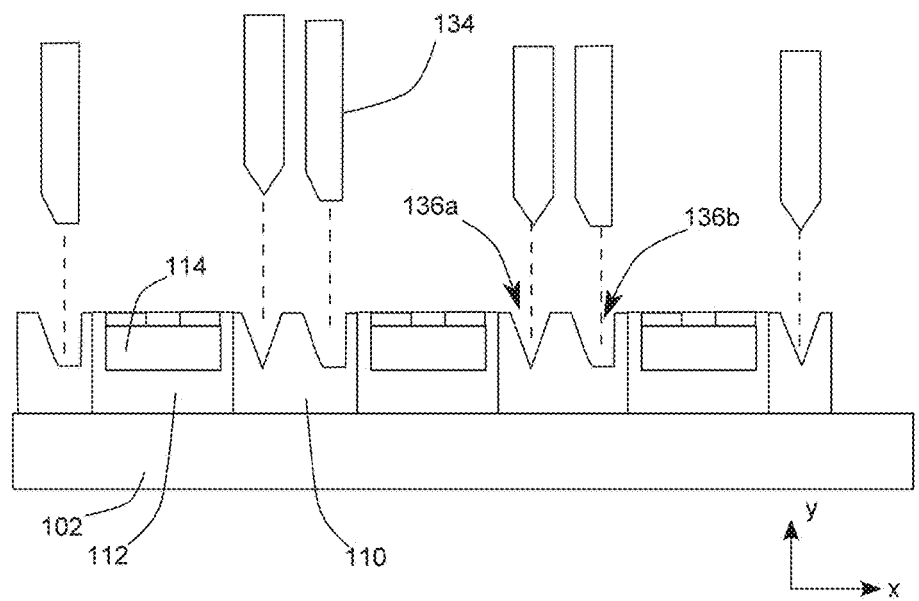
FIGS. 25A-25E show cross-sectional views taken along line III-III of FIGS. 24A-24E, respectively.

First, steps 12-22 of FIG. 1 are performed and the related descriptions can be referred to the related paragraphs. Next, as shown in FIG. 24A, step 24 is performed to remove a portion of the second reflective layer 110 for forming the trenches 136a, 136b. Specifically, a blade 134 is used to cut downward between two adjacent light-emitting chips 114 but not reaching the second carrier 102 and moves along a z direction to form the trenches 136a, 136b with different cross sections.

Figure 24B:
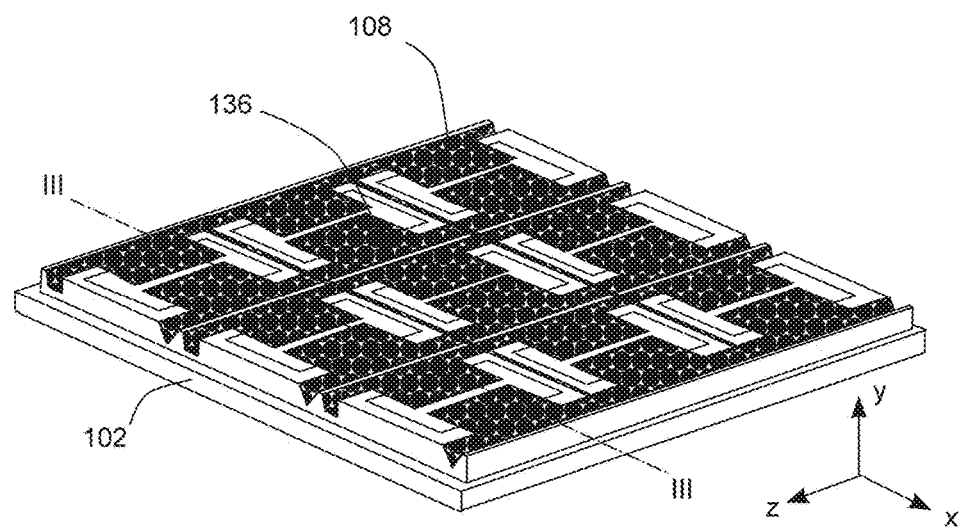
Figure 25B:
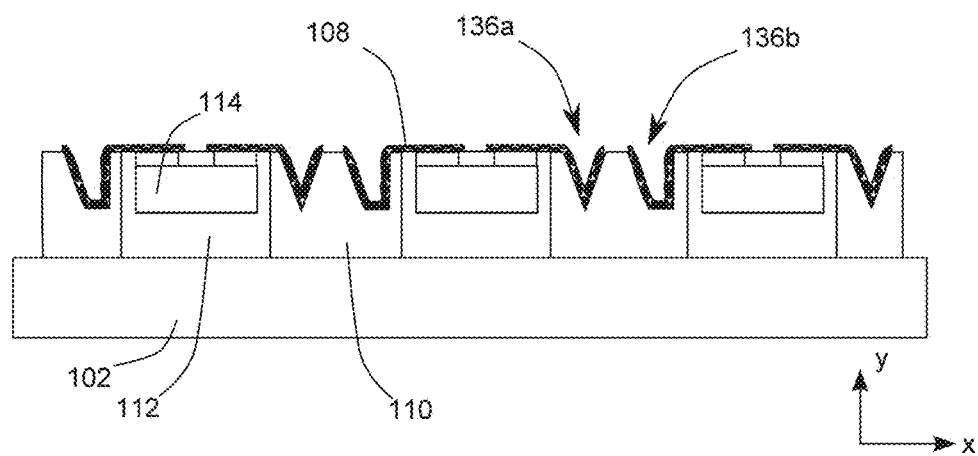

As shown in FIGS. 24B and 25B, step 25 is performed to form the patterned seed layer 108. Step 29 can be performed or not performed.

Figure 24C:
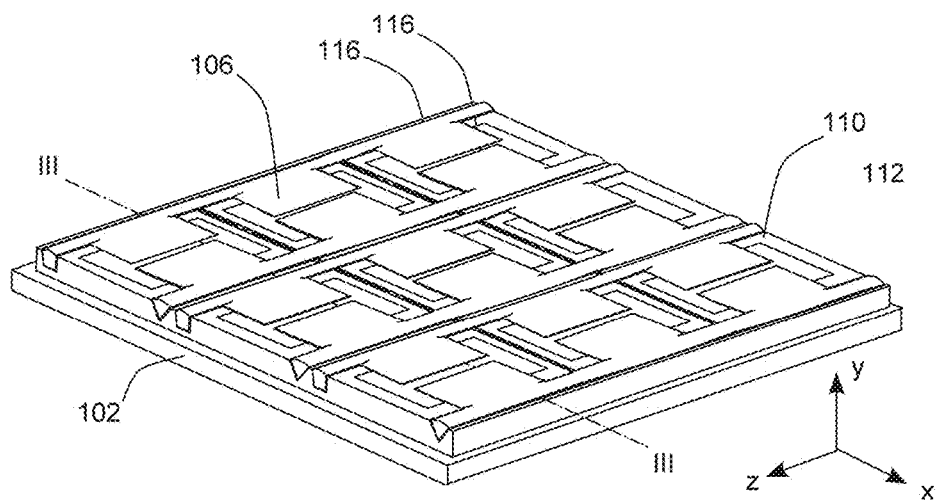
Figure 25C:
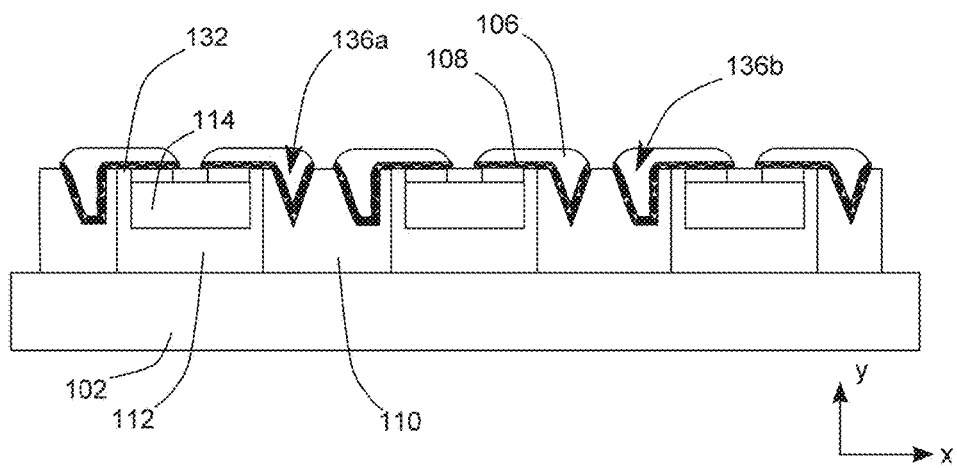

As shown in FIGS. 24C and 25C, step 30 is performed to print the solder for forming the conductive layer 106.

Figure 24D:
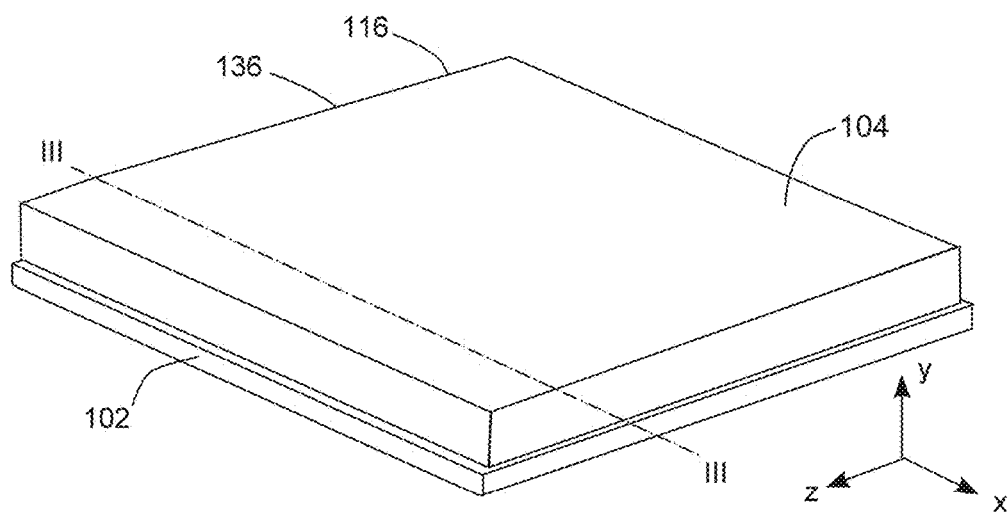
Figure 25D:
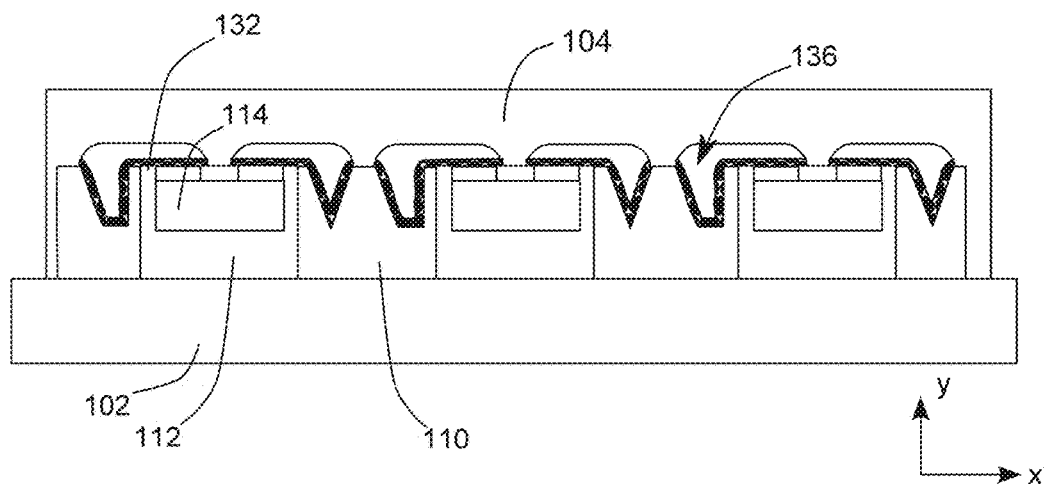

As shown in FIGS. 24D and 25D, step 34 is performed to form the first reflective layer 104. Step 36 is performed to grind the first reflective layer 104 for reducing the thickness thereof.

Figure 24E:
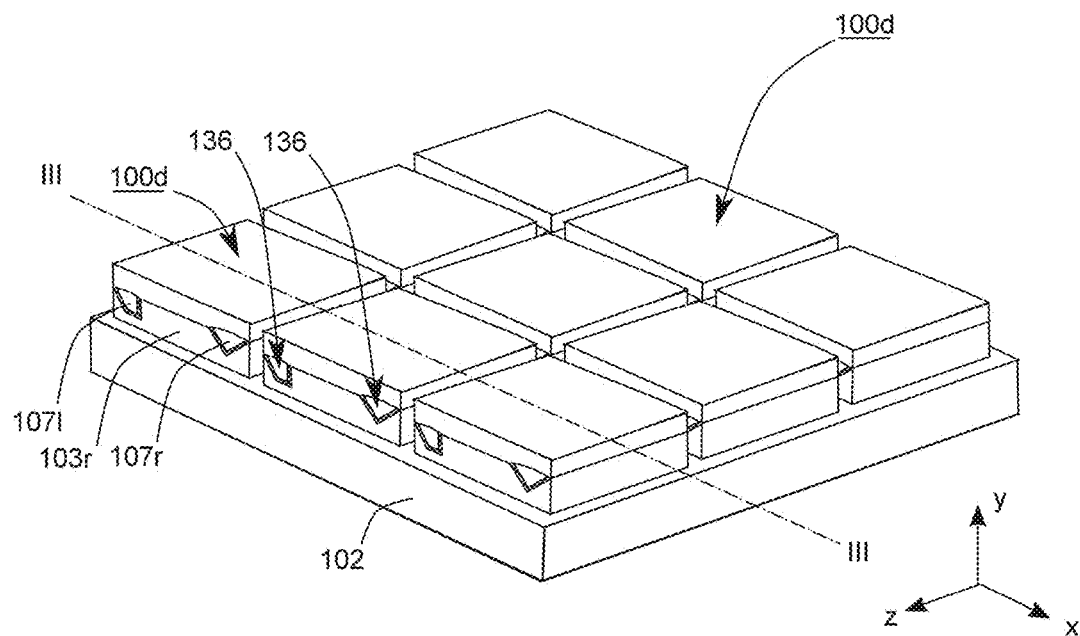
Figure 25E:
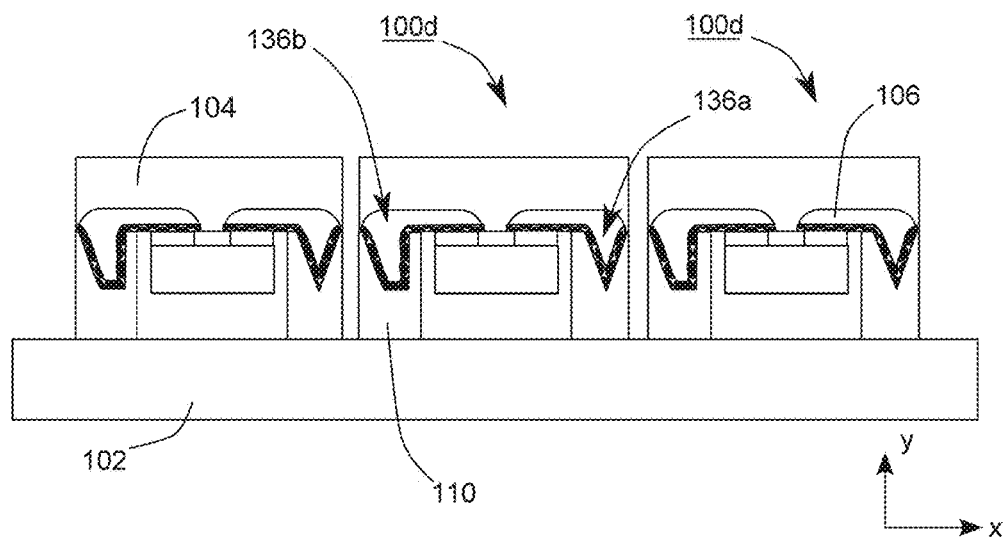

As shown in FIGS. 24E and 25E, finally, step 38 is performed to form a plurality of light-emitting devices 100d. The light-emitting devices 100d have the external electrode layers 107r, 107l with different shapes and each conductive layer 106 has merely two surfaces exposed to ambient environment.

Figure 7:
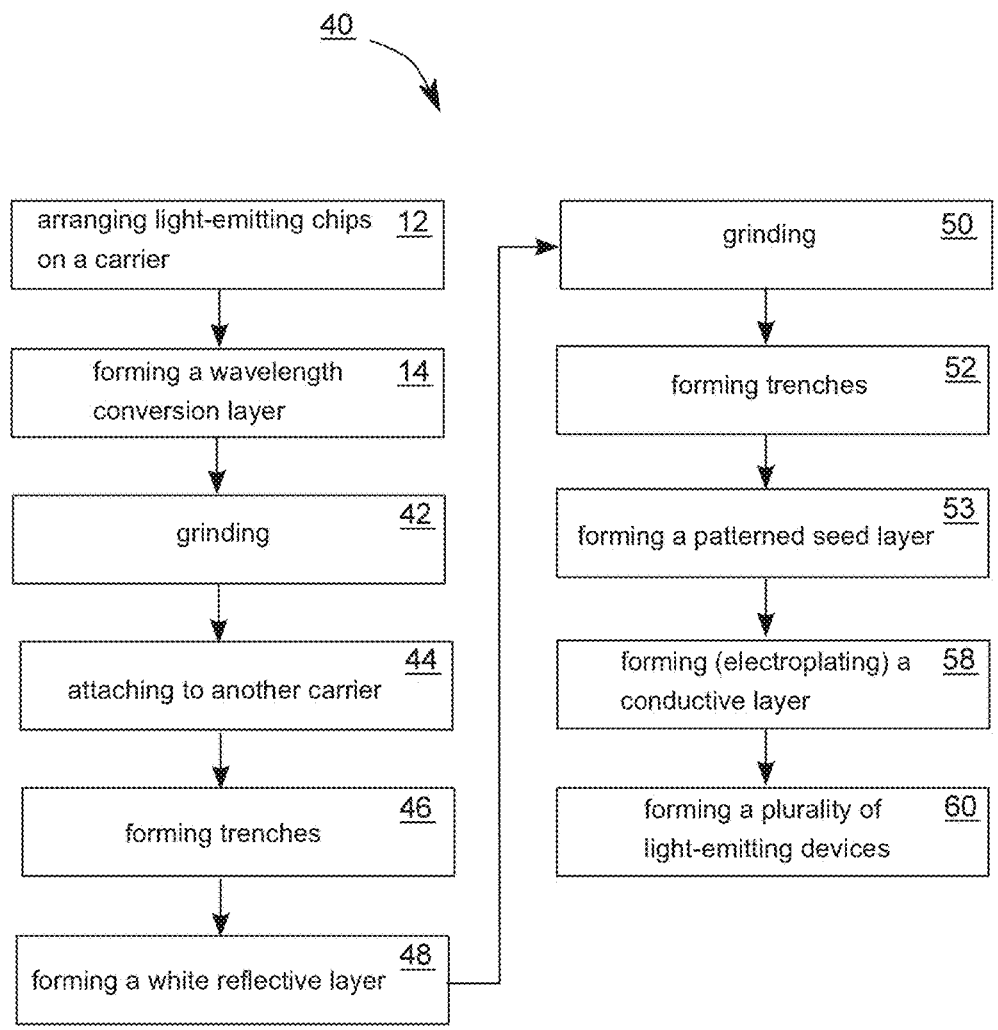
FIG. 7 shows a flowchart of making a light-emitting device in accordance with an embodiment of the present disclosure.
Figure 8A:
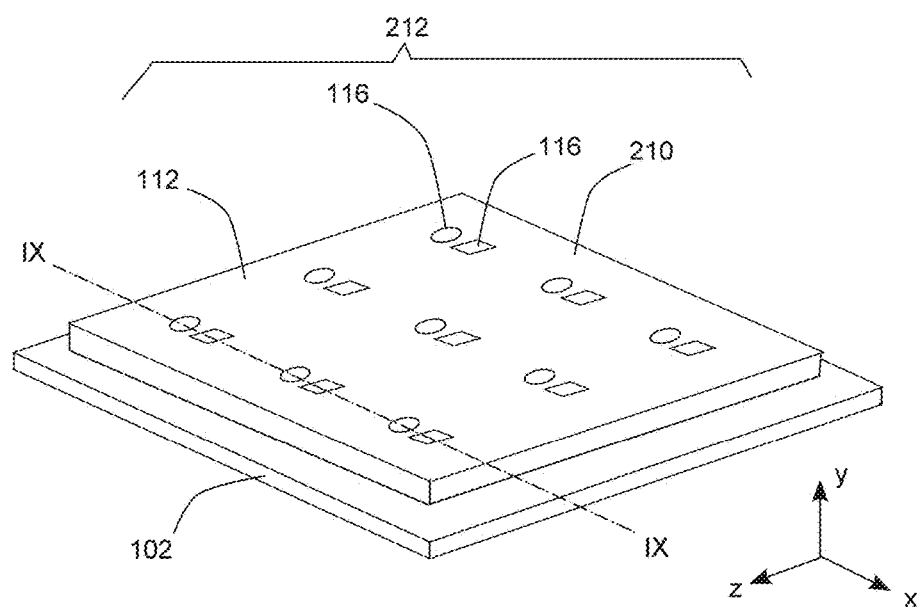
FIGS. 8A-8H show perspective views of steps embodied in FIG. 7.
Figure 9A:
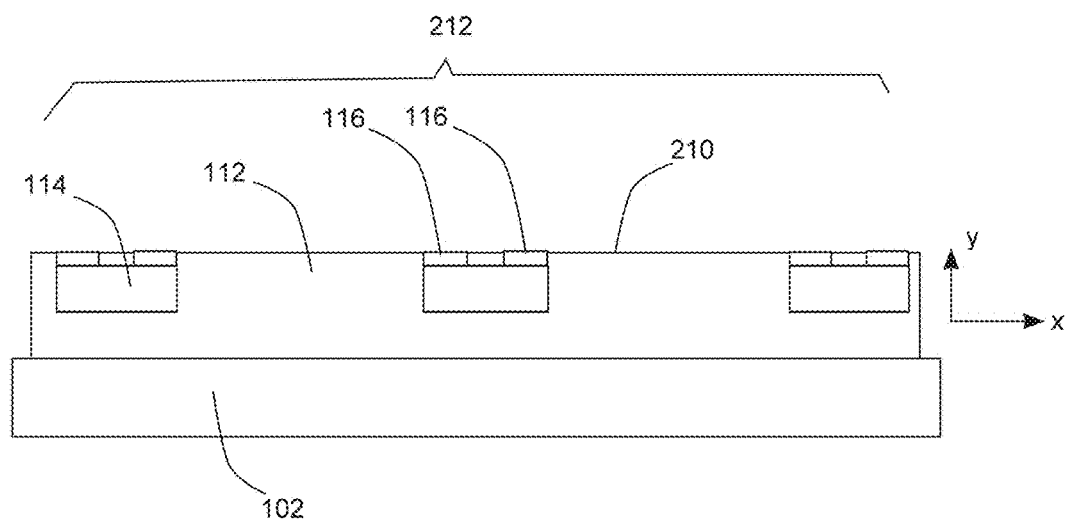
FIGS. 9A-9H show cross-sectional views taken along line IX-IX of FIGS. 8A-8H, respectively.
Figure 8B:
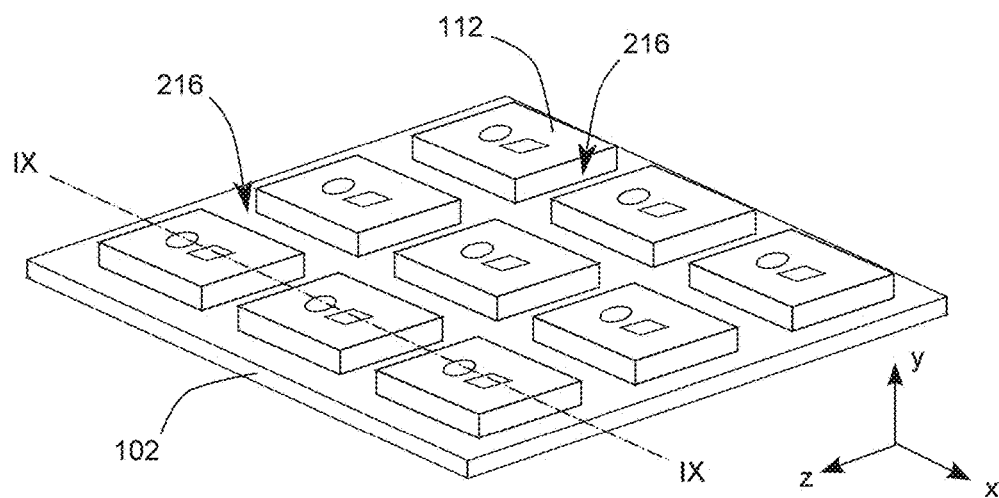
Figure 9B:
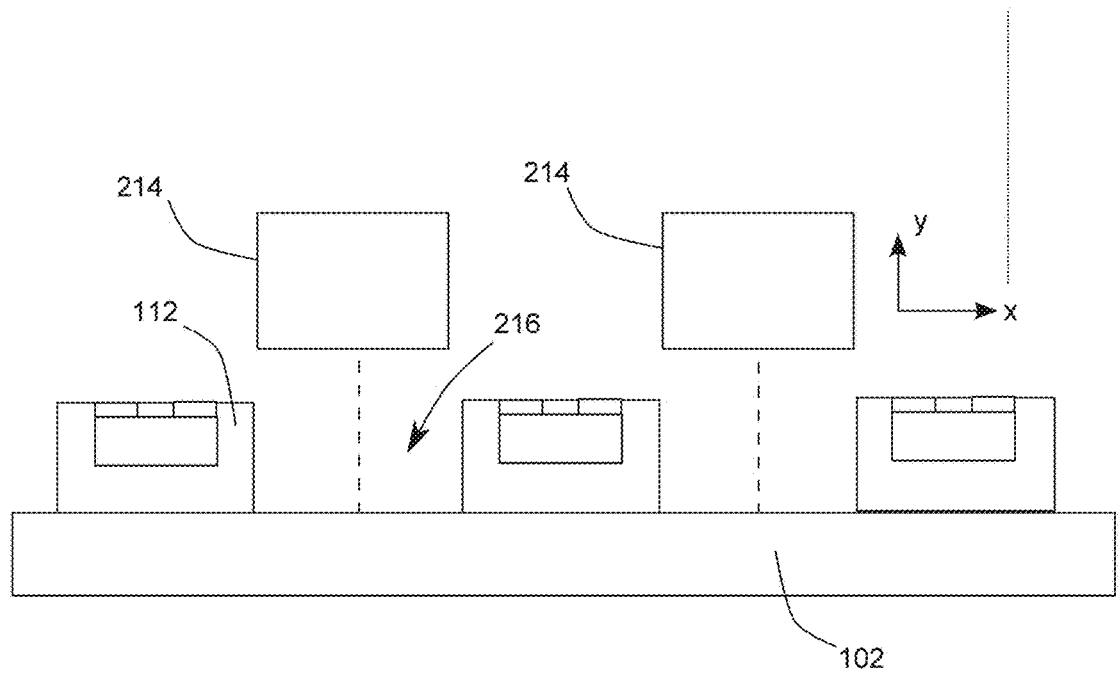
Figure 8C:
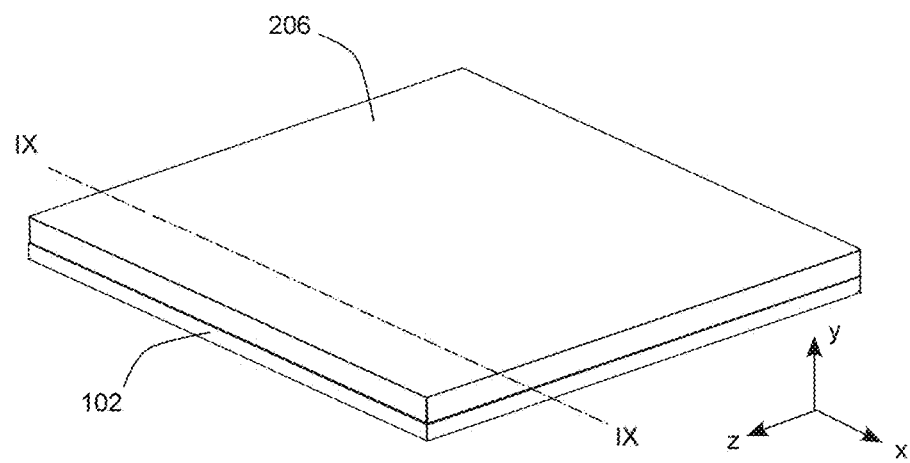
Figure 9C:
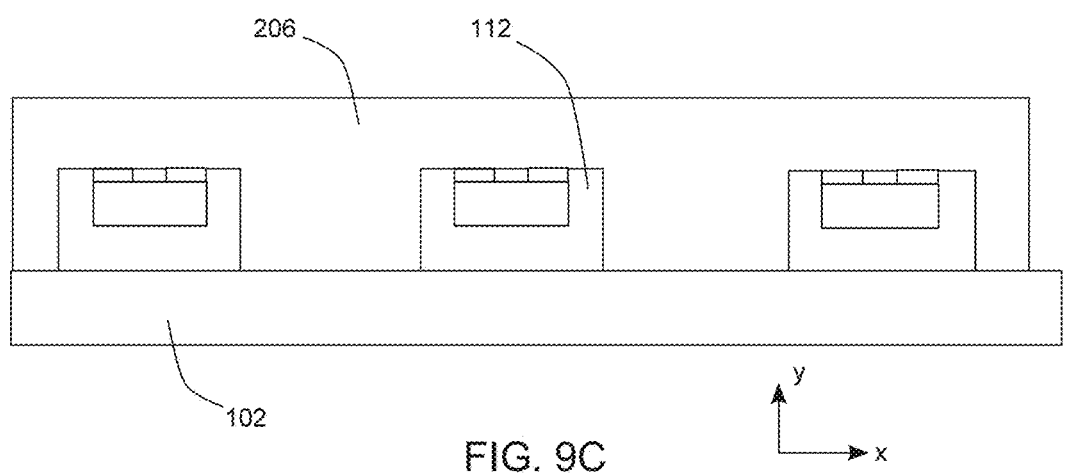
Figure 8D:
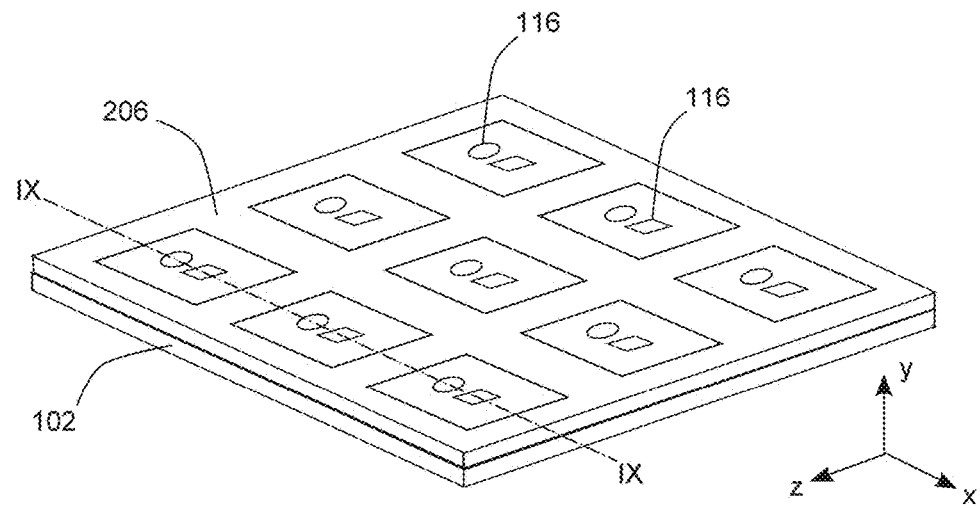
Figure 9D:
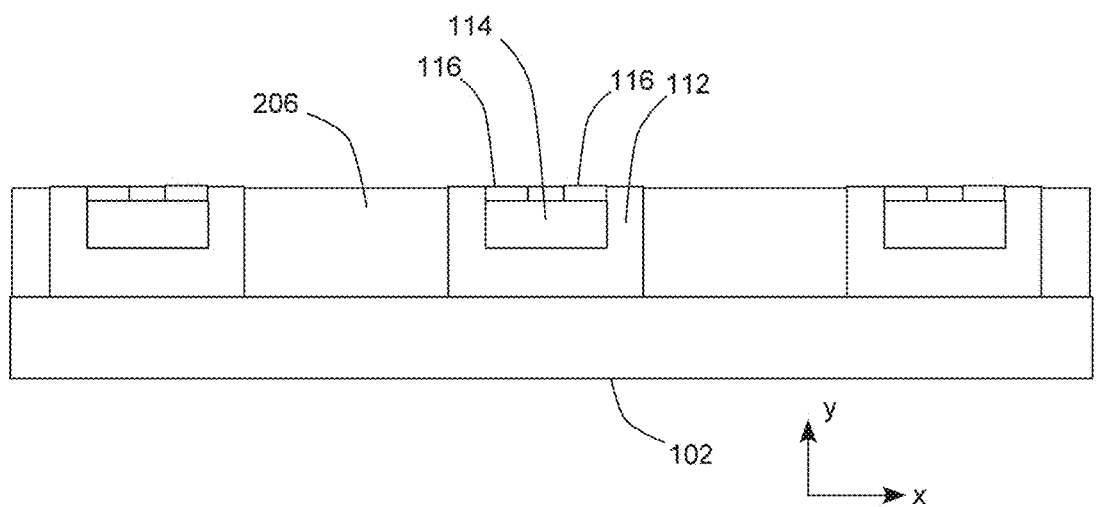
Figure 8E:
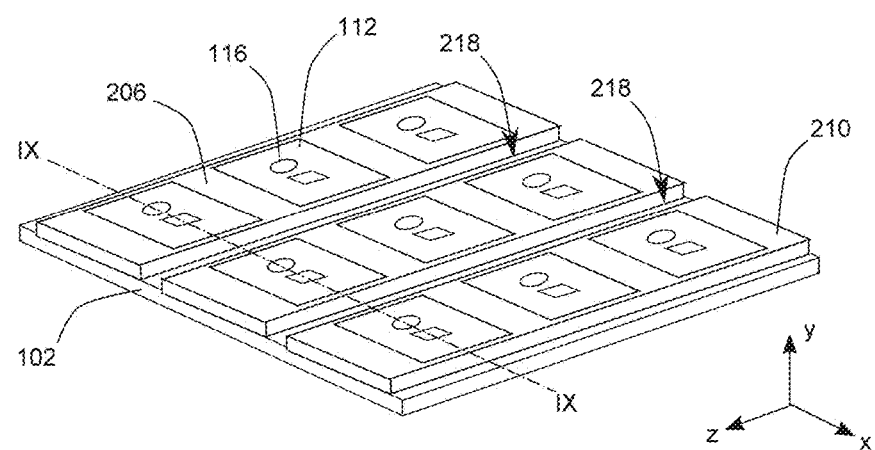
Figure 9E:
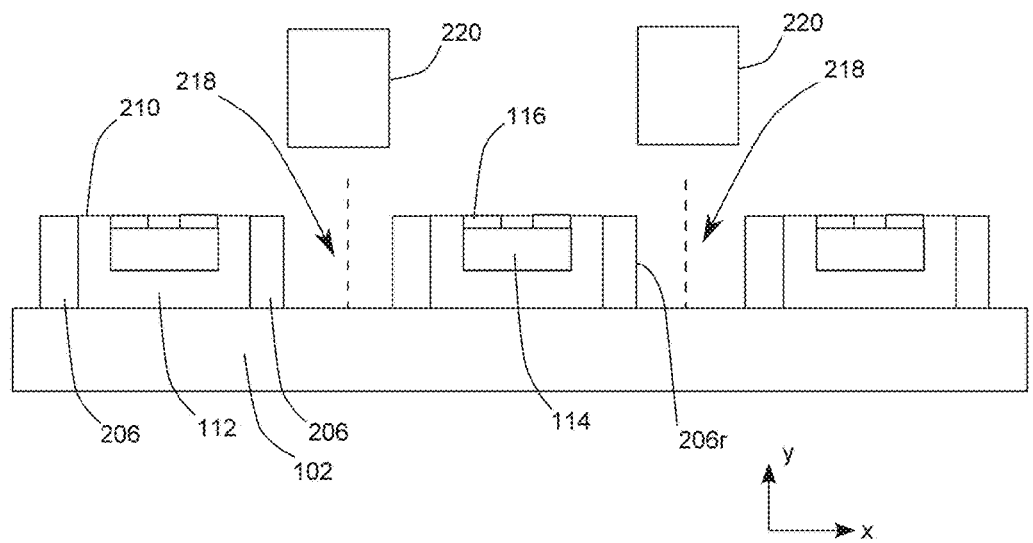
Figure 8F:
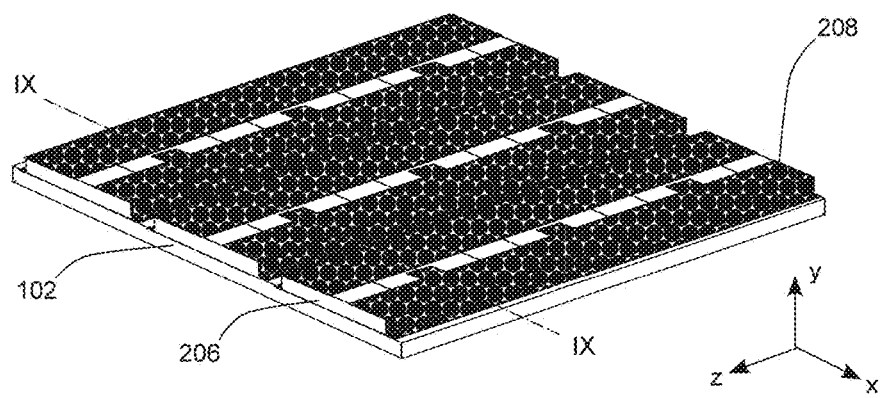
Figure 9F:
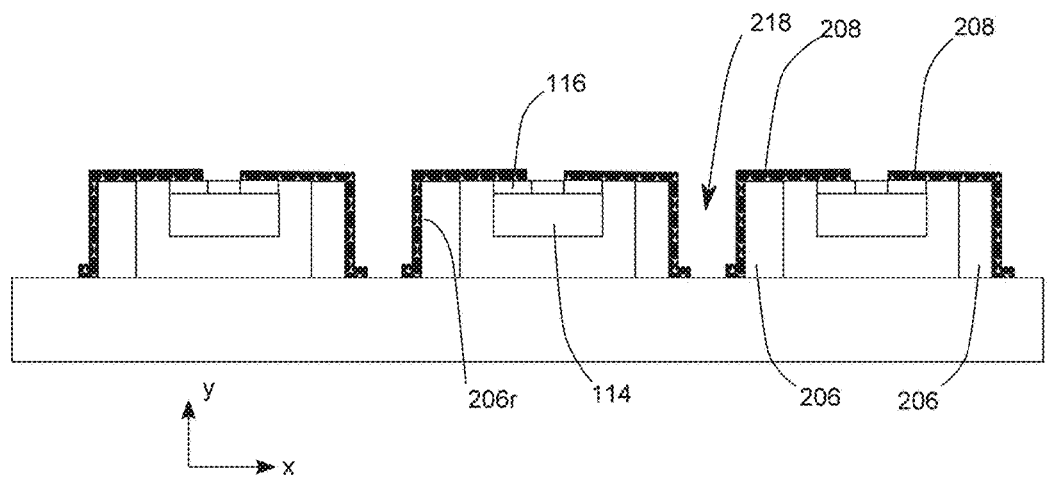
Figure 8G:
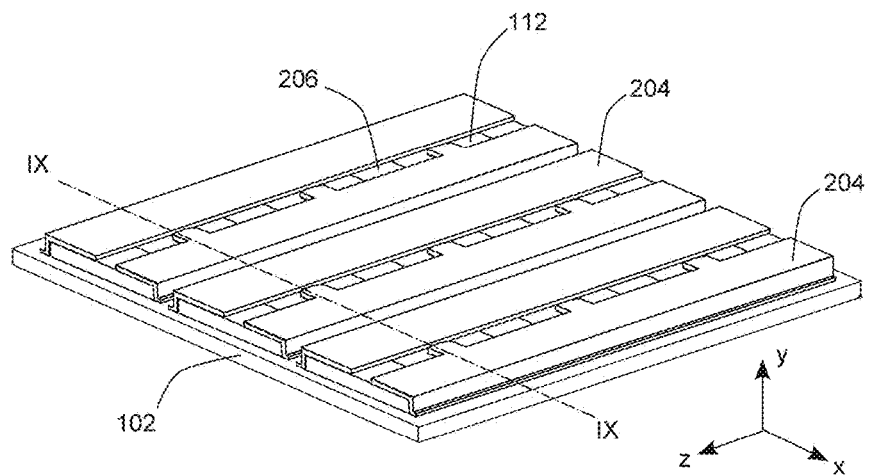
Figure 9G:
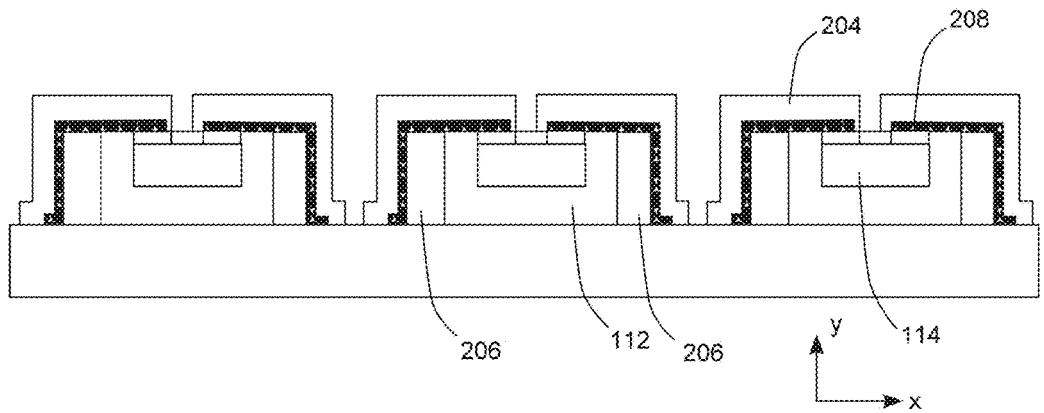

FIG. 7 shows a flowchart 40 of making a light-emitting device 200 in accordance with an embodiment of the present disclosure. FIGS. 8A-8H show perspective views of steps embodied in FIG. 7. FIGS. 9A-9H show cross-sectional views taken along line IX-IX of FIGS. 8A-8H, respectively. FIG. 10 shows a perspective view of a single light-emitting device 200 of FIG. 8H having a main light-emitting direction facing upwardly. FIG. 11 shows a perspective view of the light-emitting device 200 of FIG. 10 mounted on a printed circuit board 199. As shown in FIGS. 8H, 9H, 10, and 11, there are nine light-emitting devices 200 formed on the second carrier 102 in a 3×3 array. Each light-emitting device 200 has side surfaces 203l, 203r, 203q, 203w and a bottom surface 205. Each light-emitting device 200 includes a third reflective layer 206, two conductive layers 204, a patterned seed layer 208, a wavelength conversion layer 112 and a light-emitting chip 114. The light-emitting chip 114 is used as a light body and includes two internal electrode layers 116 connected to the patterned seed layer 108. Each of the conductive layers 204 and the third reflective layer 206 has a surface and these surfaces are coplanar with each other and constitute the side surface 203*l* (203*r*). The conductive layer 204 has another side surface to constitute the side surface 203*q* (203*w*) and another side surface to constitute the bottom surface 205. Furthermore, the conductive layers 204 are served as the external electrode layers 207*r*, 207*l*.

As shown in FIG. 11, the external electrode layers 207*r*, 207*l* are mounded on the printed circuit board 199 through the solder 120. The solder 120 is used for providing an electrical connection between the light-emitting device 200 and the printed circuit board 199 and for mounting the light-emitting device 200 on the printed circuit board 199. The light-emitting device 200 has a main light-emitting direction parallel to a surface of the printed circuit board 199. Accordingly, the light-emitting device 200 acts as a side-view LED package.

As shown in FIG. 11, the solder 120 is used to electrically connect the light-emitting device 200 with the printed circuit board 199 and to mount the light-emitting device 200 on the printed circuit board 199 through the side surfaces 203*q*, 203*w* of the light-emitting device 200. In addition, the solder 120 can also be used to electrically connect the light-emitting device 200 with the printed circuit board 199 and to mount the light-emitting device 200 on the printed circuit board 199 through the side surfaces 203*r*, 203*l* of the light-emitting device 200. Compared to the side surfaces 203*r*, 203*l*, the side surfaces 203*q*, 203*w* has a larger area for improving the bond strength between the light-emitting device 200 and the printed circuit board 199 so the reliability of a backlight display module can be enhanced.

Figure 8H:
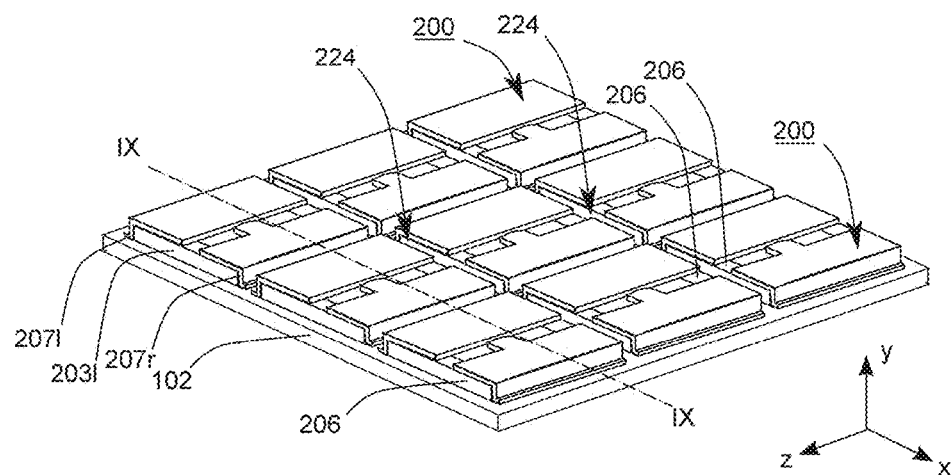
Figure 9H:
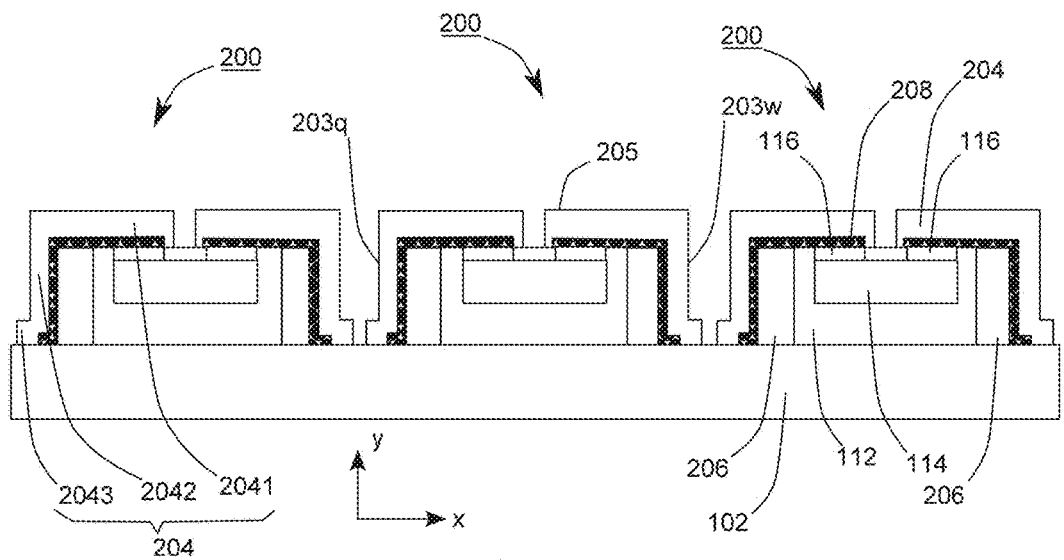
Figure 10:
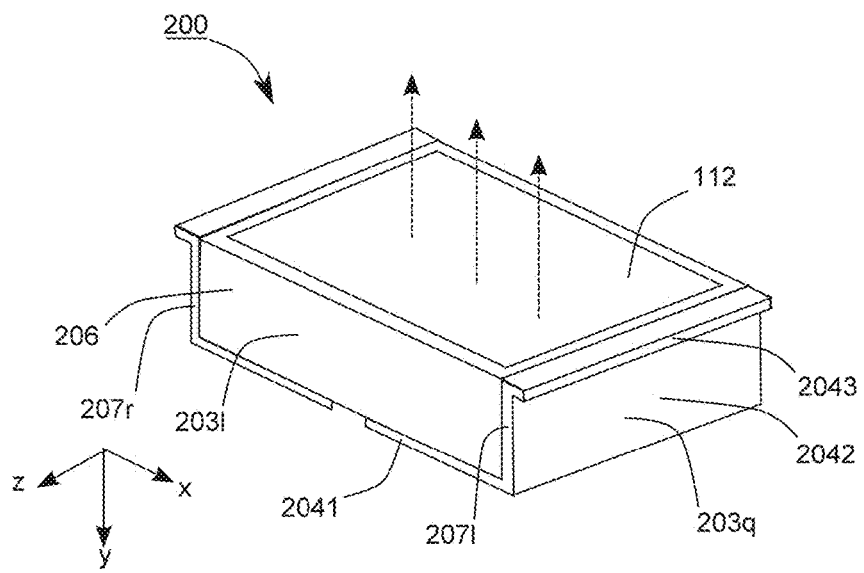
FIG. 10 shows a perspective view of a single light-emitting device of FIG. 8H having a main light-emitting direction facing upwardly.
Figure 11:
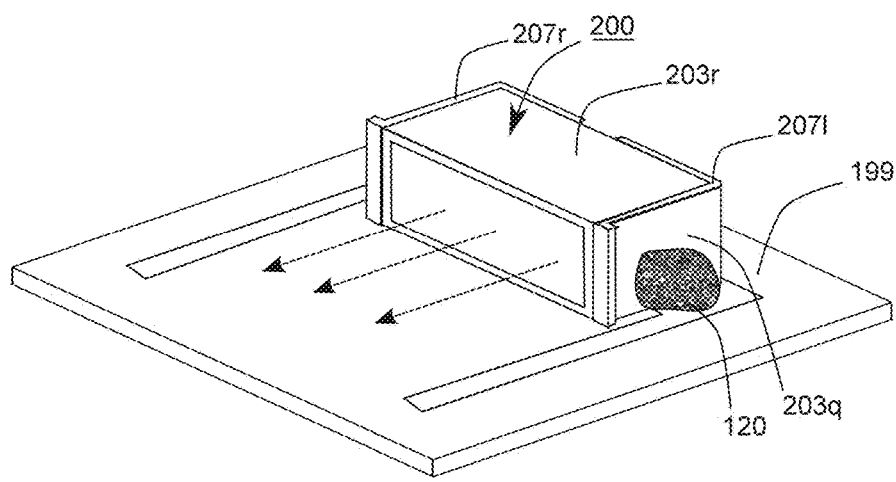
FIG. 11 shows a perspective view of the light-emitting device of FIG. 10 mounted on a printed circuit board.

As shown in FIGS. 8H, 9H and 10, the light-emitting chip 114 and the wavelength conversion layer 112 are considered as a light-emitting structure. The light-emitting chip 114 is enclosed by the wavelength conversion layer 112. The third reflective layer 206 is formed as a reflective frame surrounding the light-emitting chip 114 for allowing light emitted from the light-emitting device 100 toward a certain direction. Similarly, each of the conductive layers 204 has a first portion 2041 formed on the internal electrode layer 116 (or the light-emitting chip 114) and electrically connected to the internal electrode layer 116. Each of the conductive layers 204 has a second portion 2042 formed on a side of the light-emitting chip 114. The first portion 2041 is substantially perpendicular to the second portion 2042. The second portion 2042 is used as the external electrode layer 207*r* (207*l*) for electrically connecting to the solder 120. In other words, the first portion 2041 overlaps the light-emitting chip 114 in the first direction (y direction) and the second portion 2042 overlaps the light-emitting chip 114 in the second direction (x direction). The first direction is substantially perpendicular to the second direction. Each of the conductive layers 204 does not overlap the light-emitting chip 114 in the third direction (z direction). Each conductive layer 204 has a protrusion 2043 protruding away the light-emitting chip 114 to extend outward along the second direction (x direction).

Referring to FIG. 7, in step 12, the light-emitting chips 114 made by the semiconductor processes are arranged on a first carrier 124. The internal electrode layers 116 of the light-emitting chips 114 faces toward the first carrier 124. In step 14, a wavelength conversion layer 112 is formed on the light-emitting chips 114. The descriptions of steps 12 and 14 can be referred to the descriptions of making the light-emitting device 100 and FIGS. 2A, 3A, 2B, and 3B.

In step 42, a portion of the wavelength conversion layer 112 is physically grinded to reduce the thickness thereof and the wavelength conversion layer 112 has a substantially flat surface.

Referring to FIGS. 7, 8A, and 9A, in step 44, the structure of step 42 is reversed and attached to a second carrier 102. Then, the first carrier 124 is removed. The structure on the second carrier 102 can be considered as a light-emitting module 212 having a bottom surface 210 and a plurality of light-emitting chips 114. Each of the internal electrode layers 116 and the wavelength conversion layer 112 has a surface, and these surfaces are flush with each other and constitute the bottom surface 210.

Referring to FIGS. 7, 8B, and 9B, in step 46, a plurality of trenches 216 is formed, but not limited to, by a blade 214. Specifically, the blade 214 is provided to cut downward until reaching the second carrier 102 and moves along the x direction and the z direction to remove a portion of the wavelength conversion layer 112 for forming the trenches 216. The trenches 216 have a depth substantially equal to the height of the wavelength conversion layer 112.

Referring to FIGS. 7, 8C, and 9C, in step 48, a third reflective layer 206 is formed on the wavelength conversion layer 112. Formation of the third reflective layer 206 can be the same as that of the first reflective layer 104 and the second reflective layer 110, and the descriptions can be referred to corresponding paragraphs. The third reflective layer 206 fills the trenches 216 completely in FIGS. 8B and 9B.

Referring to FIGS. 7, 8D, and 9D, in step 50, the third reflective layer 206 is grinded to expose the internal electrode layers 116 and the wavelength conversion layer 112. The wavelength conversion layer 112 has a surface substantially flush with a surface of the third reflective layer 206.

Referring to FIGS. 7, 8E, and 9E, in step 52, a portion of the third reflective layer 206 is removed to form a plurality of trenches 218 extending along the z direction. Specifically, the blade 220 is provided to cut downward and moves along the z direction to remove a portion of the third reflective layer 206 for forming the trenches 218 to expose the sidewalls 206*r* of the third reflective layer 206.

Referring to FIGS. 7, 8F, and 9F, in step 53, a patterned seed layer 208 is formed. The patterned seed layer 208 covering the corresponding internal electrode layers 116 can have different patterns for identifying the polarity (p-electrode or n-electrode) thereof in the light-emitting chip 114. The patterned seed layer 208 can cover completely the two sidewalls 206*r* but not fill the trenches 218 completely. The patterned seed layer 208 is not formed between the two internal electrode layers 116 of one light-emitting chip 114. The patterned seed layer 208 cover the internal electrode layers 116 completely and has an area greater than that of the corresponding internal electrode layer 116.

In FIG. 9F, the patterned seed layer 208 is not continuously formed on the second carrier 102. In one embodiment, the patterned seed layer 208 located at the trenches 218 can be continuously formed on the second carrier 102 (see the conductive layer 304 of FIG. 14I). In other embodiments, to facilitate the electroplating, the patterned seed layer 208 includes a plurality of conductive portions with a width smaller than that formed on the internal electrode layer 116 formed on regions of the third reflective layer 206 to be cut in the subsequent process so the conductive portions are electrically connected to the patterned seed layer 208 formed on the internal electrode layers 116 and the trenches 218.

Referring to FIGS. 7, 8G, and 9G, in step 58, electroplating is performed on the patterned seed layer 208 to form conductive layers 204 thereon. The material of the conductive layer 204 can be referred to the conductive layers 106. Referring to FIGS. 7, 8H, and 9H, in step 60, the structure of FIG. 8G is cut to form a plurality of light-emitting devices 200. Specifically, the blade (not shown) is provided to cut downward and moves along the x direction for forming the trenches 224. Another blade can be used to move along the z direction for forming the trenches parallel to the z direction.

Subsequently, after attaching a blue tape to the conductive layers 204, the second carrier 102 is irradiated by UV radiation light to lower the adhesion therebetween for separating the light-emitting devices 200 from the second carrier 102. The conductive layers 204 provide a conductive path and a heat-dissipating path for the light-emitting chips 114 through the patterned seed layer 208.

Figure 26A:
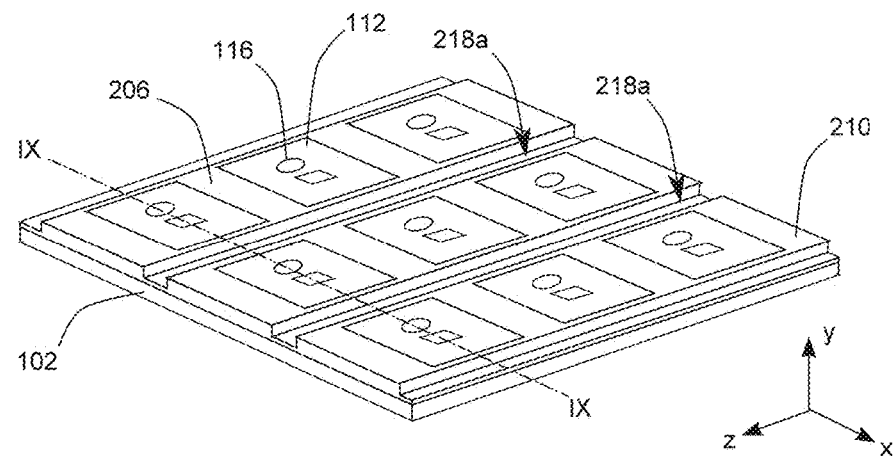
FIGS. 26A-26C show perspective views of partial steps of making a light-emitting device in accordance with an embodiment of the present disclosure.
Figure 27A:
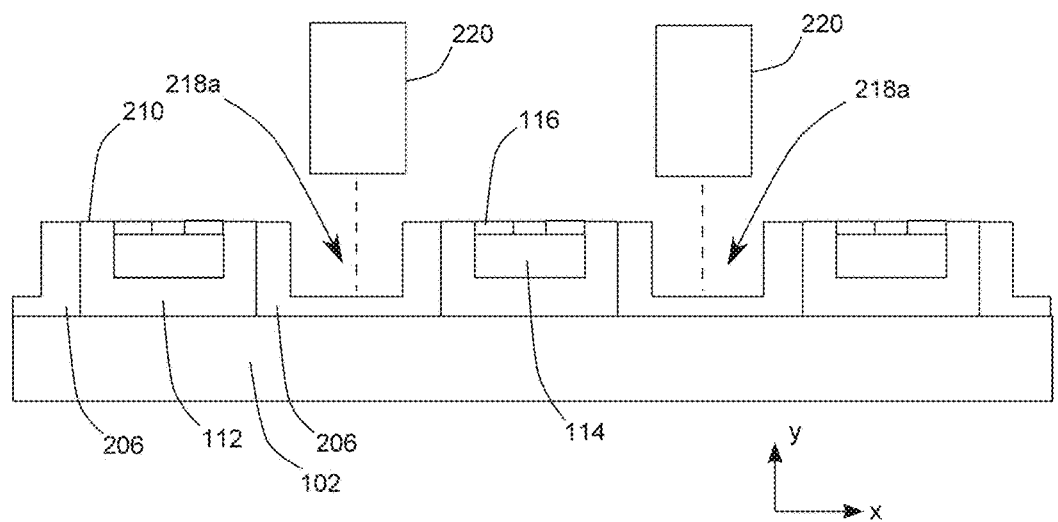
FIGS. 27A-27C show cross-sectional views taken along line IX-IX of FIGS. 26A-26C, respectively.

In FIGS. 8E and 9E, each trench 218 has a depth substantially equal to the height of the wavelength conversion layer 112, but not limited to this disclosure. FIG. 26A show a perspective view which is the result after performing step 52 in the flowchart 40. FIG. 27A show a cross-sectional view taken along line IX-IX of FIG. 26A. Specifically, a blade 220 is used to cut downward but not reaching the second carrier 102 and moves along the z direction to remove a portion of the third reflective layer 206 for forming the trenches 218a. The trenches 218a have a depth smaller than the height of the third reflective layer 206.

Figure 26B:
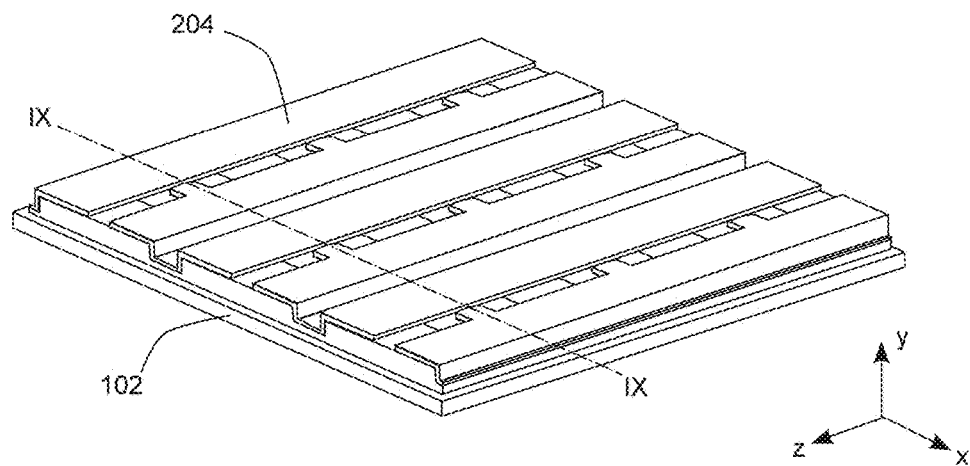
Figure 27B:
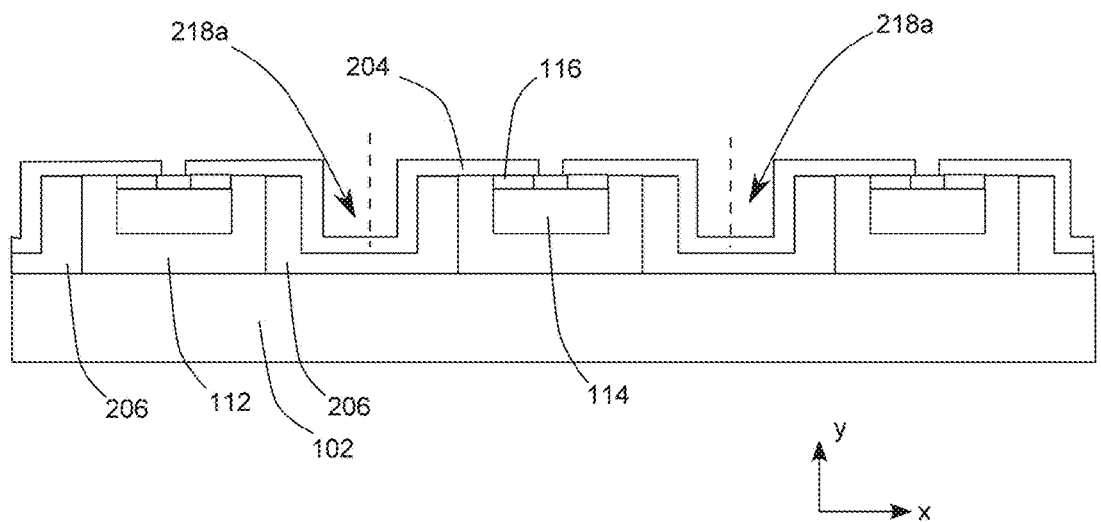

Next, as shown in the FIGS. 26B and 27B, steps 53 and 58 in FIG. 7 are performed to form the patterned seed layer (not shown) and the conductive layer 204.

Figure 26C:
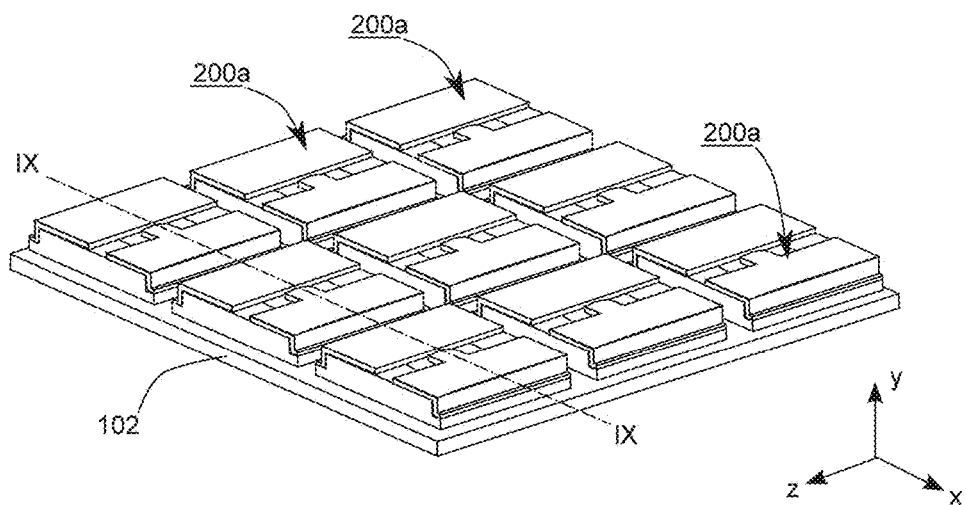
Figure 27C:
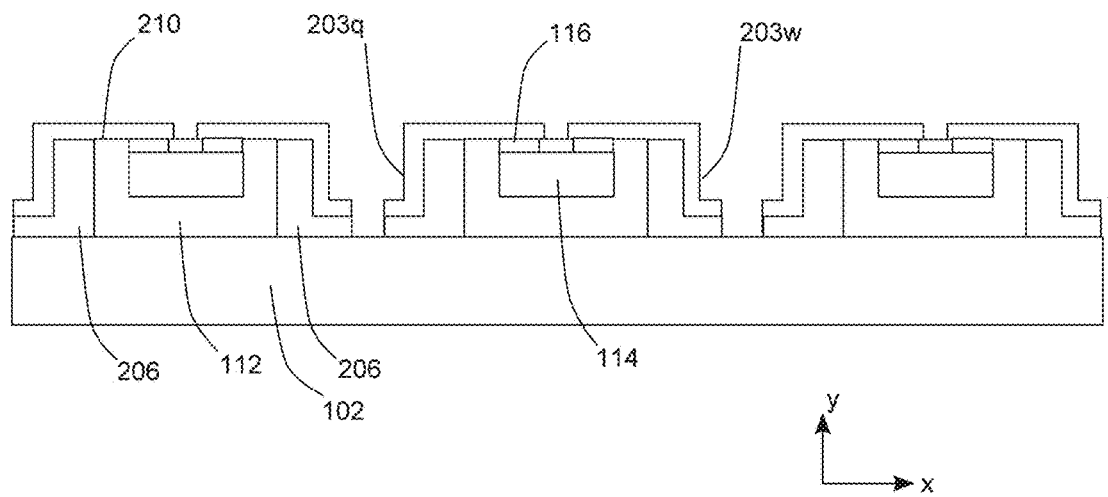

Finally, as shown in FIGS. 26C and 27C, step 60 in FIG. 7 is performed to form a plurality of light-emitting device 200a.

Figure 28:
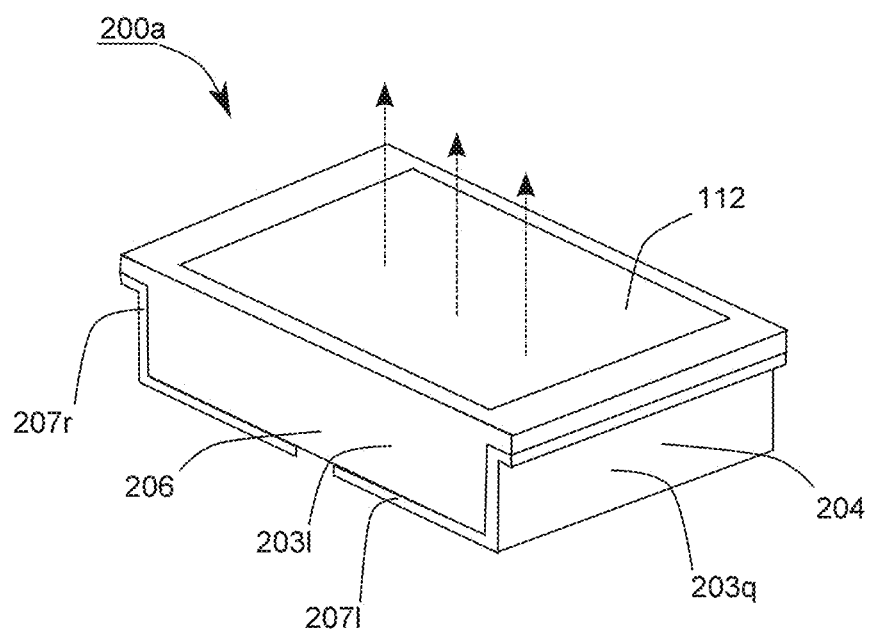
FIG. 28 shows a perspective view of a single light-emitting device of FIG. 26C having a main light-emitting direction facing upwardly.

FIG. 28 shows a perspective view of the light-emitting device 200a. Different from the light-emitting device 200 of FIG. 10, each of the conductive layer 204 and the third reflective layer 207 has a surface and these surfaces constitute the side surface 203q (203w).

Figure 12:
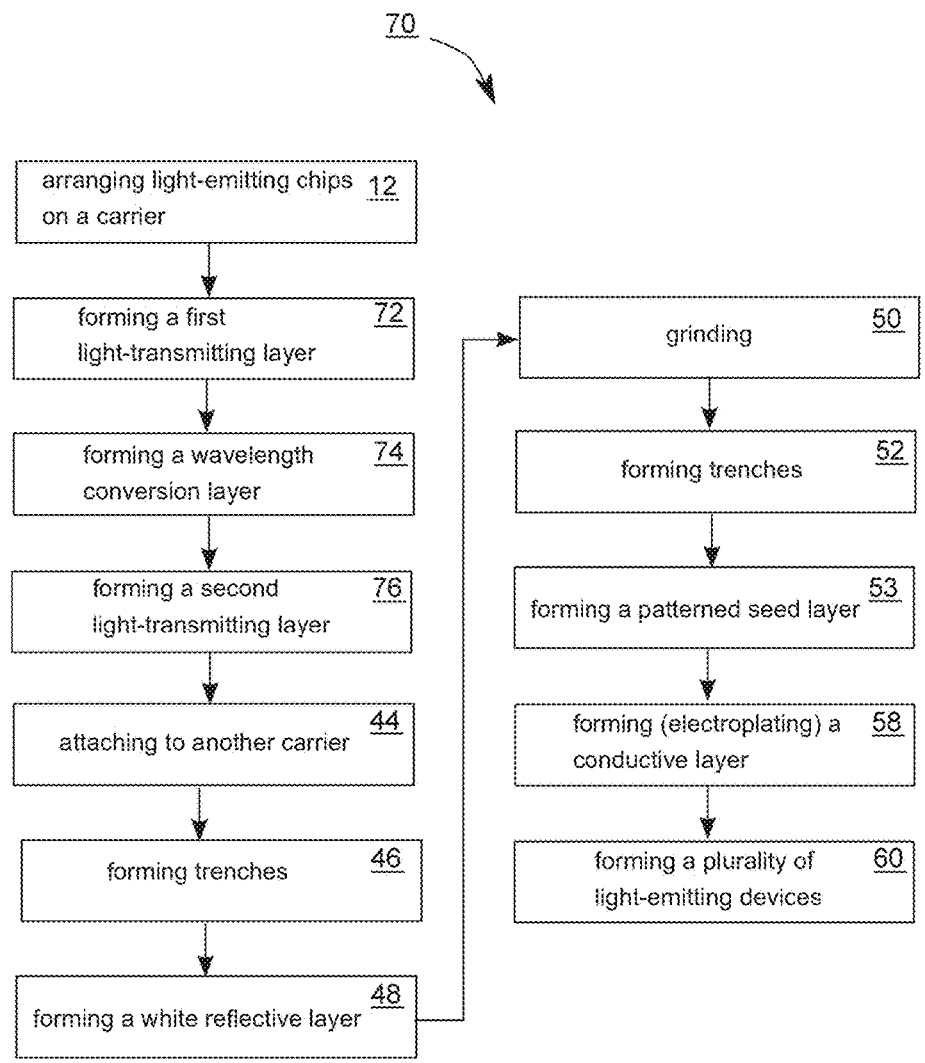
FIG. 12 shows a flowchart of making a light-emitting device in accordance with an embodiment of the present disclosure.
Figure 13A:
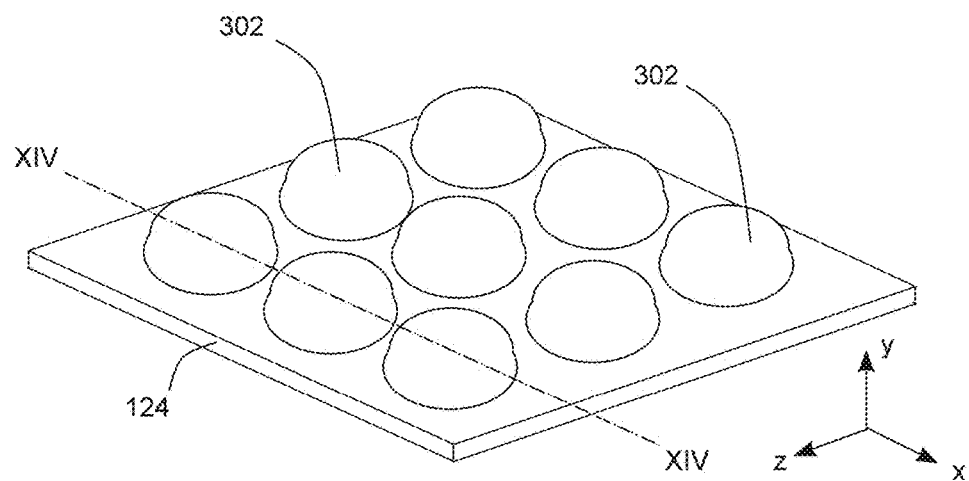
FIGS. 13A-13J show perspective views of steps embodied in FIG. 12.
Figure 14A:
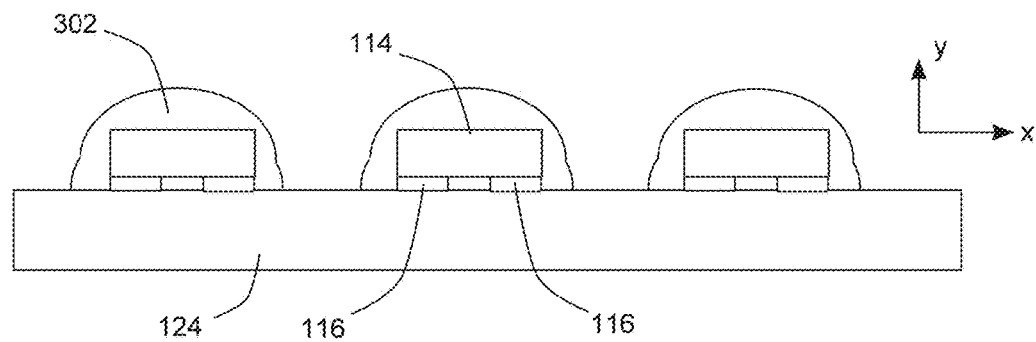
FIGS. 14A-14J show cross-sectional views taken along line XIV-XIV of FIGS. 13A-13J, respectively.
Figure 13B:
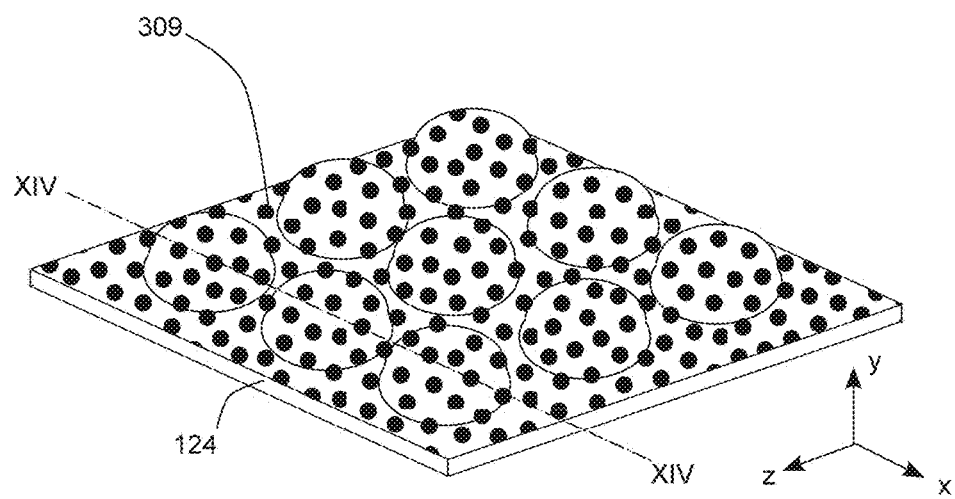
Figure 14B:
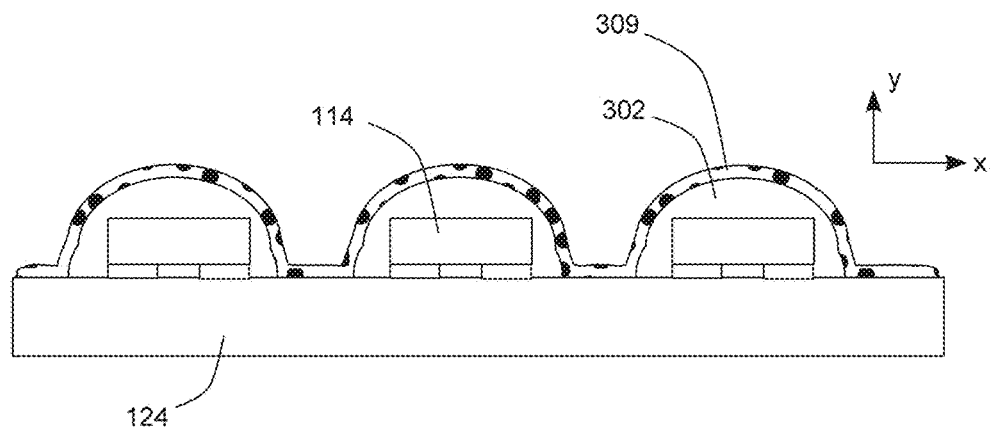
Figure 13C:
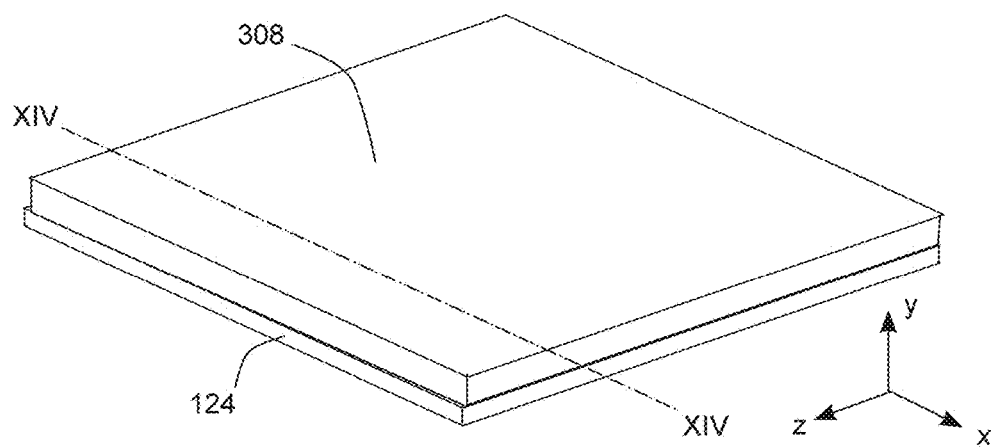
Figure 14C:
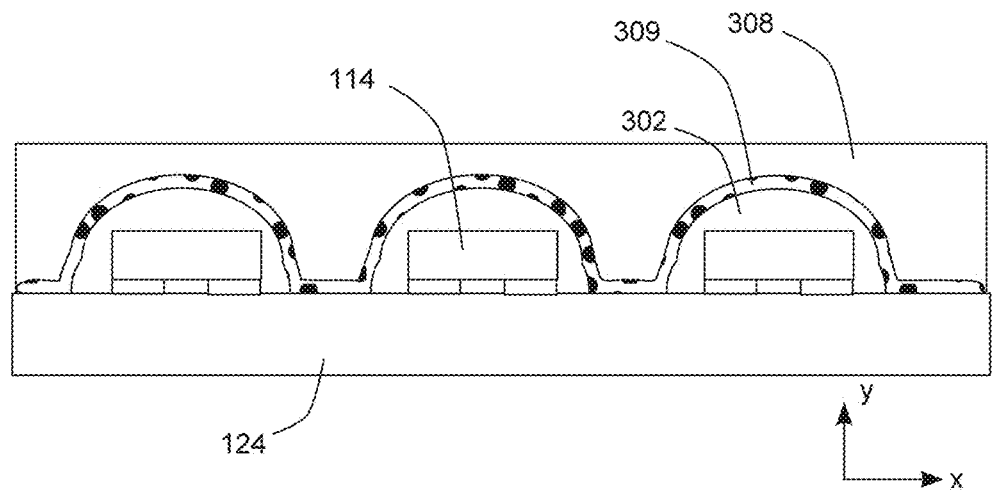
Figure 13D:
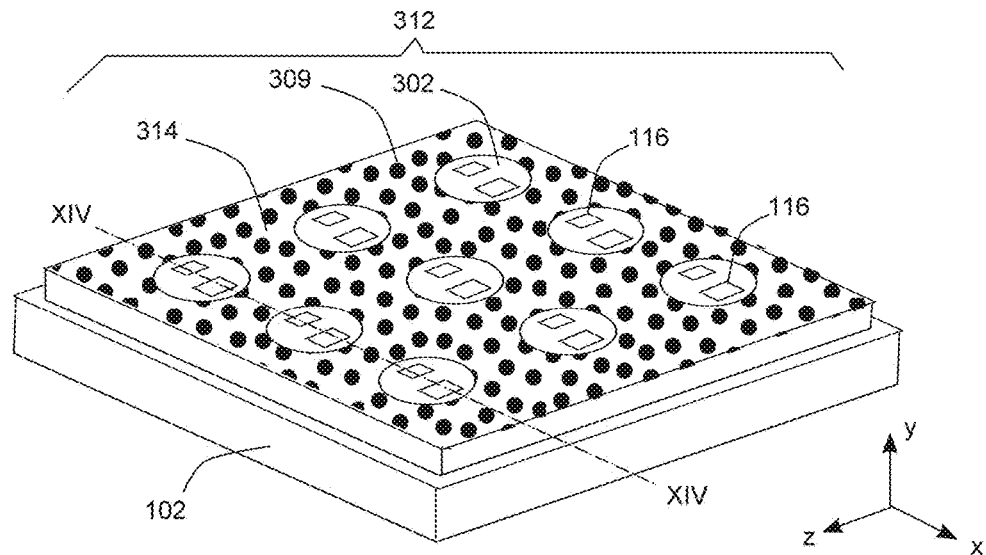
Figure 14D:
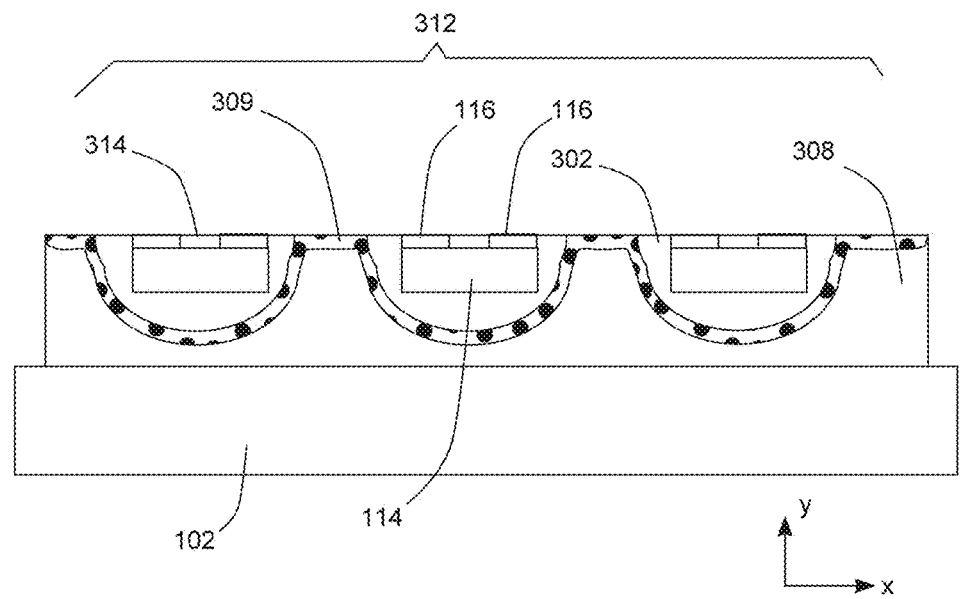
Figure 13E:
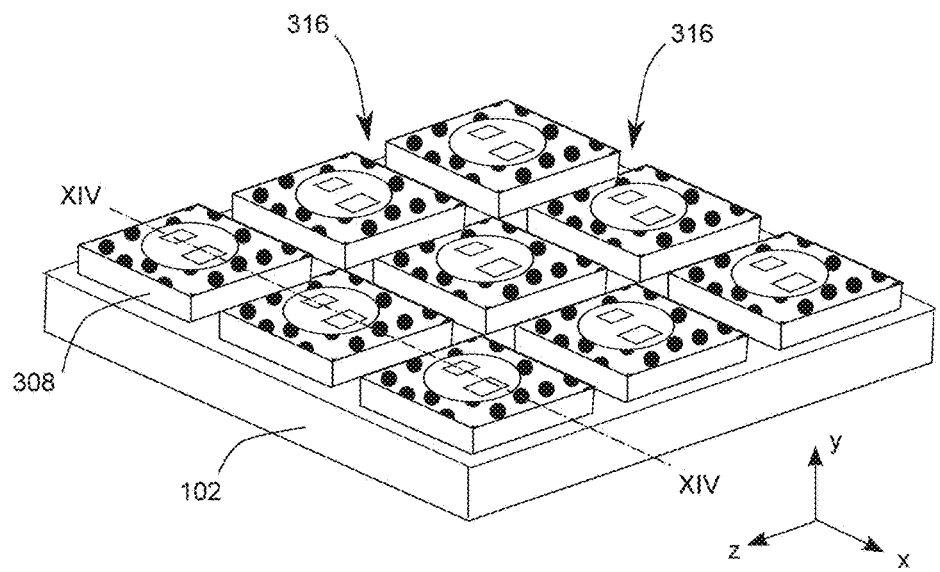
Figure 14E:
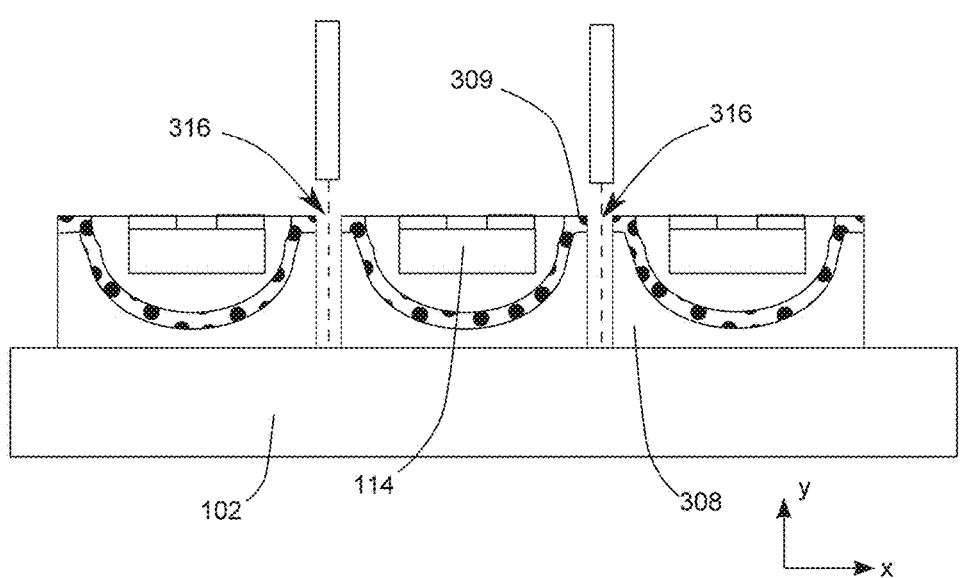
Figure 13F:
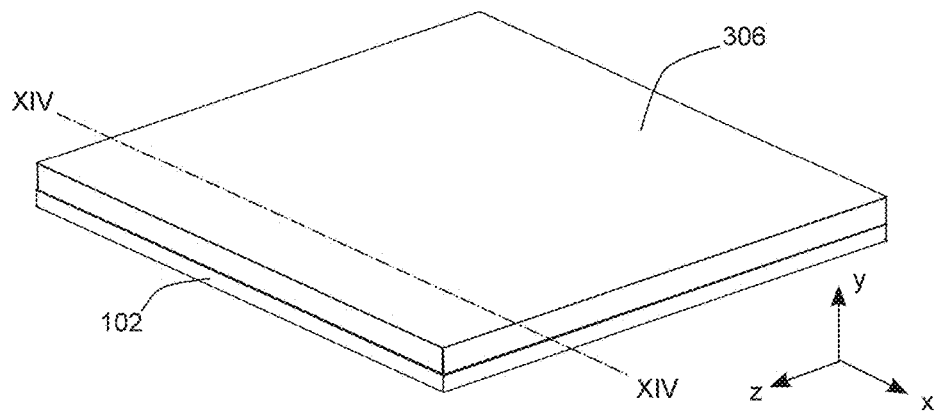
Figure 14F:
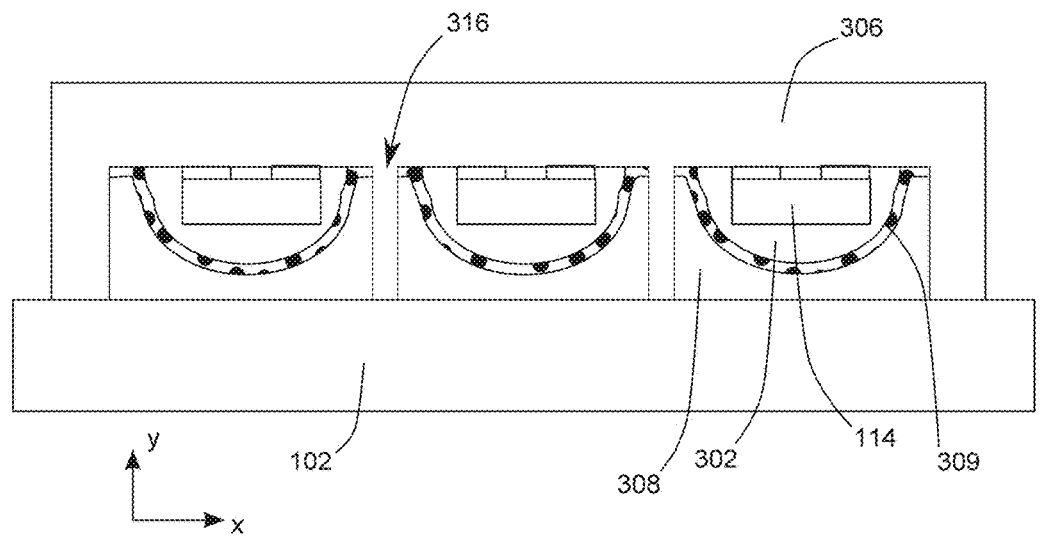
Figure 13G:
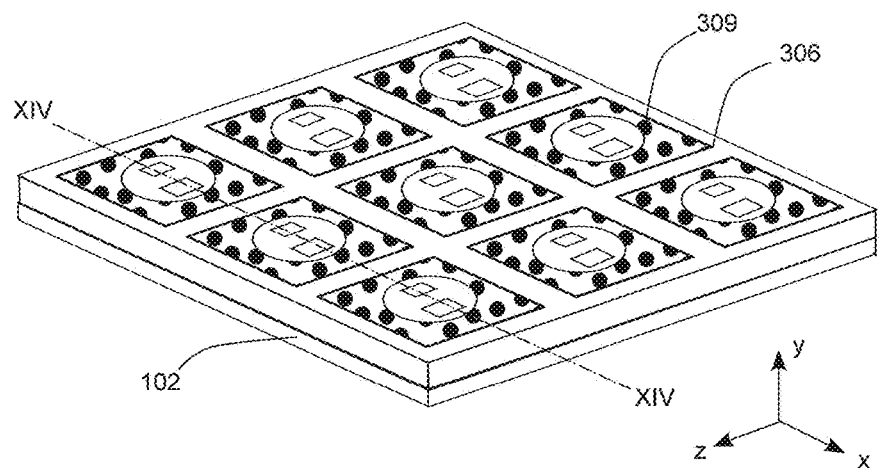
Figure 14G:
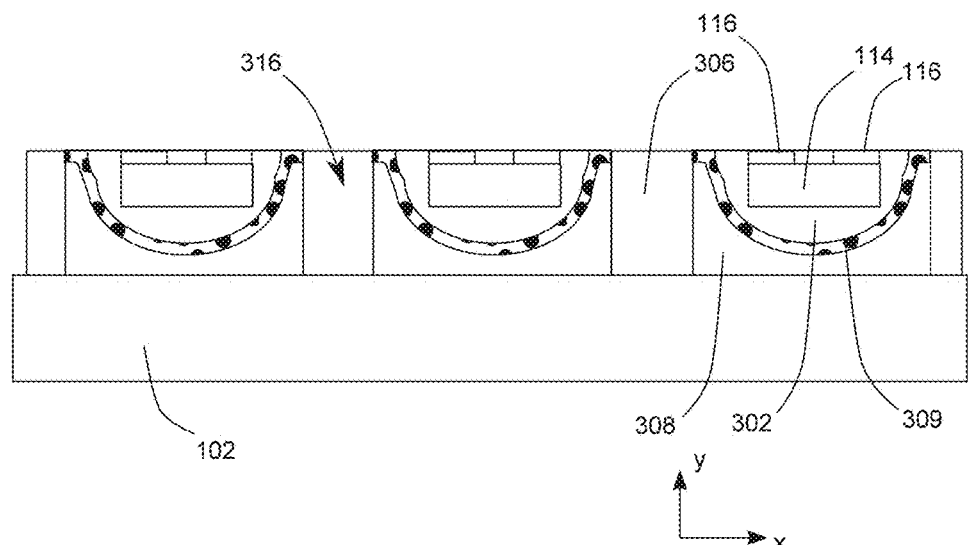
Figure 13H:
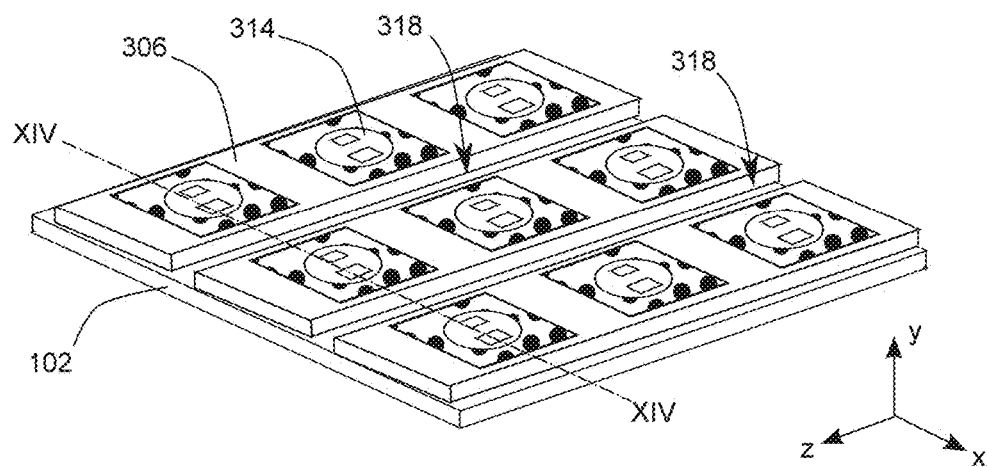
Figure 14H:
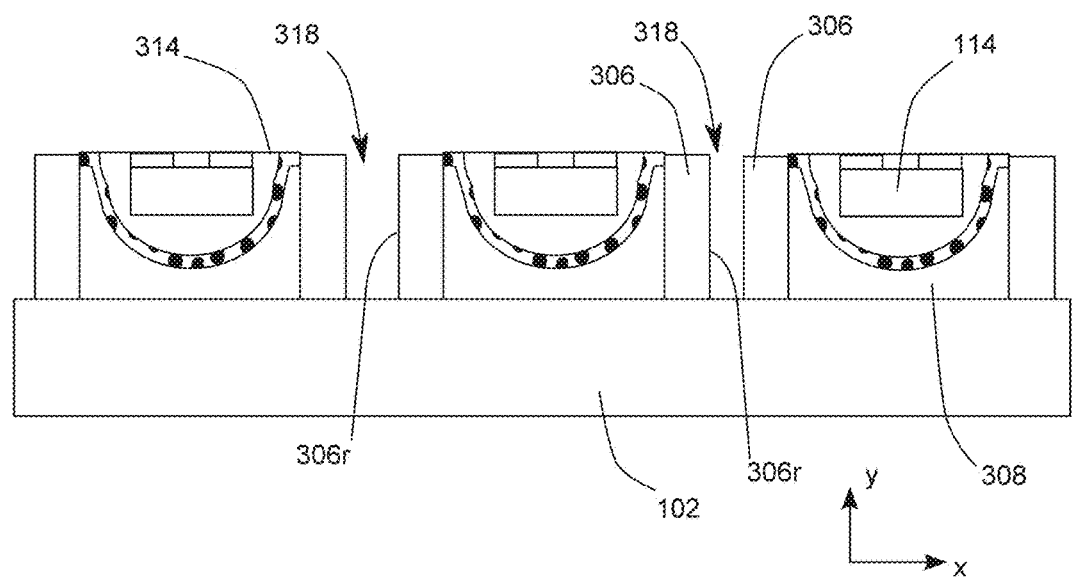
Figure 13I:
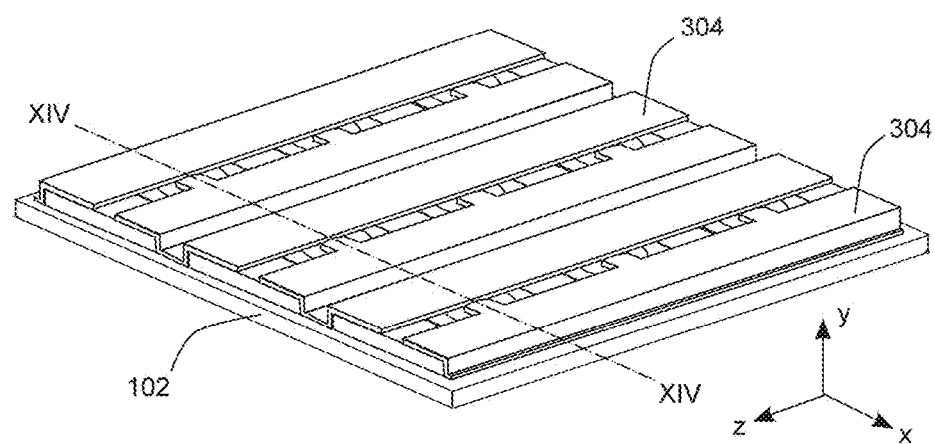
Figure 14I:
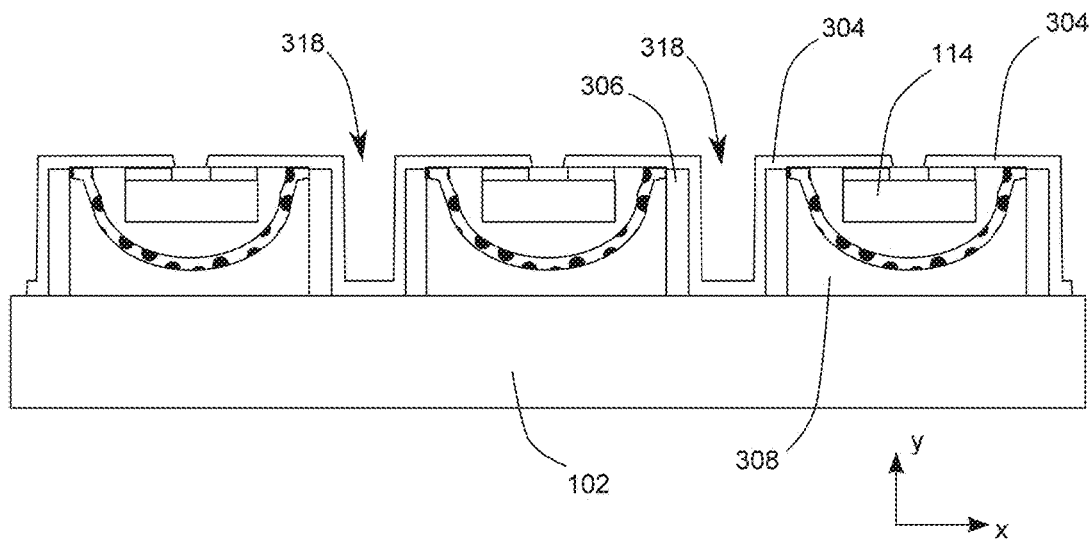
Figure 15:
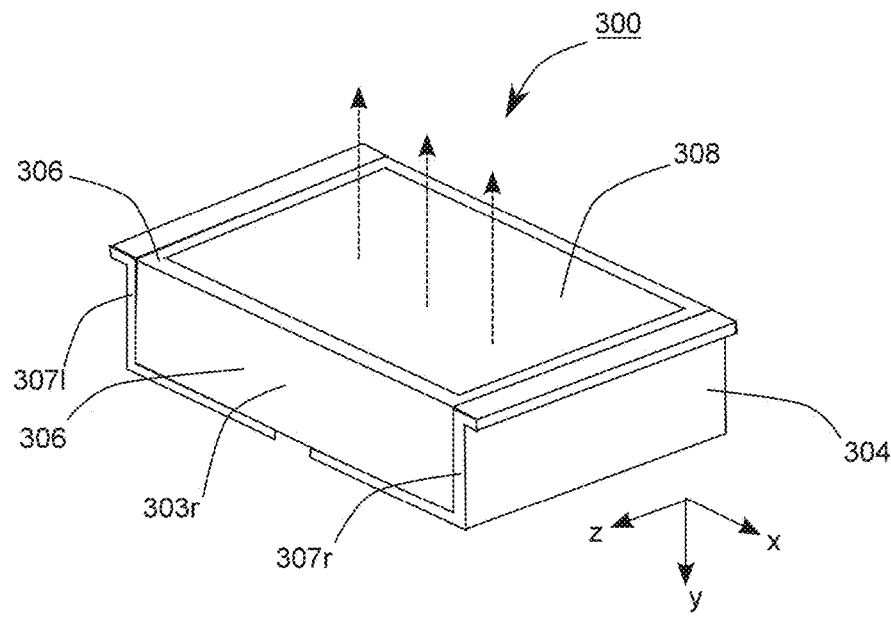
FIG. 15 shows a perspective view of a single light-emitting device of FIG. 13J having a main light-emitting direction facing upwardly.
Figure 16:
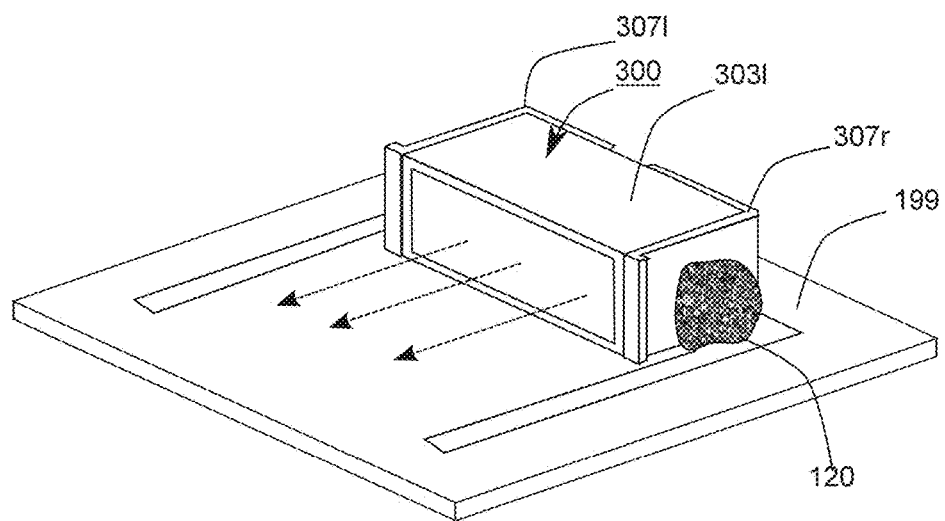
FIG. 16 shows a perspective view of the light-emitting device of FIG. 15 mounted on a printed circuit board.

FIG. 12 shows a flowchart 70 of making a light-emitting device 300 in accordance with an embodiment of the present disclosure. FIGS. 13A-13J show perspective views of steps embodied in FIG. 12. FIGS. 14A-14J show cross-sectional views taken along line XIV-XIV of FIGS. 13A-13J, respectively. FIG. 15 shows a perspective view of a single light-emitting device 300 of FIG. 13J having a main light-emitting direction facing upwardly. FIG. 16 shows a perspective view of the light-emitting device 300 of FIG. 15 mounted on a printed circuit board 199.

As shown in FIGS. 13J, 14J, 15, and 16, there are nine light-emitting devices 300 formed on the second carrier 102 in a 3×3 array. Each light-emitting device 300 has two opposite side surfaces 303l, 303r and a bottom surface 305. Each light-emitting device 300 includes a fourth reflective layer 306, a patterned seed layer (not shown), two conductive layers 304, a first light-transmitting layer 302, a wavelength conversion layer 309, a second light-transmitting layer 308 and a light-emitting chip 114. The light-emitting chip 114 is used as a light body and includes two internal electrode layers 116 connected to the conductive layers 304. Each of the conductive layers 304, the patterned seed layer, and the fourth reflective layer 306 has a surface and these surfaces are coplanar with each other and constitute the side surface 303r (303l). The conductive layers 304 are served as the external electrode layers 307r, 307l.

As shown in FIG. 16, the external electrode layers 307r, 307l, can be electrically connected to the printed circuit hoard 199 through solder 120. The solder 120 is used for providing an electrical connection between the light-emitting device 300 and the printed circuit board 199 and for mounting the light-emitting device 300 on the printed circuit board 199. The light-emitting device 300 has a main light-emitting direction parallel to a surface of the printed circuit board 199. Accordingly, the light-emitting device 300 acts as a side-view LED package.

Figure 13J:
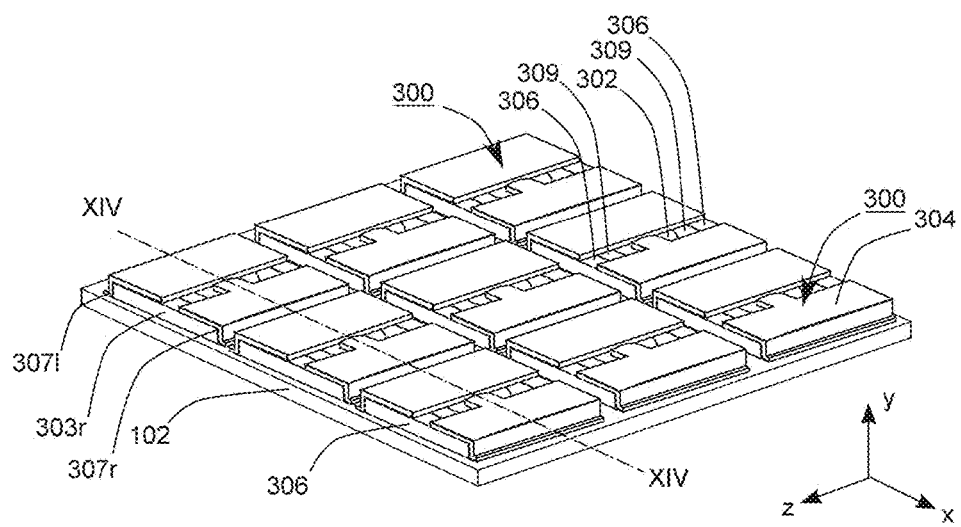
Figure 14J:
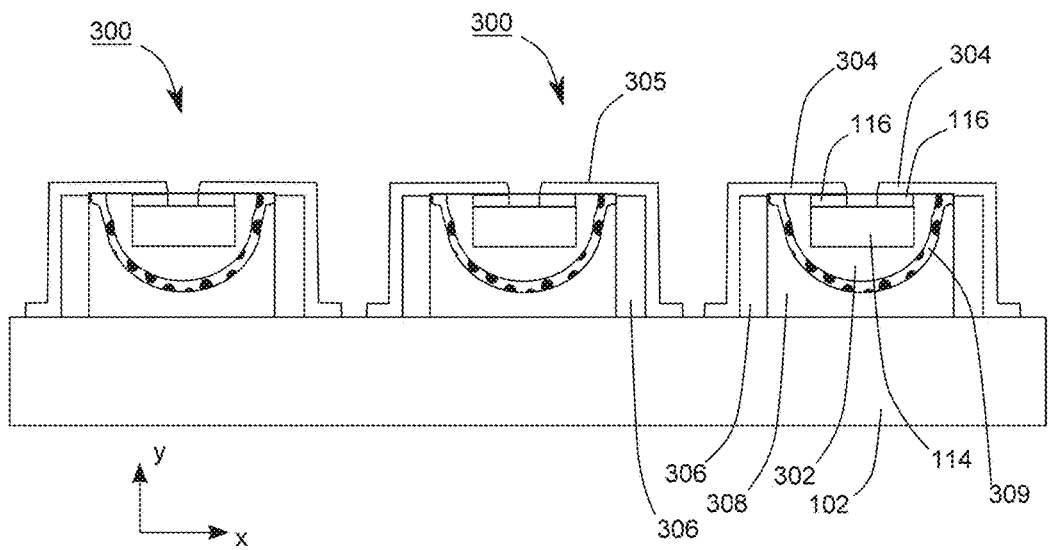

In FIGS. 13J and 14J, the light-emitting chip 114, the first light-transmitting layer 302, the wavelength conversion layer 309, and the second light-transmitting layer 308 are considered as a light-emitting structure. The light-emitting chip 114 is enclosed by the wavelength conversion layer 309. The fourth reflective layer 306 is formed as a reflective frame to surround the light-emitting chip 114 for allowing light emitted from the light-emitting device 300 toward a certain direction.

Referring to FIG. 12, in step 12, the light-emitting chips 114 made by the semiconductor processes are arranged on a first carrier 124. The internal electrode layers 116 of the light-emitting chips 114 face toward the first carrier 124. The descriptions of step 12 can be referred to the descriptions of making the light-emitting device 100 and FIGS. 2A, and 3A.

Referring to FIGS. 12, 13A and 14A, in step 72, a first light-transmitting layer 302 is formed on the first carrier 124 to enclose the light-emitting chips 114. Gel is dropped on each light-emitting chip 114 by dispensing and then is cured to form a light-transmitting body with a semi-circle shape for the first light-transmitting layer 302. The first light-transmitting layer 302 is made of a material comprising epoxy, silicone, PI, BCB, PFCB, Su8, acrylic resin, PMMA, PET, PC or polyetherimide. The first light-transmitting layer 302 can be transparent.

Referring to FIGS. 12, 13B and 14B, in step 74, a wavelength conversion layer 309 is formed on the first light-transmitting layer 302. The description of the wavelength conversion layer 309 can be referred to the wavelength conversion layer 112.

Referring to FIGS. 12, 13C and 14C, in step 76, a second light-transmitting layer 308 is formed on the wavelength conversion layer 309. The second light-transmitting layer 308 is made of a material the same as or different from the first light-transmitting layer 302. In addition, the second light-transmitting layer 308 can be formed on the wavelength conversion layer 309 by molding. In other embodiment, a transparent plate is attached to the wavelength conversion layer 309 and a portion of the transparent plate is grinding to reduce the thickness thereof for forming the second light-transmitting layer 308.

In FIG. 12, the descriptions of the subsequent steps 44, 46, 48, 50, 52, 53, 58 and 60 after step 76 can be referred to FIG. 7 and the corresponding paragraphs.

Referring to FIGS. 12, 13D and 14D, in step 44, the structure of step 76 is reversed and attached to a second carrier 102. Then, the first carrier 124 is removed. The structure on the second carrier 102 can be considered as a light-emitting module 312 having a bottom surface 314 and a plurality of light-emitting chips 114. Each of the internal electrode layers 116, the first light-transmitting layer 302 and the wavelength conversion layer 309 has a surface, and these surfaces constitute the bottom surface 314.

Referring to FIGS. 12, 13E, and 14E, in step 46, a plurality of trenches 316 is formed. The blade is provided to moves along the x direction and the z direction to remove a portion of the second light-transmitting layer 308 and the wavelength conversion layer 309 for forming the trenches 316.

Referring to FIGS. 12, 13F, and 14F, in step 48, a fourth reflective layer 306 is formed on the wavelength conversion layer 309. The fourth reflective layer 206 can be a preformed sheet made of silicone and reflective particles, and adheres to the second carrier 102. The fourth reflective layer 306 fills the trenches 316 completely in FIGS. 13E and 14E.

Referring to FIGS. 12, 13G and 14G, in step 50, the fourth reflective layer 306 is grinded to expose the internal electrode layers 116.

Referring to FIGS. 12, 13H, and 14H, in step 52, a portion of the fourth reflective layer 306 is removed to form a plurality of trenches 318 extending along the z direction. Specifically, the blade is provided to move along the z direction to remove a portion of the fourth reflective layer 306 for forming the trenches 318 to expose the sidewalls 306r of the fourth reflective layer 306.

Referring to FIGS. 12, 13I, and 14I, in step 53, a patterned seed layer (nots shown) is formed. In step 58, an electroplating is performed on the patterned seed layer to form conductive layers 304 thereon. The conductive layers 304 covering the corresponding internal electrode layers 116 can have different patterns for identifying the polarity (p-electrode or n-electrode) thereof in the light-emitting chip 114. The conductive layers 304 can cover the sidewall 306r completely but not fill the trenches 318 completely. The conductive layer 304 is made of a material referred to the conductive layer 106.

In FIGS. 12, 13J, and 14J, in step 60, the structure of FIG. 13I is cut to form a plurality of light-emitting devices 300.

Subsequently, after attaching a blue tape to the conductive layers 304, the second carrier 102 is irradiated by UV radiation light to lower the adhesion therebetween for separating the light-emitting devices 300 from the second carrier 102. The conductive layers 304 provide a conductive path and a heat-dissipating path for the light-emitting chips 114.

Figure 17:
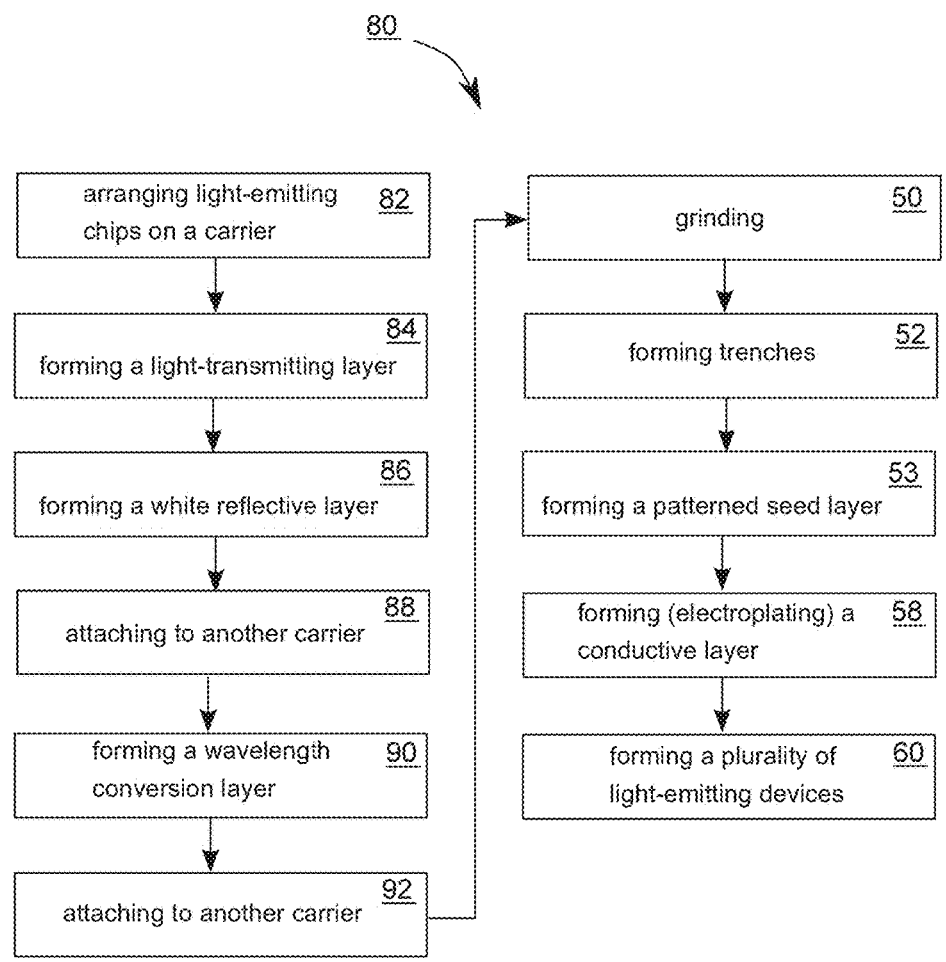
FIG. 17 shows a flowchart of making a light-emitting device in accordance with an embodiment of the present disclosure.
Figure 18A:
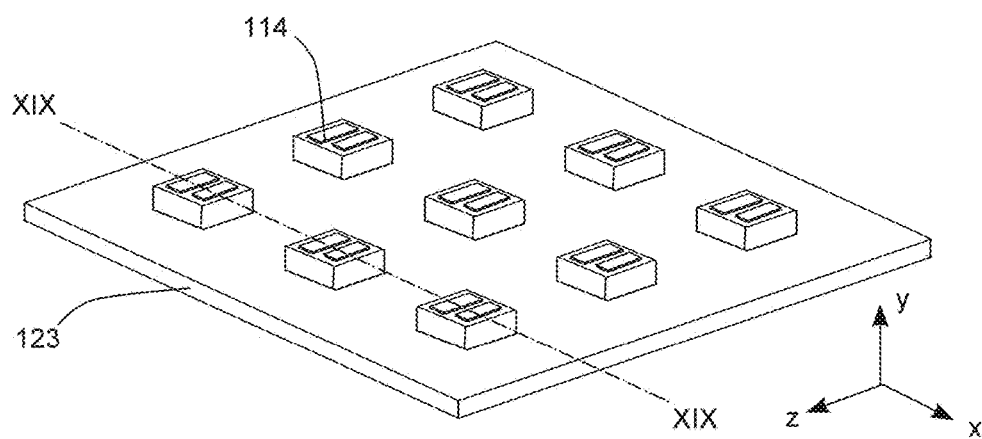
FIGS. 18A-18J show perspective views of steps embodied is FIG. 17.
Figure 19A:
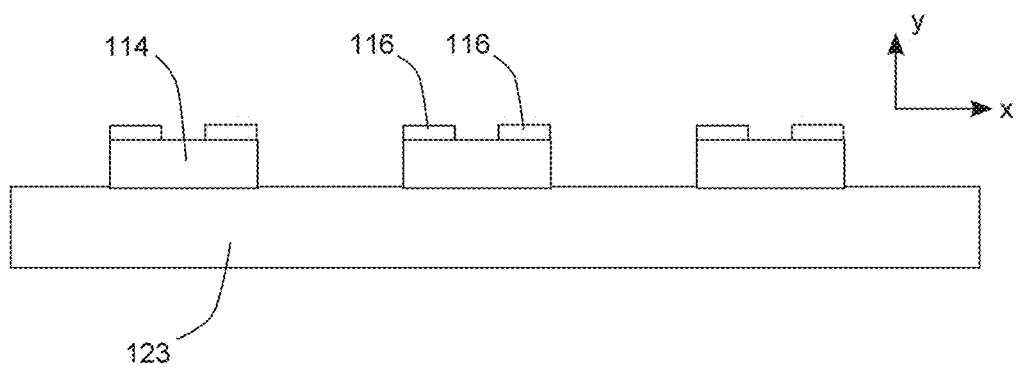
FIGS. 19A-19J show cross-sectional views taken along line XIX-XIX of FIGS. 18A-18J, respectively.
Figure 18B:
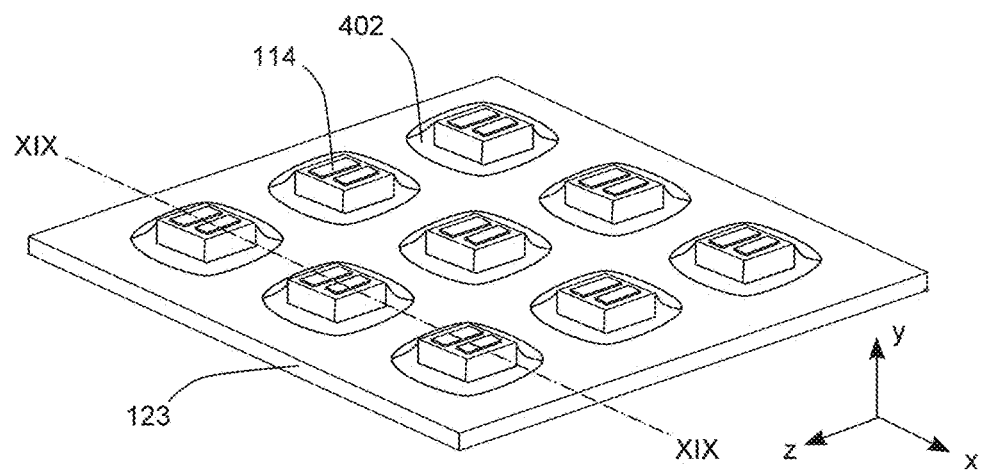
Figure 19B:
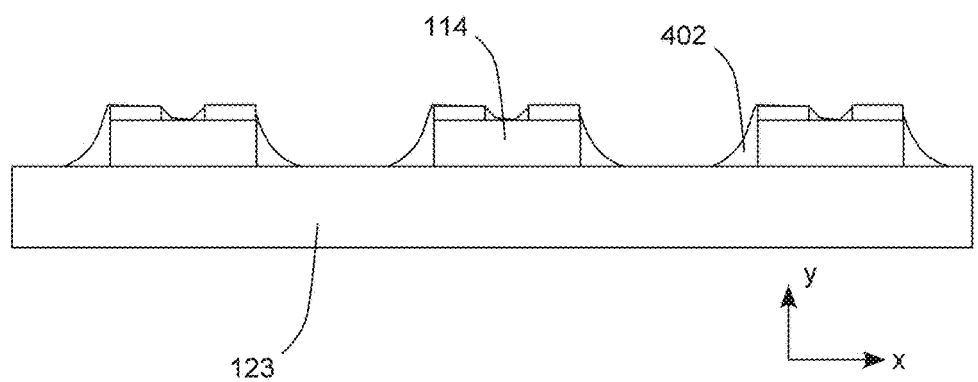
Figure 18C:
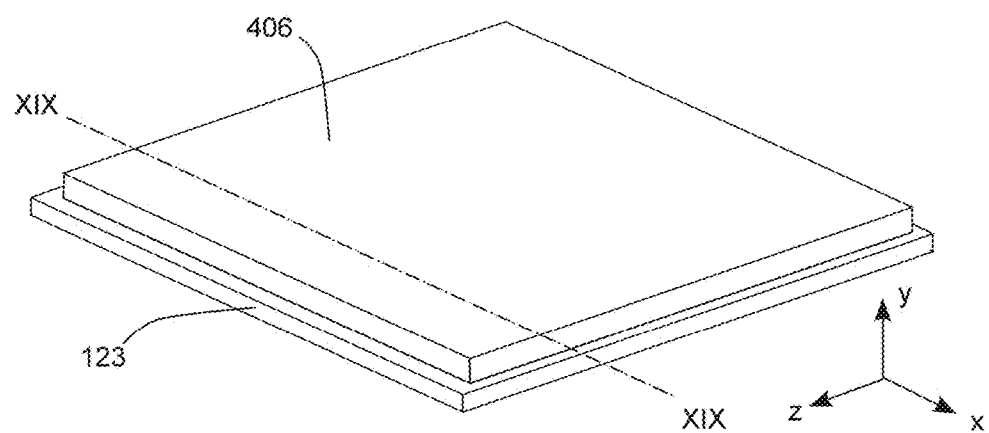
Figure 19C:
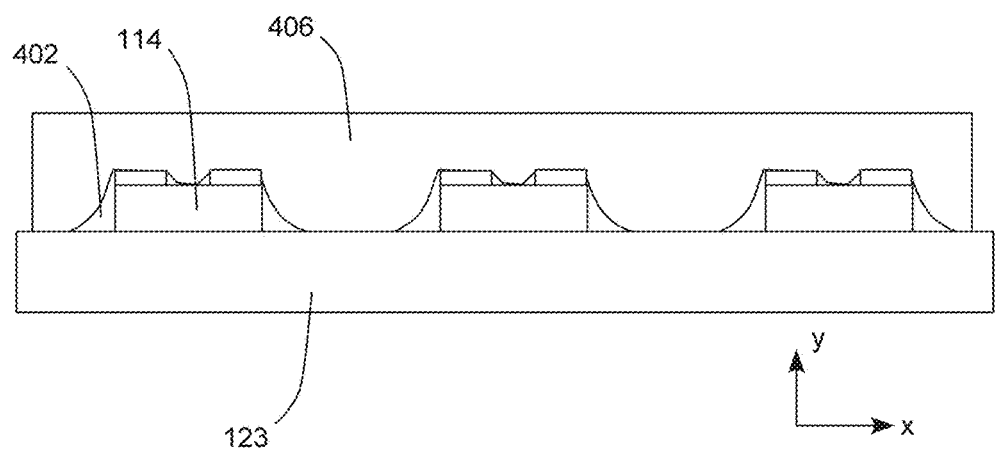
Figure 18D:
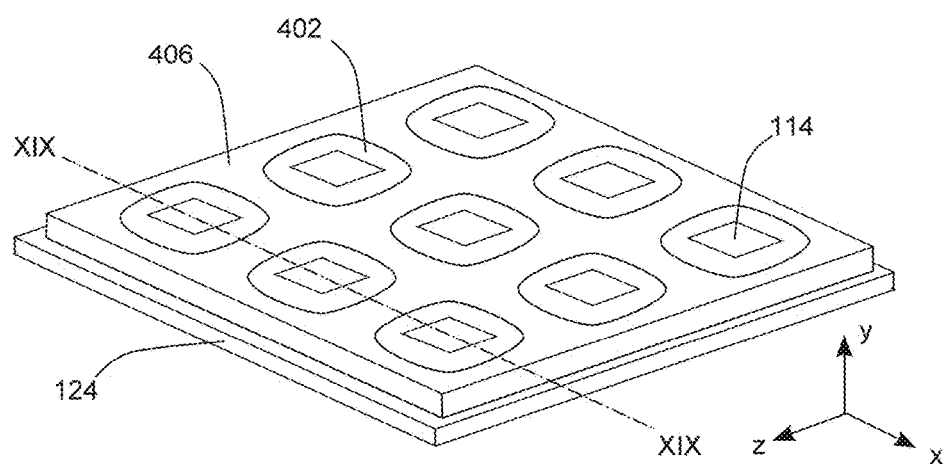
Figure 19D:
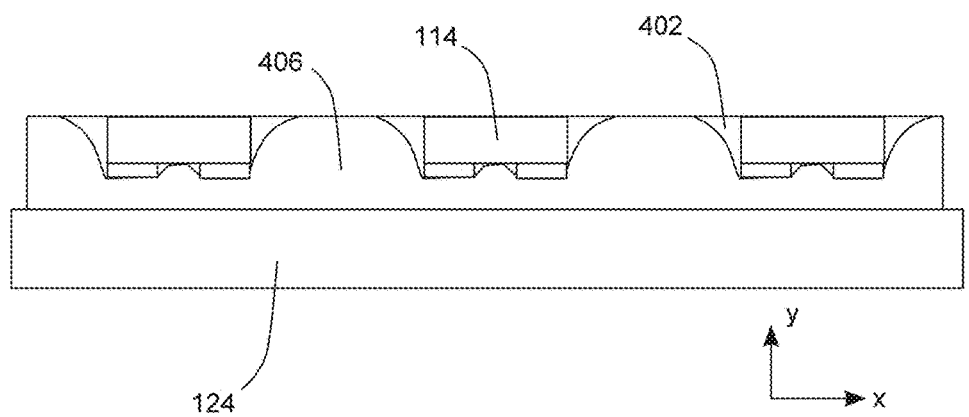
Figure 18E:
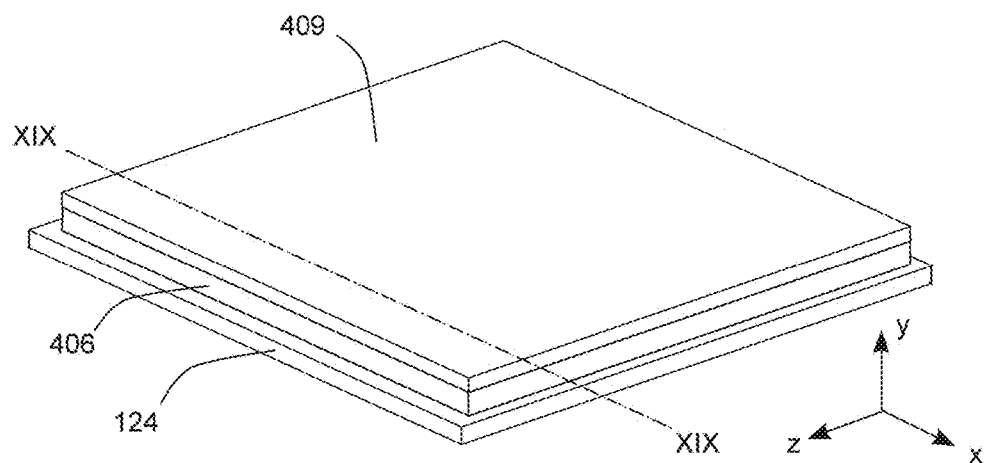
Figure 19E:
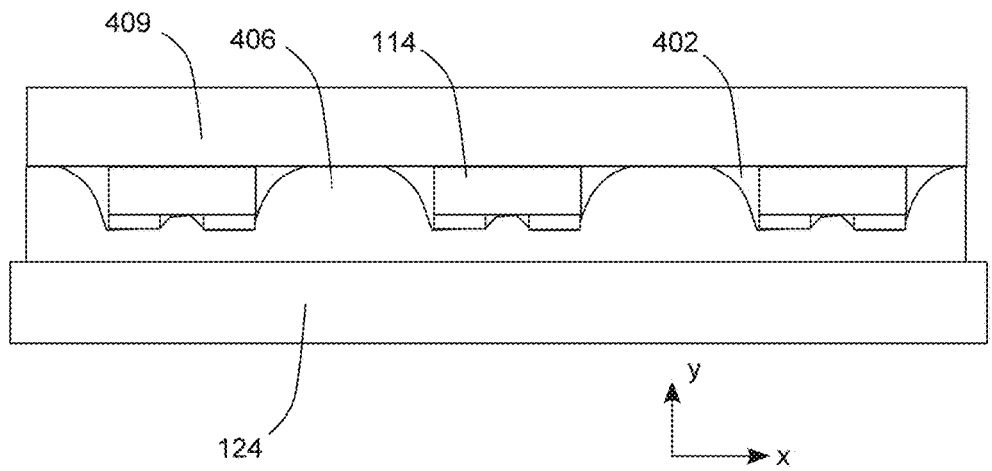
Figure 18F:
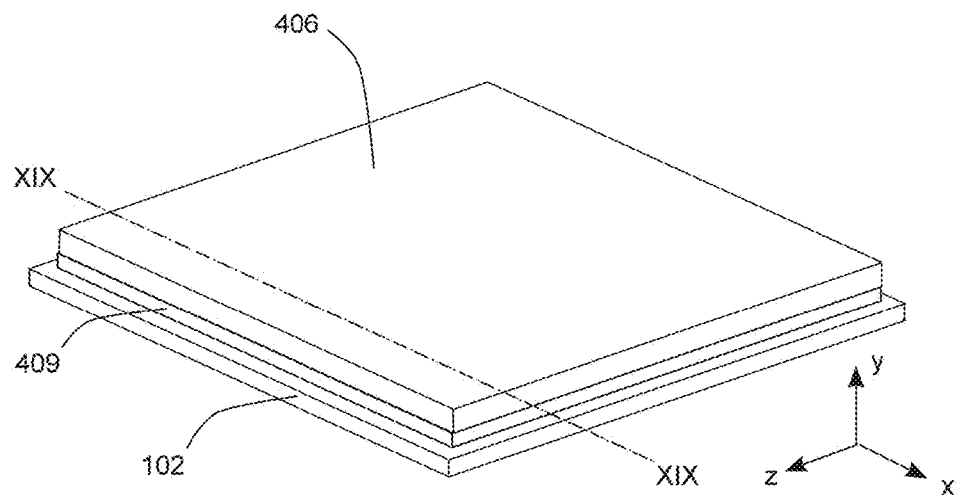
Figure 19F:
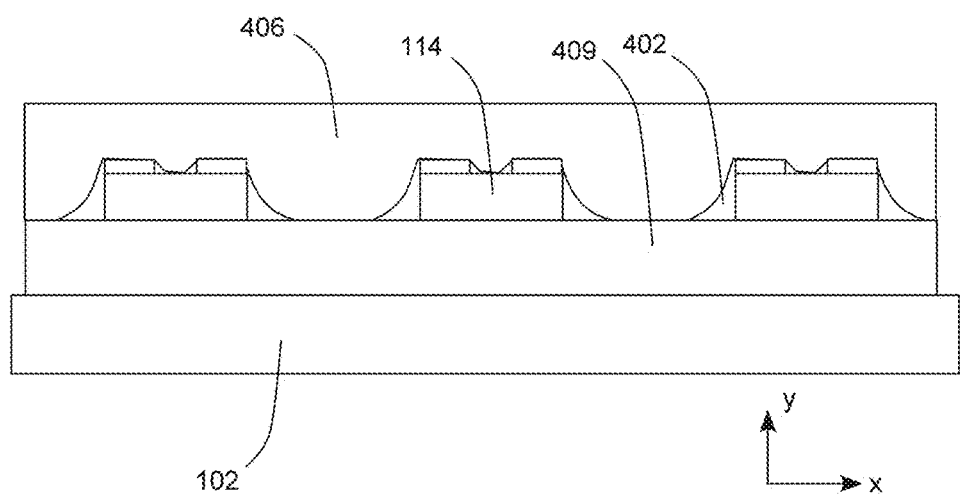
Figure 18G:
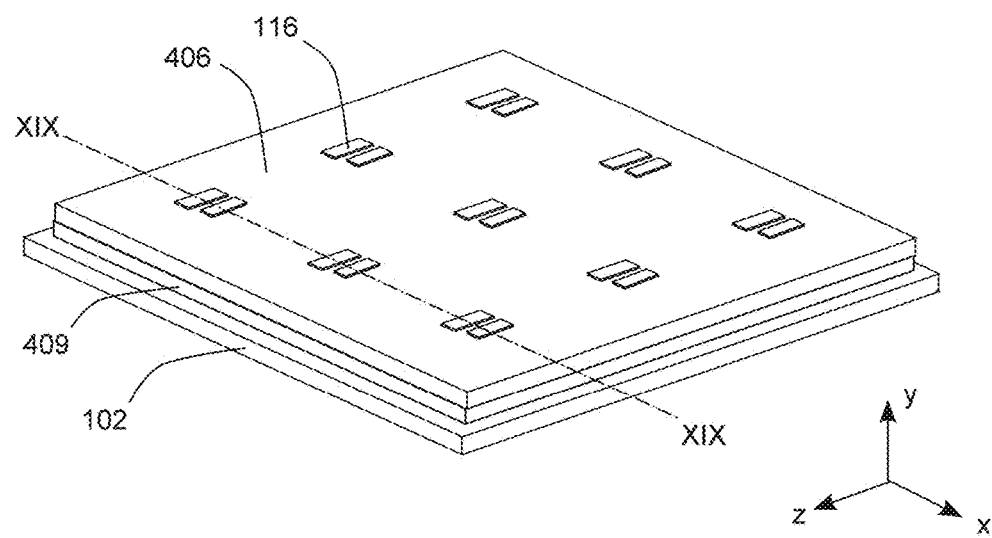
Figure 19G:
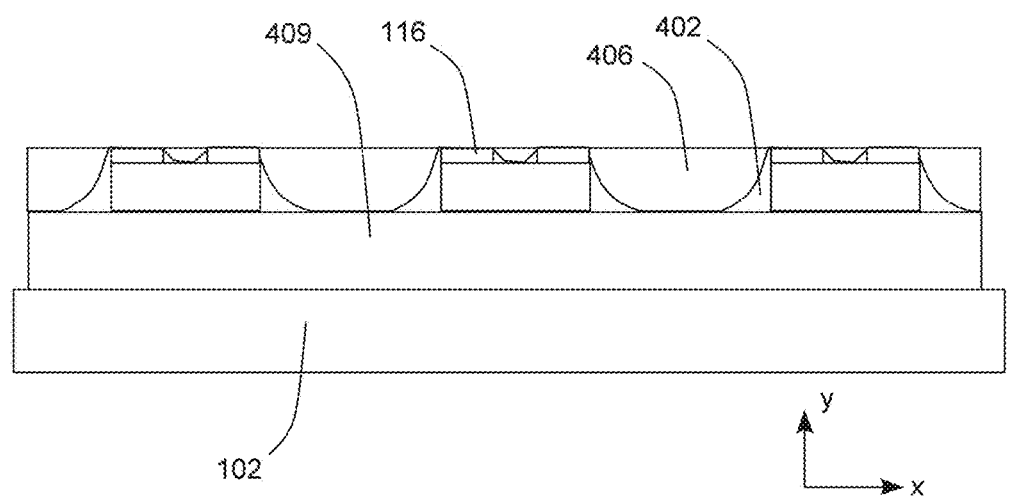
Figure 18H:
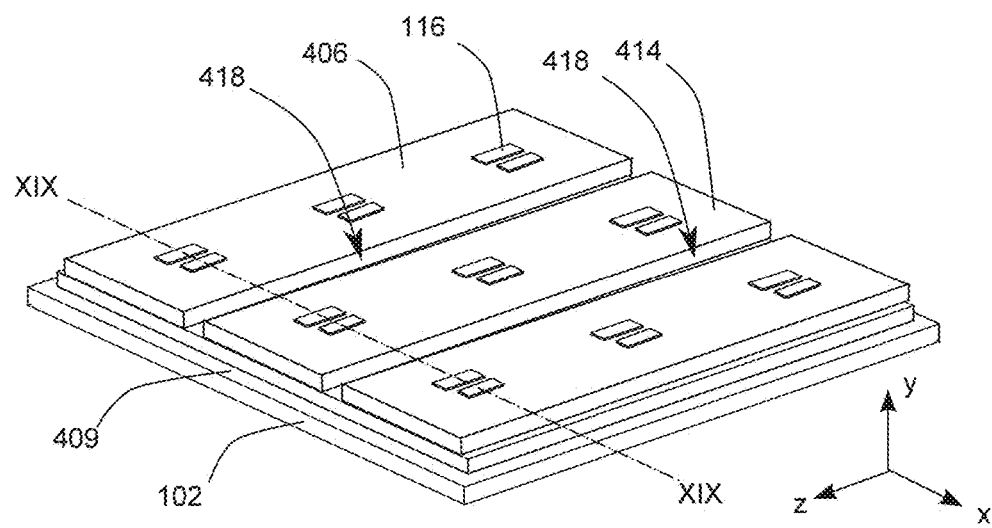
Figure 19H:
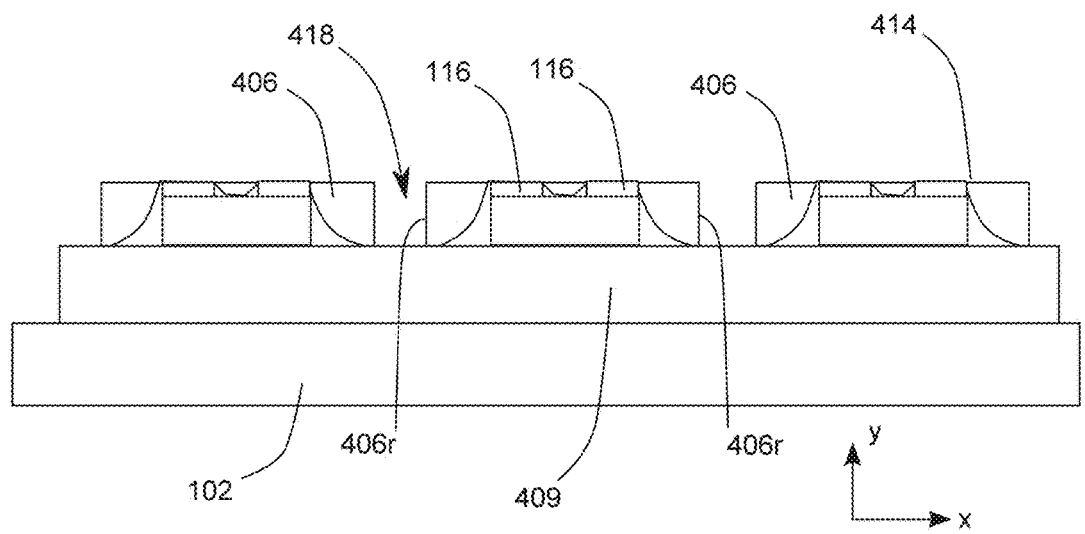
Figure 18I:
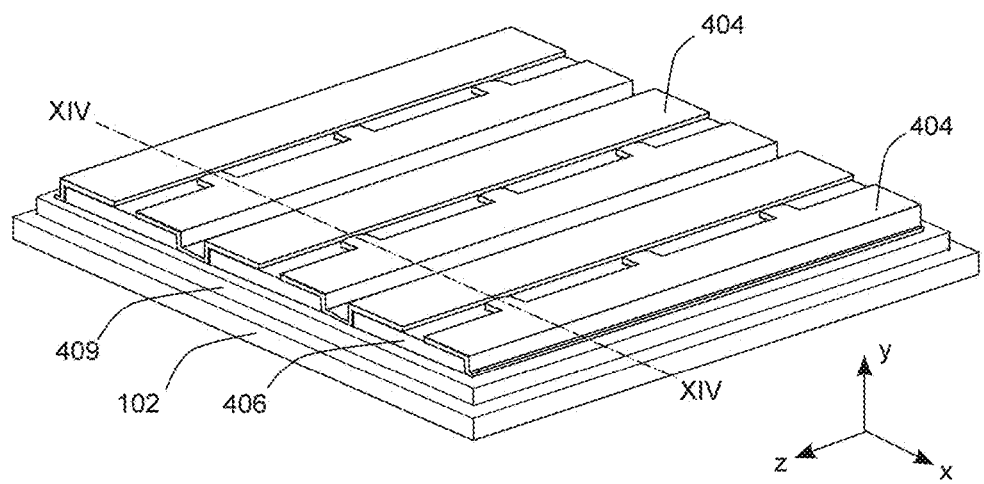
Figure 19I:
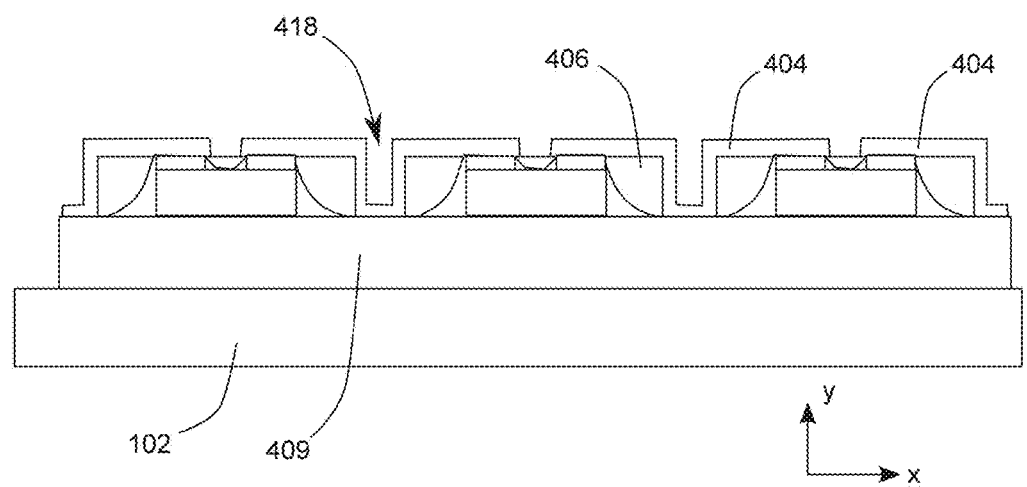
Figure 20:
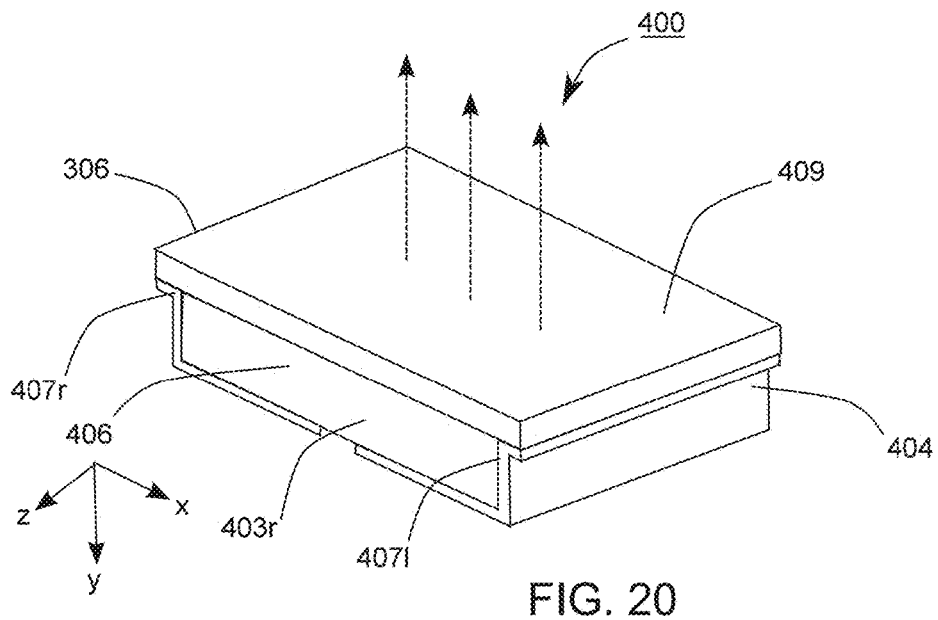
FIG. 20 shows a perspective view of a single light-emitting device of FIG. 18J having a main light-emitting direction facing upwardly.
Figure 21:
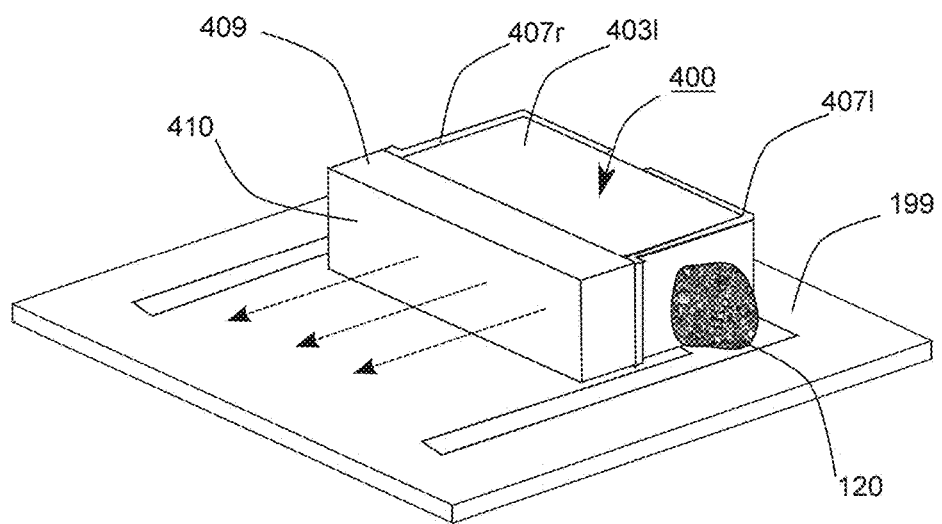
FIG. 21 shows a perspective view of the light-emitting device of FIG. 20 mounted on a printed circuit board.

FIG. 17 shows a flowchart 80 of making a light-emitting device 400 in accordance with an embodiment of the present disclosure. FIGS. 18A-18J show perspective views of steps embodied in FIG. 17. FIGS. 19A-19J show cross-sectional views taken along line XIX-XIX of FIGS. 18A-18J, respectively. FIG. 20 shows a perspective view of a single light-emitting device 400 of FIG. 18J having a main light-emitting direction facing upwardly. FIG. 21 shows a perspective view of the light-emitting device 400 of FIG. 20 mounted on a printed circuit board 199.

Figure 18J:
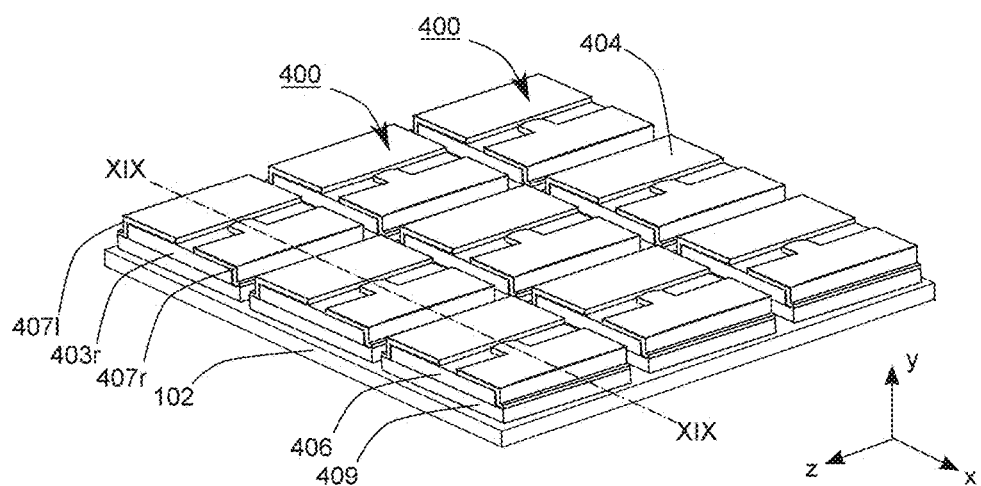

As shown in FIG. 18J, there are nine light-emitting devices 400 formed on a second carrier 102 in a 3×3 array. As shown in FIGS. 18J, 19J, 20 and 21, each light-emitting device 400 has two opposite side surfaces 403l, 403r, and a bottom surface 405. Each light-emitting device 400 includes a fifth reflective layer 406, a patterned seed layer (not shown), two conductive layers 404, a third light-transmitting layer 402, a wavelength conversion layer 409 and a light-emitting chip 114. The light-emitting chip 114 is served as a light body and includes two internal electrode layers 116. Each of the conductive layers 404, the patterned seed layer, the fifth reflective layer 406, and the wavelength conversion layer 409 has a surface and these surfaces are coplanar with each other and constitute the side surface 403r (403l). The conductive layers 304 are served as the external electrode layers 407r, 407l.

As shown in FIG. 21, the external electrode layers 407r, 407l are mounted on the printed circuit board 199 through the solder 120. The solder 120 is used for providing an electrical connection between the light-emitting device 400 and the printed circuit board 199 and for mounting the light-emitting device 400 on the printed circuit board 199. The light-emitting device 400 has a main light-emitting direction parallel to a surface of the printed circuit board 199. Accordingly, the light-emitting device 400 acts as a side-view LED package.

Figure 19J:
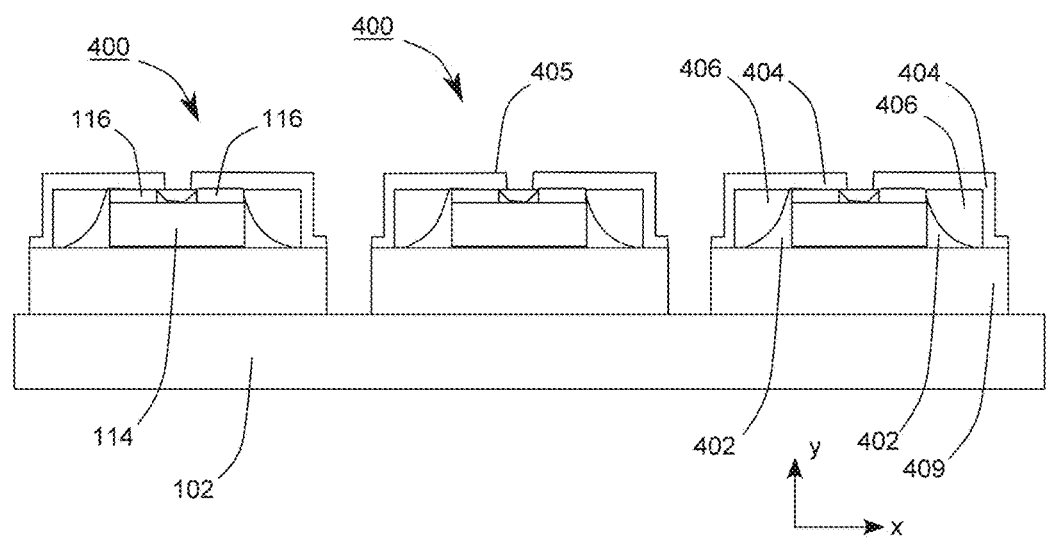

As shown in FIGS. 18J and 19J, the light-emitting chip 114, the third light-transmitting layer 402, and the wavelength conversion layer 409 are considered as a light-emitting structure. The light-emitting chip 114 is enclosed by the wavelength conversion layer 409 and the fifth reflective laser 406. The fifth reflective layer 406 is formed as a reflective frame to have a bottom portion for mounting the light-emitting chip 114 thereon. The reflective frame is used for allowing light emitted from the light-emitting chip 114 toward a certain direction. The conductive layer 404 has a surface to constitute the bottom surface 405. The wavelength conversion layer 409 has an area larger than an area of the light-emitting chip 114.

As shown in FIGS. 17, 18A and 19A, in step 82, the light-emitting chips 114 made by the semiconductor processes are arranged on a third carrier 123. The sapphire substrates of each of the light-emitting chips 114 are attached to the third carrier 123, that is, the internal electrode layers 116 does not face toward the first carrier 124 and faces upward (y direction).

As shown in FIGS. 17, 18B and 19B, in step 85, a third light-transmitting layer 402 is formed to surround the light-emitting chips 114. In step 84, gel is locally formed around the light-emitting chips 114 by spraying. Due to surface tension, the gel is positioned between the sidewall of the light-emitting chip 114 and the third carrier 123. After curing, the gel becomes the third light-transmitting layer 402. The third light-transmitting layer 402 is made of a material as the same or similar to the light-transmitting layer previously described.

As shown in FIGS. 17, 18C and 19C, in step 86, a fifth reflective layer 406 is formed on the light-emitting chips 114 and the third light-transmitting layer 402. The fifth reflective layer 406 can be formed by molding. The fifth reflective layer 406 is made of a material as the same or similar to the reflective layer previously described.

Referring to FIGS. 17, 18D and 19D, in step 88, the structure of step 86 is reversed and attached to a first carrier 124. Then, the third carrier 123 is removed.

As shown in FIGS. 17, 18E and 19E, in step 90, a wavelength conversion layer 409 is formed on the fifth reflective layer 406, the third light-transmitting layer 402 and the light-emitting chips 114. The wavelength conversion layer 409 does not cover sidewalls of the fifth reflective layer 406.

Referring to FIGS. 17, 18F and 19F, in step 92, the structure of step 90 is reversed and attached to a second carrier 102. Then, the first carrier 124 is removed.

In FIG. 17, the descriptions of the subsequent steps 50, 52, 53, 58 and 60 after step 92 can be referred to FIG. 12 and the corresponding paragraphs.

Briefly, as shown in FIGS. 17, 18G, and 19G, in step 50, the fifth reflective layer 406 is grinded to expose the internal electrode layers 116 of the light-emitting chips 114.

As shown in FIGS. 17, 18H, and 19H, in step 52, a portion of the fifth reflective layer 406 is removed to form a plurality of trenches 418 extending along the z direction. Specifically, the blade is provided to move along the z direction to remove a portion of the fifth reflective layer 406 for forming the trenches 418 to expose the sidewall 406r of the fifth reflective layer 406.

Referring to FIGS. 17, 18I, and 19I, in step 53, a patterned seed layer is formed. In step 58, electroplating is performed on the patterned seed layer to form the conductive layers 404 thereon. The conductive layers 404 covering the corresponding internal electrode layers 116 can have different patterns for identifying the polarity (p-electrode or n-electrode) thereof in the light-emitting chip 114. The conductive layers 404 can cover the sidewall 406r completely but not fill the trenches 418 completely. The conductive layer 404 is made of a material referred to the conductive layer 106.

In FIGS. 17, 18J, and 19J, in step 60, the structure of FIG. 18I is cut to form a plurality of light-emitting devices 400. Specifically, the blade (not shown) is provided to move along the x direction and the z direction to remove simultaneously the conductive layer 404 and the wavelength conversion layer 409 for forming the trenches.

Subsequently, after attaching a blue tape to the conductive layers 404, the second carrier 102 is irradiated by UV radiation light to lower the adhesion therebetween for separating the light-emitting devices 400 from the second carrier 102. The conductive layers 404 provide a conductive path and a heat-dissipating path for the light-emitting chips 114.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
a light body having an internal electrode layer;
a conductive layer having a first portion formed on the internal electrode layer and overlapping the light body in a first direction, and a second portion overlapping the light body in a second direction; and
a reflective layer overlapping the light body in the second direction;
wherein the first direction is perpendicular to the second direction, and the reflective layer has a surface flush with a surface of the second portion.

2. The light-emitting device of claim 1, wherein the light-emitting device has a side surface with a portion constituted by a surface of the conductive layer.

3. The light-emitting device of claim 1, wherein the conductive layer has a protrusion protruding away the light body to extend along the second direction.

4. The light-emitting device of claim 1, wherein the conductive layer does not overlap the light body in a third direction.

5. The light-emitting device of claim 1, wherein the conductive layer has two surfaces exposed to ambient environment.

6. The light-emitting device of claim 1, wherein the conductive layer has three surfaces exposed to ambient environment.

7. The light-emitting device of claim 1, further comprising a wavelength conversion layer enclosing the light body.

8. The light-emitting device of claim 1, further comprising a wavelength conversion layer formed on the light body.

9. The light-emitting device of claim 8, wherein the wavelength conversion layer has an area larger than that of the light body.

10. The light-emitting device of claim 1, wherein the reflective layer enclosing the light body.

11. A backlight module comprising:
a board; and
a light-emitting device of claim 1 mounted on the board.

12. The backlight module of claim 11, wherein the light-emitting device has a main light-emitting direction parallel to a surface of the board.

13. A light-emitting device comprising:
a light body having an internal electrode layer;
a conductive layer having a first portion formed on the internal electrode layer and overlapping the light body in a first direction, and a second portion overlapping the light body in a second direction; and
a reflective layer enclosing the conductive layer and exposing a portion of the conductive layer in a third direction,
wherein the first direction, the second direction, and the third direction are perpendicular to each other.

14. The light-emitting device of claim 13, wherein the conductive layer is not exposed from the reflective layer in the first direction and the second direction.

15. The light-emitting device of claim 13, wherein the conductive layer does not overlap the light body in the third direction.

16. The light-emitting device of claim 13, further comprising a wavelength conversion layer enclosing the light body.

17. The light-emitting device of claim 13, further comprising a wavelength conversion layer formed on the light body.

18. The light-emitting device of claim 17, wherein the wavelength conversion layer has an area larger than that of the light body.

19. The light-emitting device of claim 13, wherein the reflective layer enclosing the light body.

* * * * *